(12) United States Patent
Okhonin et al.

(10) Patent No.: US 9,236,520 B2
(45) Date of Patent: Jan. 12, 2016

(54) PROXIMITY SENSOR SYSTEMS AND METHODS OF OPERATING SAME

(71) Applicant: ActLight S.A., Lausanne (CH)

(72) Inventors: Serguei Okhonin, Lausanne (CH); Maxim Gureev, Lausanne (CH)

(73) Assignee: ACTLIGHT S.A., Lausanne (CH)

( * ) Notice: Subject to any disclaimer, the term of this patent is extended or adjusted under 35 U.S.C. 154(b) by 0 days.

(21) Appl. No.: 14/323,612

(22) Filed: Jul. 3, 2014

(65) Prior Publication Data

US 2014/0312206 A1    Oct. 23, 2014

Related U.S. Application Data

(63) Continuation-in-part of application No. 14/194,928, filed on Mar. 3, 2014, and a continuation-in-part of application No. 13/481,891, filed on May 28, 2012, now Pat. No. 9,012,960.

(60) Provisional application No. 61/843,152, filed on Jul. 5, 2013, provisional application No. 61/495,450, filed on Jun. 10, 2011, provisional application No. 61/603,496, filed on Feb. 27, 2012, provisional application No. 61/786,781, filed on Mar. 15, 2013.

(51) Int. Cl.
| | | |
|---|---|---|
| H01L 27/00 | (2006.01) |
| H01J 40/14 | (2006.01) |
| H01L 31/113 | (2006.01) |
| G01S 17/10 | (2006.01) |
| H01L 27/146 | (2006.01) |
| H01L 31/0224 | (2006.01) |

(52) U.S. Cl.
CPC ............ *H01L 31/1136* (2013.01); *G01S 17/10* (2013.01); *H01L 27/14609* (2013.01); *H01L 31/022408* (2013.01)

(58) Field of Classification Search
CPC ................... H01L 27/14609; H01L 27/14612; H01L 31/101
USPC ............... 250/551, 206, 221, 214.1; 257/225, 257/290, 292, 431, E21.131, E21.151
See application file for complete search history.

(56) References Cited

U.S. PATENT DOCUMENTS

2013/0056708 A1* 3/2013 Kim ................. H01L 27/14612
257/30
2015/0221806 A1* 8/2015 Okhonin ............... H01L 31/101
250/216

* cited by examiner

*Primary Examiner* — Kevin Pyo
(74) *Attorney, Agent, or Firm* — Wilmer Cutler Pickering Hale and Dorr LLP

(57) ABSTRACT

Techniques for using photo detectors as tunable proximity sensors for detection of target objects and ascertaining their distance from the proximity sensors are disclosed. In one embodiment, the techniques may be realized as a proximity sensor system including a photo detector having a first doped region, a gate, a second doped region and a light absorbing region, a control circuitry for generating a plurality of control signals to be applied to the photo detector, and a signal detector to detect an output signal from the photo detector.

16 Claims, 52 Drawing Sheets

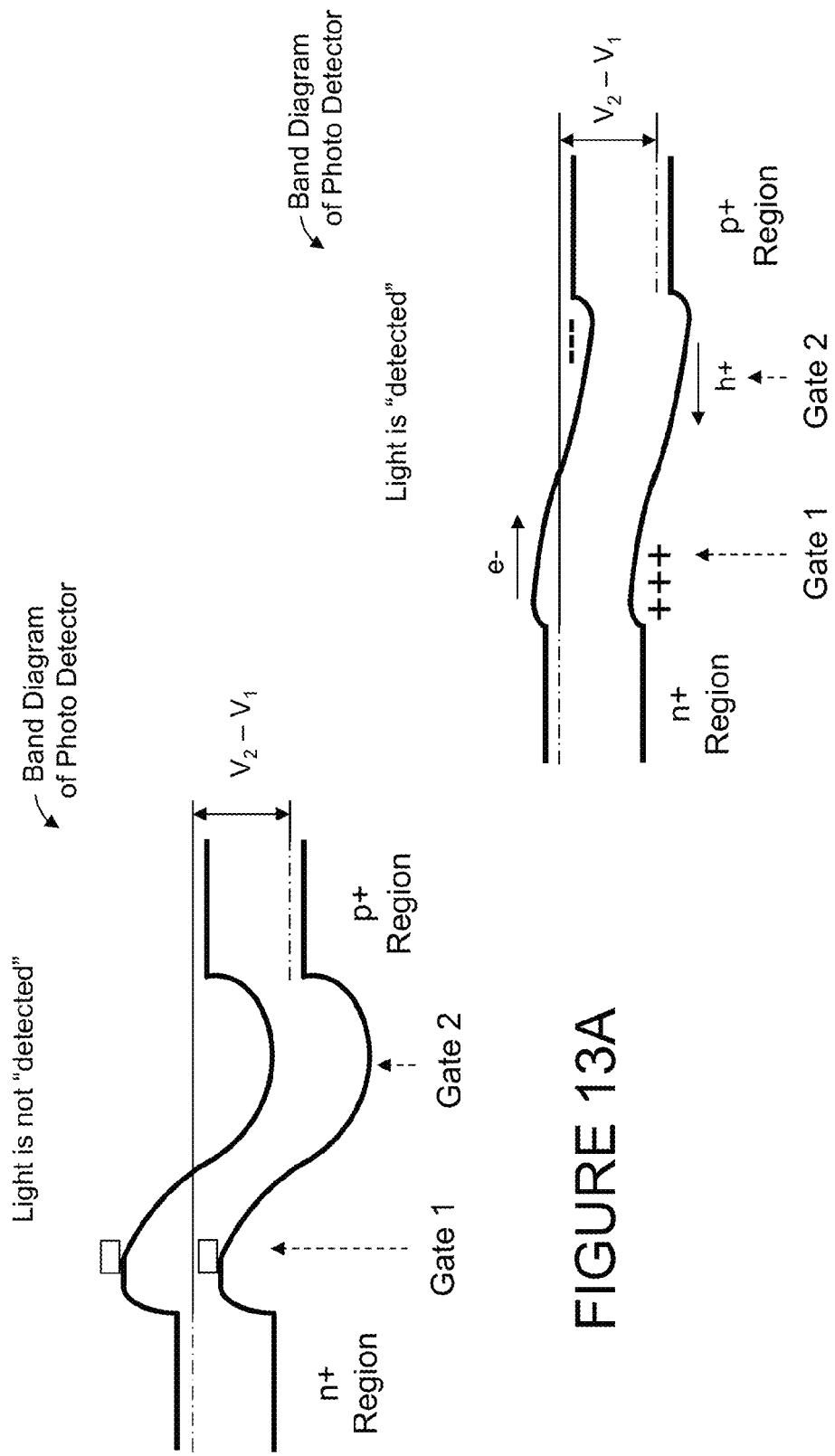

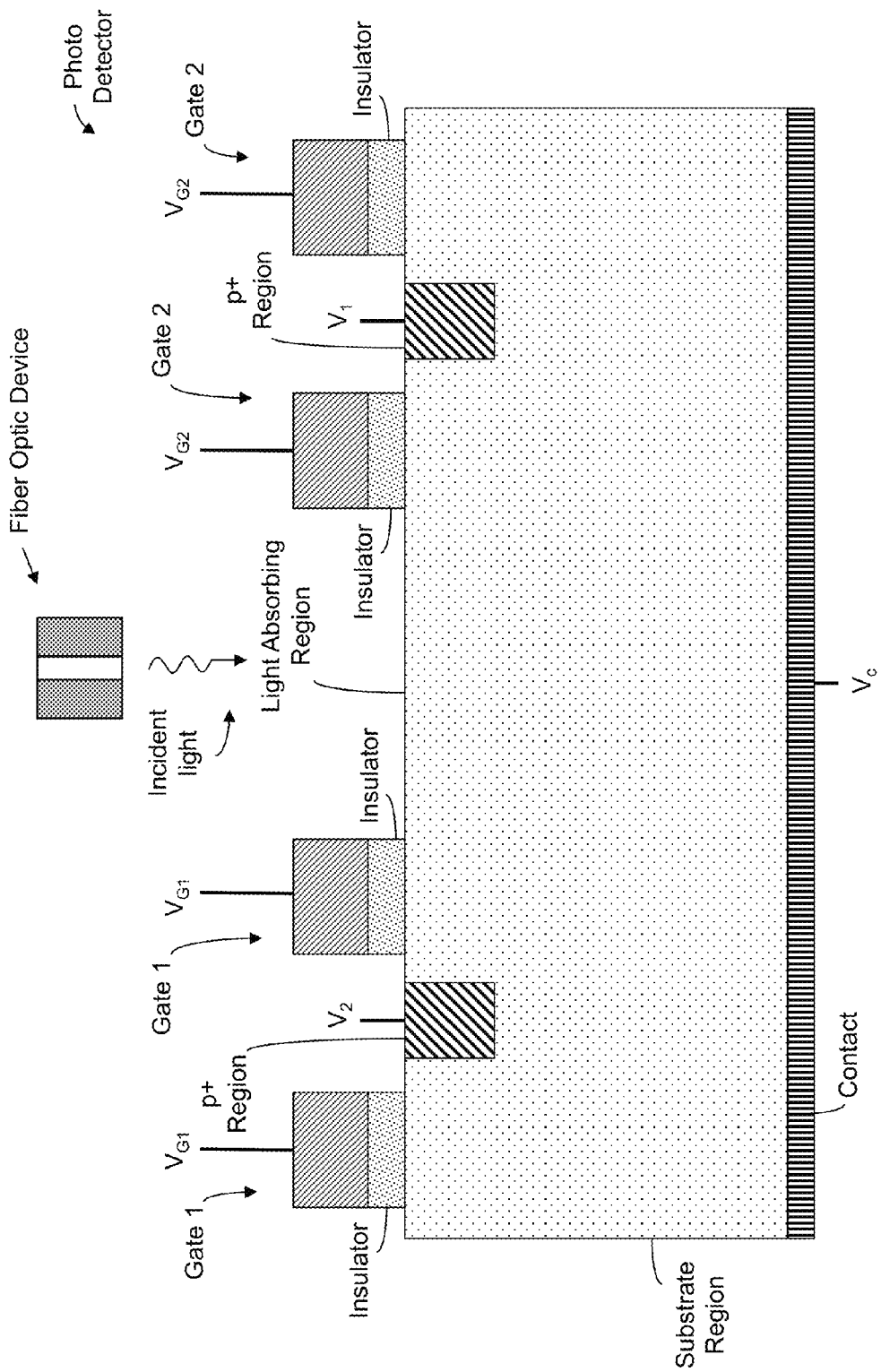

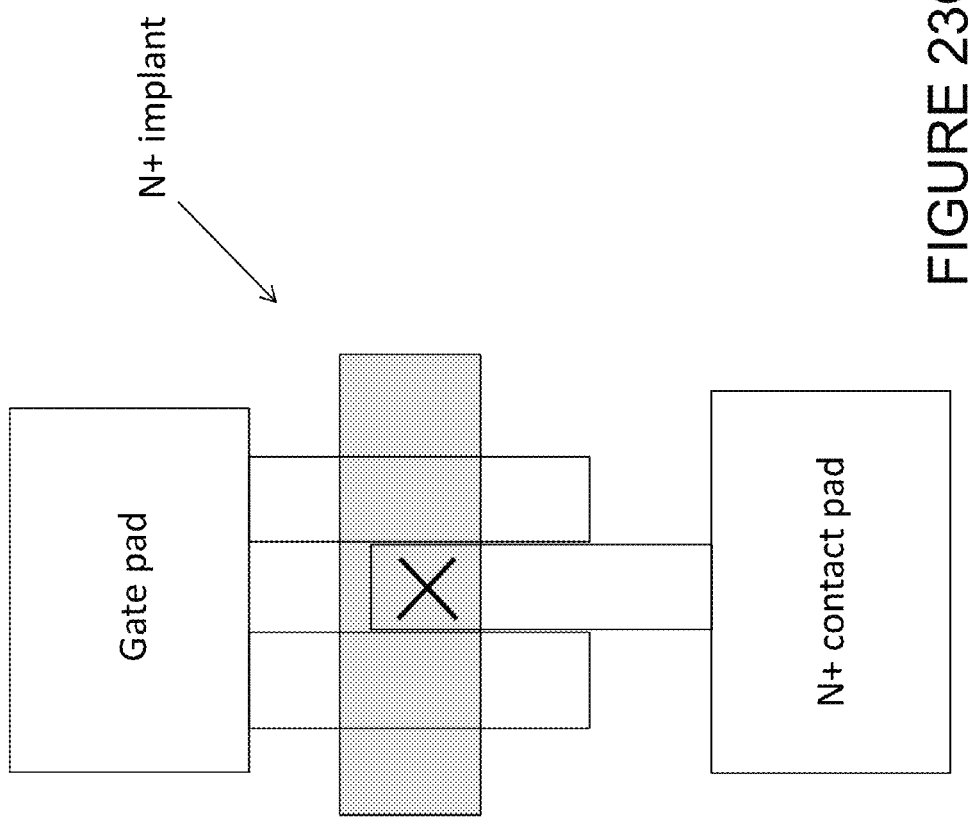

PROXIMITY SENSOR SYSTEMS AND METHODS OF OPERATING SAME

CROSS-REFERENCE TO RELATED APPLICATIONS

This patent application claims priority to U.S. Provisional Patent Application No. 61/843,152, filed Jul. 5, 2013, which is hereby incorporated by reference herein in its entirety.

This patent application is a continuation-in-part of U.S. patent application Ser. No. 13/481,891, filed May 28, 2012, which claims priority to U.S. Provisional Patent Application No. 61/495,450, filed Jun. 10, 2011, and U.S. Provisional Patent Application No. 61/603,496, filed Feb. 27, 2012, each of which is hereby incorporated by reference herein in its entirety.

This patent application is also a continuation-in-part of and U.S. patent application Ser. No. 14/194,928, filed Mar. 3, 2014, which claims priority to U.S. Provisional Patent Application No. 61/786,781, filed Mar. 15, 2013, each of which is hereby incorporated by reference herein in its entirety.

FIELD OF THE DISCLOSURE

The present disclosure relates generally to proximity sensors and, more particularly, to techniques for using photo detectors as tunable proximity sensors for detection of target objects and ascertaining their distance from the proximity sensors.

BACKGROUND OF THE DISCLOSURE

There are many inventions described and illustrated herein, as well as many aspects and embodiments of those inventions. In one aspect, the present inventions relate to, among other things, a tunable proximity sensor system comprising monolithic detectors or sensors to detect target objects by detecting reflected light incident on the sensors and, in response thereto, to generate an electrical signal. In another aspect, the present inventions relate to methods of controlling such proximity sensors to meet or accommodate response time specifications as well as power consumption specifications.

SUMMARY OF THE DISCLOSURE

Techniques for using photo detectors as tunable proximity sensors for detection of target objects and ascertaining their distance from the proximity sensors are disclosed. In one embodiment, the techniques may be realized as a proximity sensor system including a photo detector having a first doped region, a gate, a second doped region and a light absorbing region, wherein the light absorbing region includes at least one material in which, in response to light incident thereon, carrier pairs of opposite charge are generated, wherein the first doped region attracts a first carrier of the carrier pairs having a first charge, wherein the second doped region attracts a second carrier of the carrier pairs having a second opposite charge, and wherein the photo detector generates an output signal indicative of the presence of an object in a vicinity of the proximity sensor system. This embodiment also includes a control circuitry for generating a plurality of control signals to be applied to the photo detector, wherein the plurality of control signals comprises a first control signal applied to the first doped region of the photo detector, a second control signal applied to the gate of the photo detector, and a third control signal applied to the second doped region of the photo detector; wherein the applied control signals control an operating state of the photo detector. This embodiment further includes a signal detector to detect the output signal from the photo detector.

In accordance with other aspects of this embodiment, the first doped region of the photo detector is formed of a p-type semiconductor and the second doped region is formed of an n-type semiconductor.

In accordance with further aspects of this embodiment, the control circuitry places the photo detector in a non-detecting state by generating a first set of relative voltage amplitudes for the first, second, and third control signals so that the photo detector is in a reverse bias mode with substantially no current flow in the photo detector. In accordance with additional aspects of this embodiment, the first voltage amplitude applied to the first doped region is less than the third voltage amplitude applied to the second doped region.

In accordance with additional aspects of this embodiment, the control circuitry places the photo detector in a detecting state by generating a second set of relative voltage amplitudes for the first, second, and third control signals so that the photo detector is in a forward bias mode with substantially no current flow in the photo detector in the absence of incident light on the photo detector. In accordance with further additional aspects of this embodiments, the first voltage amplitude applied to the first doped region differs from the third voltage amplitude applied to the second doped region by approximately 1 volt.

In accordance with additional aspects of this embodiments, the control circuitry places the photo detector in a detecting state by generating a second set of relative voltage amplitudes of the first, second, and third control signals so that the photo detector is in a forward bias mode with current flow in the photo detector in the presence of incident light on the photo detector. In accordance with further additional aspects of this embodiments, increasing an electric field between the first and second doped regions reduces a time for the current flow in the photo detector in response to the incident light. In accordance with another additional aspects of this embodiment, decreasing an electric field between the first and second doped regions increases a time for the current flow in the photo detector in response to the incident light.

In accordance with additional aspects of the embodiments, the control circuitry applies the control signals to alternate the photo detector between a non-detecting state and a detecting state. In accordance with further additional aspects of this embodiments, the control circuitry places the photo detector in the non-detecting state by generating a first set of relative voltage amplitudes of the first, second, and third control signals so that the photo detector is in a reverse bias mode with substantially no current flow. In accordance with further additional aspects of this embodiments, the control circuitry places the photo detector in the detecting state by generating a second set of relative voltage amplitudes of the first, second, and third control signals so that the photo detector is in a forward biased mode with substantially no current flow in absence of incident light and with current flow in presence of incident light.

In accordance with additional aspects of the embodiments, a proximity sensor system further including a pulsing light source. In accordance with further additional aspects of this embodiment, the pulsing of the light source of the proximity sensor system is synchronized with the photo detector and emits light when the photo detector is in a detecting state.

In another embodiment, the techniques may be realized as a method for detecting a presence of a target using the proximity sensor system according to any of the preceding embodiments, wherein a time between the emission from the light source and the detection of current flow in the photo detector, due to incident reflected light from the target, is used to detect the presence of the target.

In yet another particular embodiment, the techniques may be realized as a method of detecting a distance of a target using the proximity sensor system according to any of the preceding embodiments, wherein a time between the emission from the light source and the detection of current flow in the photo detector, due to incident reflected light from the target, is used to ascertain the distance of the target.

The present disclosure will now be described in more detail with reference to particular embodiments thereof as shown in the accompanying drawings. While the present disclosure is described below with reference to particular embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be illustrative only.

FIGS. 13A and 13B depict the general operation and/or response of the monolithic sensor or detector in connection with an energy band diagram, in accordance with certain aspects of exemplary monolithic light sensors or photo detectors, wherein when the sensor does not detect or is not exposed to light, little to no current flows between the p+ and n+ regions due to the barrier provided or caused by the voltages applied to the gates; however, when the sensor detects or is exposed to incident light from one or more light sources, the majority of the positive carriers (i.e., holes) move towards the region 1, disposed under gate 1 (Gate 1), and the majority of the negative carriers (i.e., electrons) move towards the region 2, disposed under gate 2 (Gate 2) and the excess of holes in the region 1 provides, induces or causes a lowering of the potential barrier to electron movement and electron current flow from n+ region while the excess of electrons in the region 2 provides, induces or causes a lowering of the hole barrier and hole current flowing from p+ region; under these circumstances, the sensor is in a conductive state or mode which provides a large internal current gain; additionally a positive feedback mechanism accelerates accumulation of excess carriers under the respective gates, which, in turn, reduce the potential barriers related corresponding to such regions and causes a current to flow between the p+ and n+ regions of the photo detector and an output current upon detecting or in response to the incident light.

FIG. 21A is a cross-sectional view of a monolithic light sensor or photo detector according to yet another embodiment.

FIGS. 23B-23E are top views illustrating certain fabrication techniques in relation to a CMOS process wherein the sensor includes n+ regions and p+ region (see, for example, the illustrative embodiments of FIGS. 12A, 15A, 16A and 16B), the p+ regions, gates and contact regions may be fabricated during or in relation to the CMOS process of fabricating the PMOS and NMOS transistors; in one embodiment, after forming the gates, an n+ implant may be performed wherein n+ area surrounded by two gates fabricated via CMOS processing (see "X" in FIG. 23B), and thereafter a contact to a portion of the n+ region may be formed (see FIG. 23C), the p+ regions may be formed in a similar manner wherein in one embodiment, after forming the gates, an p+ implant may be performed wherein n+ area surrounded by two gates fabricated via CMOS processing (see FIGS. 23D and 23E); notably, FIG. 23F illustrates a cross-section of the resulting or "final" structure; indeed, where the sensor does not include n+ regions as in several of the exemplary embodiments set forth herein, the n+ processing in connection with the sensor may be omitted.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION OF EMBODIMENTS

Figure 1:
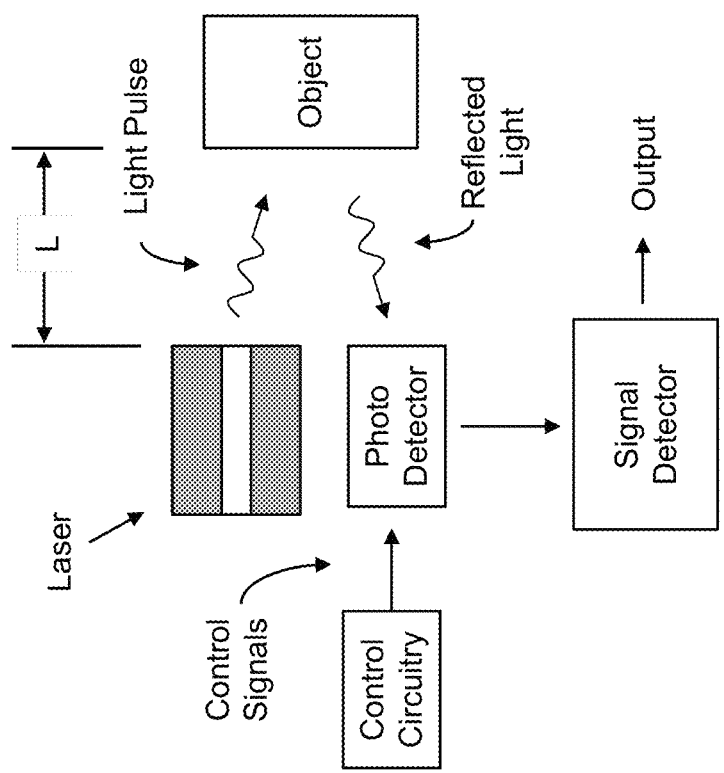
FIG. 1 illustrates, in block diagram form, an exemplary embodiment of the present inventions including one or more lasers which generate, for example, laser pulses, that are detected by a photo detector (according to certain aspects and embodiments of the present inventions) wherein control circuitry generates control signals, which are applied to the photo detector to facilitate sensing of the reflected light, according to certain aspects and embodiments of the present inventions; notably, in operation, the photo detector, in response to the control signals and reflected light, generates an output current that may be detected by a signal detector (for example, a current amplifier/sensor (and other circuitry) that measures the current output by the sensor (for example, output via the contact region and doped regions in response to the detection of light); the photo detector may be discrete devices or integrated with the control circuitry and/or signal detector (and/or other circuitry) as an integrated circuit.
Figure 2:
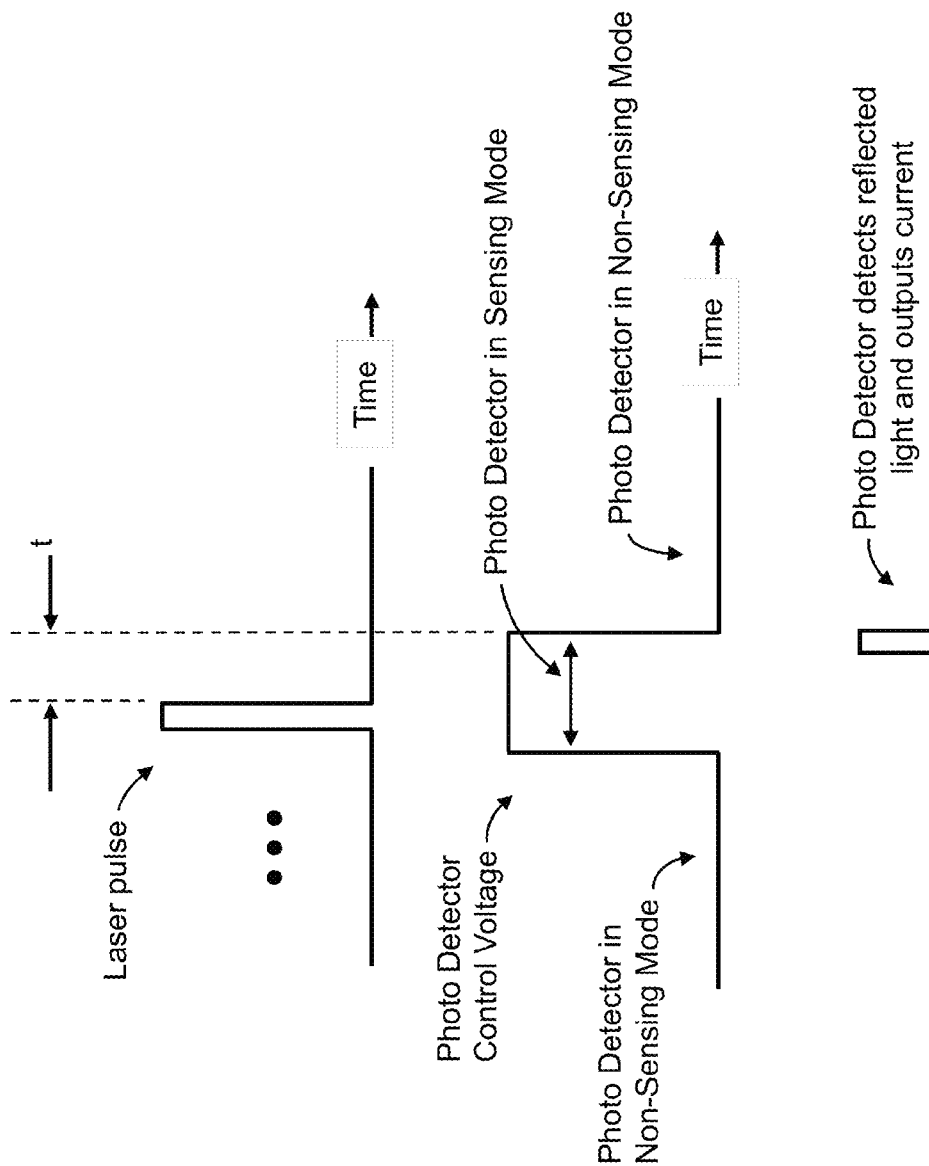
FIG. 2 illustrates a timing relationship between the laser output (here depicted as a pulse) and photodetector (enabling and detection) of the proximity sensor system according to certain aspects and embodiments of the present inventions.

There are many inventions described and illustrated herein. In one aspect, the present inventions are directed to a proximity sensor systems and method of operations thereof. With reference to FIG. 1, in one exemplary embodiment, the proximity sensor system includes one or more lasers to generate light (for example, a plurality of light pulses) that are directed to an object. The system further includes one or more photo detectors to detect light (for example, one or more the laser light pulses) reflected from the object. The control circuitry generates control signals and applies such control signals to the photo detector, which, in response, places the photo detector in a sensing mode. While in the sensing mode, the photo detector is capable of detecting light incident thereon. A signal detector receives the output of the photo detector and, in one embodiment, determines when reflected light has detected. FIG. 2 illustrates a timing relationship between the laser output (here depicted as a pulse) and photo detector (enabling and detection) of the proximity sensor system according to certain aspects and embodiments of the present inventions.

Figure 3:
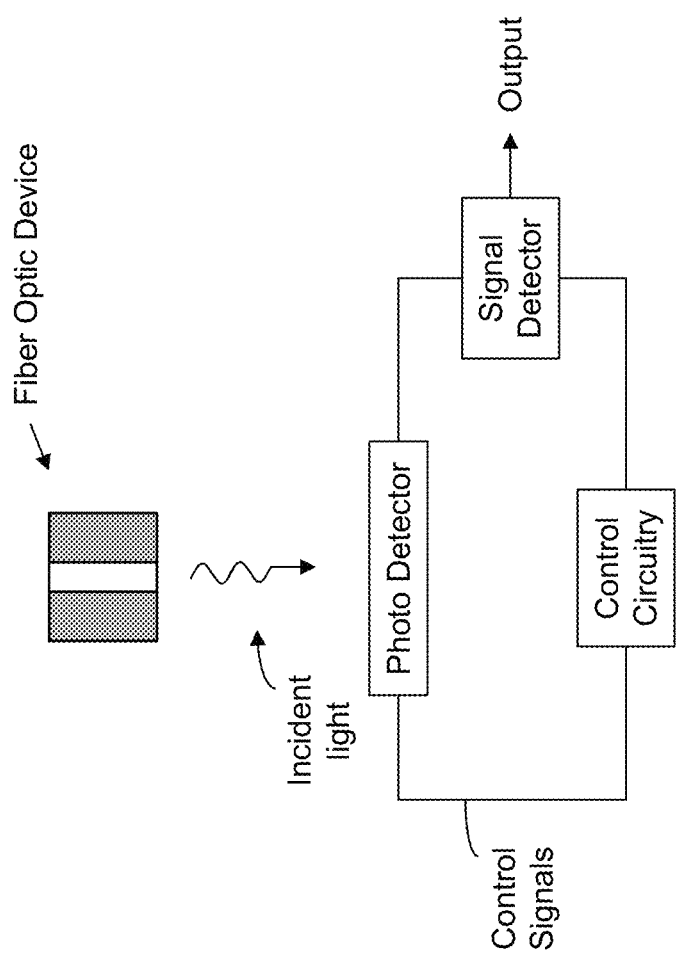
FIG. 3 illustrates, in block diagram form, an exemplary embodiment of the present inventions including control circuitry to generate control signals, which are applied to the photo diode, which in response such control signals and upon detecting incident light, generates an output current that is detected by the signal detector; according to certain aspects and embodiments of the present inventions.
Figure 4:
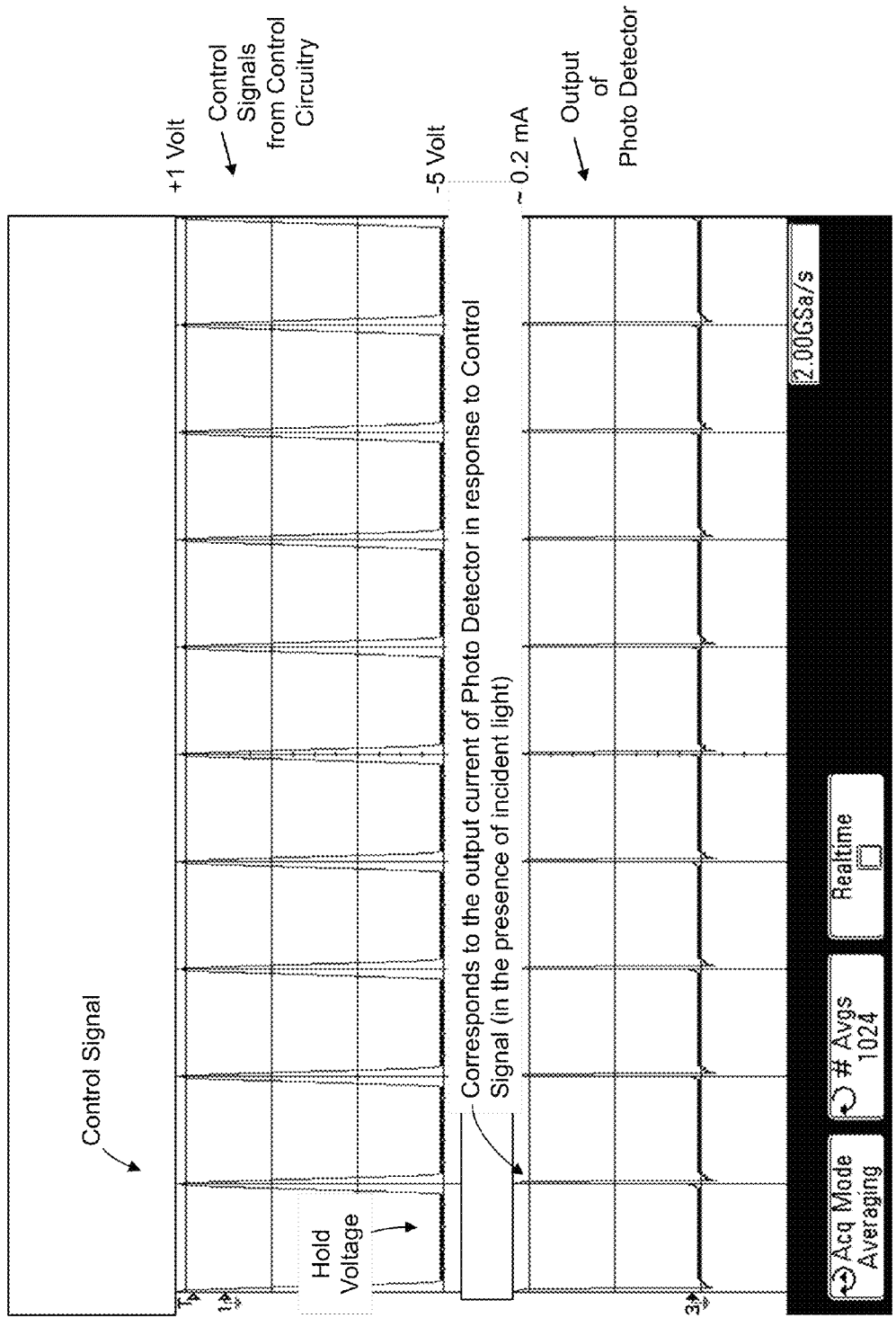
FIG. 4 illustrates exemplary control signals, which are applied to the photo detector and the responsive output therefrom (notable, the output current of the photo detector is applied to a 50 ohm impedance attached to the output of the photo detector in order to generate the output waveform).

In another aspect, the present inventions are directed to a method of controlling a photo detector and/or array of photo detectors. With reference to FIG. 3, in a first embodiment, the system includes a photo detector, control circuitry to generate control signals and apply such control signals to the photo detector, which, in response, detects light incident thereon, and a signal detector according to an aspect of the present inventions. FIG. 4 illustrates the control signals and the response thereto by the photo detector (when light is incident thereon).

With reference to FIGS. 1 and 2, in operation, the proximity sensor system may employ a laser or LED to generate a plurality of light pulses. In one embodiment, the photo detector may be maintained in a non-detecting state and periodically placed in a detecting or sensing state/mode. The photo detector may be placed in a sensing state or mode via sense control pulses from the control circuitry. These control pulses may be synchronized with laser pulses. When in the sensing state or mode, the photo detector is capable of detecting light reflected from the object onto the detector. The photo detector, in response to the reflected light being incident thereon, generates an output signal (for example, an output current). In one embodiment, the output signal is detected by a signal detector. As noted in the '928 application, this may be implemented via application of a reverse bias voltage is applied to the photo detector (i.e., no detection control signal applied to the photo detector). In this regard the photo detector is in a non-detection state via application of the hold voltage wherein charge carriers are "removed" from low-doped region. In the non-detection state, little to no current flows through or from the photo detector—regardless of the presence of reflected light incident on the photo detector. Moreover, in operation, in the absence of incident light, little to no current flows through the photo detector regardless of the state of the photo detector and/or control signals.

With continued reference to FIGS. 1 and 2, the photons reflected from the object which is located closer than the distance L may be characterized as:

$$L=(t\times \text{Speed of Light})/2$$

Notably, based on simulations, the triggering time of the photo detector may be less than 20 picoseconds.

Notably, the present inventions may employ any photo diode or detector to implement the present inventions including the photo detector architectures described in U.S. patent application Ser. No. 13/481,891, incorporated by reference herein. For example, with reference to FIGS. 5A-5C, the photo detector includes at least one control node or gate (illustrated in the exemplary embodiment as Gate 1), a light absorbing region, a first doped region (illustrated in the exemplary embodiment as p+ region) and a second doped region (illustrated as contact region). The contact region is disposed and/or formed in the substrate region and on the major surface containing the p+ region(s) and the gates; and, in operation, may be an output of the photo detector. As mentioned herein, the contact region (regions) may be p+ or n+ region (regions).

The photo detector may be fabricated in or on silicon, (for example, a standard bulk silicon), silicon-germanium, gallium-arsenide or an insulator (for example, glass or the like) or fabricated in or on a semiconductor-on-insulator (SOI) substrate (for example, a silicon or germanium region/layer/material disposed on or over an insulator region/layer/material (for example, a silicon oxide, silicon nitride and/or combination thereof). Briefly, in this embodiment, the control nodes or gates (hereinafter "gates") may be comprised of a conductive type material (conductor or doped semiconductor), for example, a metal (for example, aluminum or copper), metal compound and/or a doped semiconductor (for example, silicon doped with donor or acceptor impurities). The gates are spaced from the body region via an insulator or dielectric material (for example, silicon oxide, silicon nitride or combinations or composites thereof, for example, ONO).

The light absorbing region may be fabricated in or on the substrate. In one embodiment the body region is an intrinsic or doped semiconductor (for example, intrinsic/undoped silicon, germanium or silicon-carbide or a lightly doped (with donor or acceptor impurities) silicon, germanium or silicon-carbide). Indeed, the light absorbing region may be one or more materials from the Group IV semiconductor including silicon, germanium, silicon carbide and/or combinations thereof (for example, silicon-germanium). The light absorbing region body may be an intrinsic material or a material having impurities, for example, n-type or p-type material(s). As noted above, the photo detector includes at least one doped region—see, p+ regions. The doped semiconductor regions may be disposed and/or formed in or on the substrate. For example, the p-type semiconductor material may be formed in the substrate by doping the semiconductor with a p-type impurity (for example, boron). Notably, the doped semiconductor regions (p+ regions) are also control nodes of the photo detector and, in operation, an output of the photo detector.

The contact region is formed in the substrate region (for example, via conventional lithographic, etching and deposition techniques) and is comprised of a conductive type material (conductor or semiconductor), for example, a metal (for example, aluminum or copper), metal compound and/or a doped semiconductor (for example, silicon, silicon-germanium or gallium arsenide doped with donor or acceptor impurities). The contact region may be an acceptor type material such as p+ doped silicon, germanium, silicon-germanium, silicon-carbide or gallium arsenide. Indeed, in one embodiment, the contact region is a p+ type material consisting of one or more materials from the Group IV semiconductor including silicon, germanium, silicon carbide and/or combinations thereof.

In another embodiment, the contact region is formed from a portion of the substrate region. For example, in one embodiment, using conventional lithographic and deposition techniques, the substrate may be doped with acceptor type dopants forming, for example, p+ doped silicon, germanium, silicon-germanium, silicon-carbide or gallium arsenide. In one embodiment, the dopant may be boron or aluminum to provide or incorporate atoms (acceptors) into a selected portion of the substrate region in order to increase the number of free charge carriers (in this case positive carriers or holes).

Notably, the substrate region photo detector in the exemplary embodiment may be a semiconductor on insulator (SOI) substrate (for example, a silicon or germanium region/layer/material disposed on or over an insulator region/layer/material (for example, a silicon oxide, silicon nitride and/or combination thereof) or a silicon, (for example, a standard bulk silicon), silicon-germanium, gallium-arsenide and/or combination thereof.

Importantly, the photo detector may be fabricated using any materials and/or techniques now known, described herein, and/or later developed.

Briefly, in response to incident light, electron-hole pairs form and are separated by an electric field (formed by applying selected voltages to the contact region (for example, a negative voltage (VC<0V)), gates (for example, greater than 4V (VG1>4V)) and p+ region (for example, V1=+3V)) wherein positive carriers (i.e., holes) flow to the p+ contact region and the negative carriers (i.e., electrons) flow to portions of the body region near and/or beneath the gates. Electrons accumulate near and/or beneath the gates and, in response thereto, positive carriers (i.e., holes) from the p+ region juxtaposed the gates, flow to the contract region (here a p+ contact region). As excess electrons accumulate in the body region located near and/or beneath the gates, the electron barrier (band gap) is lowered therein. This results in an additional and/or greater hole current flow from the p+ regions through a portion of the substrate region to the contact region. That is, an additional and/or greater hole current is created and flows from the p+ regions through a portion of the body region and the light absorbing region to the p+ contact region thereby increasing the magnitude of the output current. In this way, the photo detector is in a conductive state or mode which provides a large internal current gain. The current flows between the p+ region and the contact region and an output current upon detecting or in response to the incident light.

Figure 5A:
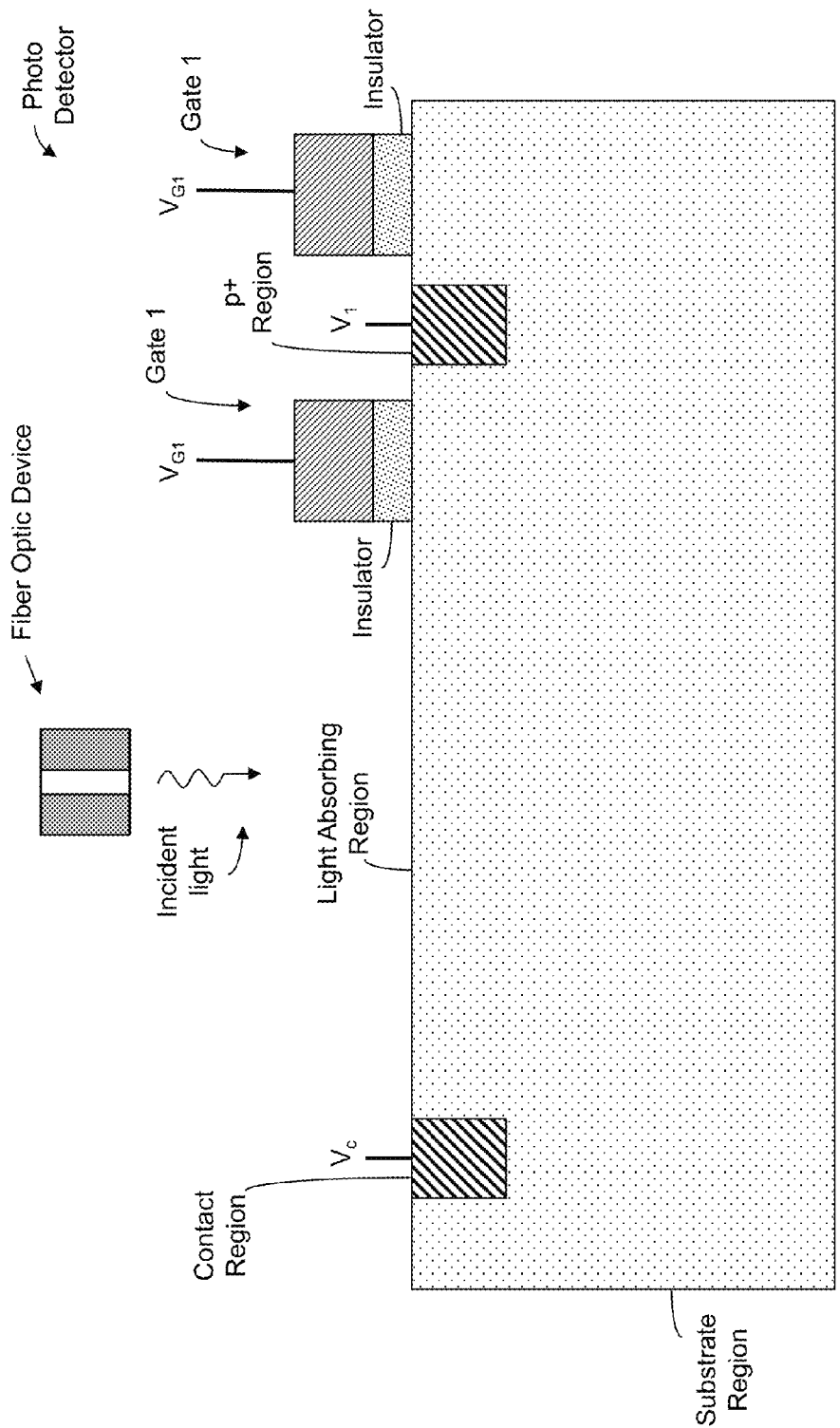
FIG. 5A is a cross-sectional view of an exemplary monolithic light sensor or photo detector, wherein the contact region of this illustrative sensor is disposed on a top side (major surface) of the bulk substrate wafer/die.
Figure 5B:
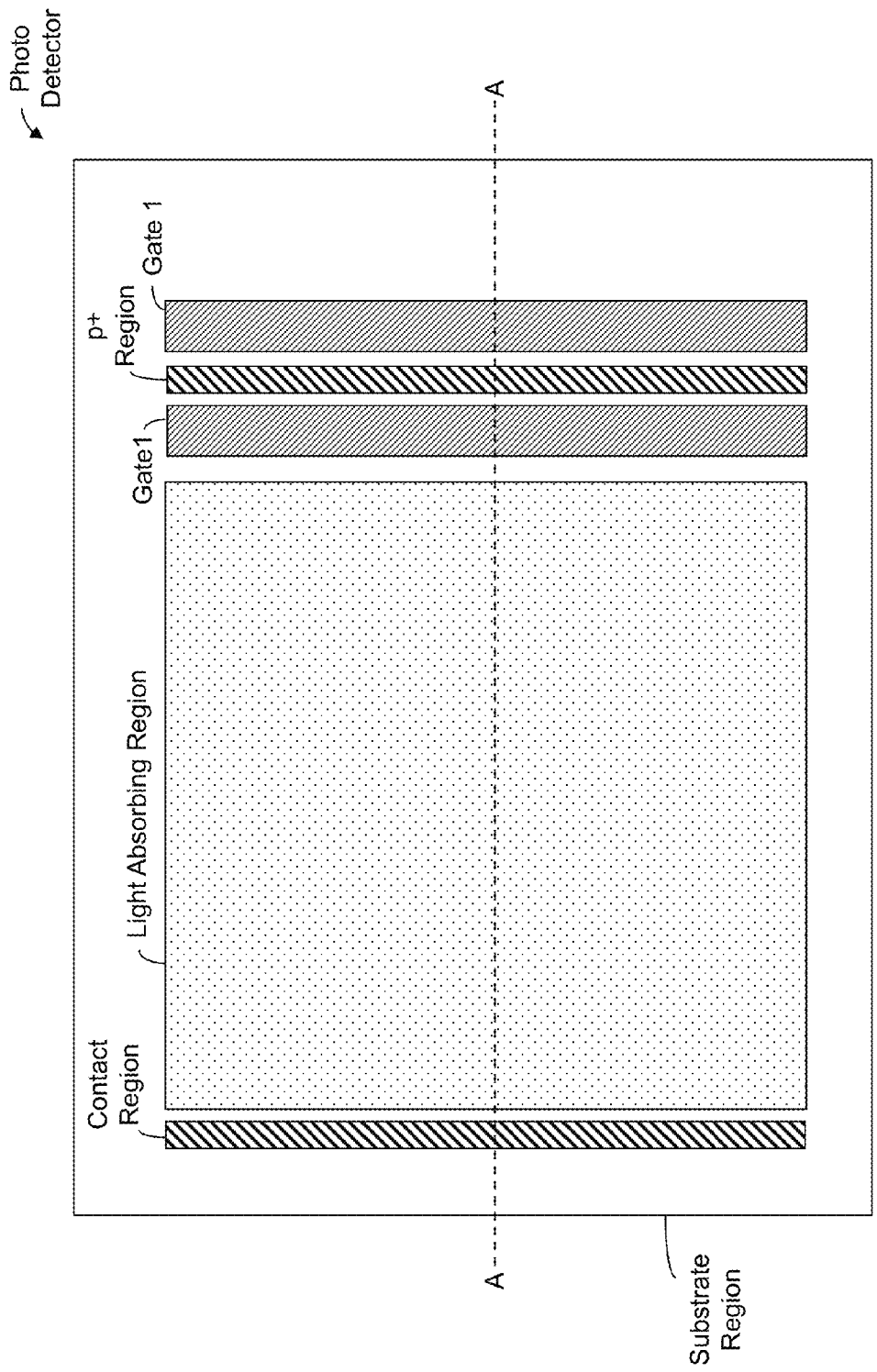
FIGS. 5B and 5C illustrate exemplary top views of the cross-sectional view of the photo detector of FIG. 5A, wherein dotted lines A-A indicate the location of the cross-sectional view of FIG. 5A; although the contact region of this exemplary embodiment of FIGS. 5A-5C is often described as a p+ region, in another embodiment, the contact region may be an n+ region.
Figure 5C:
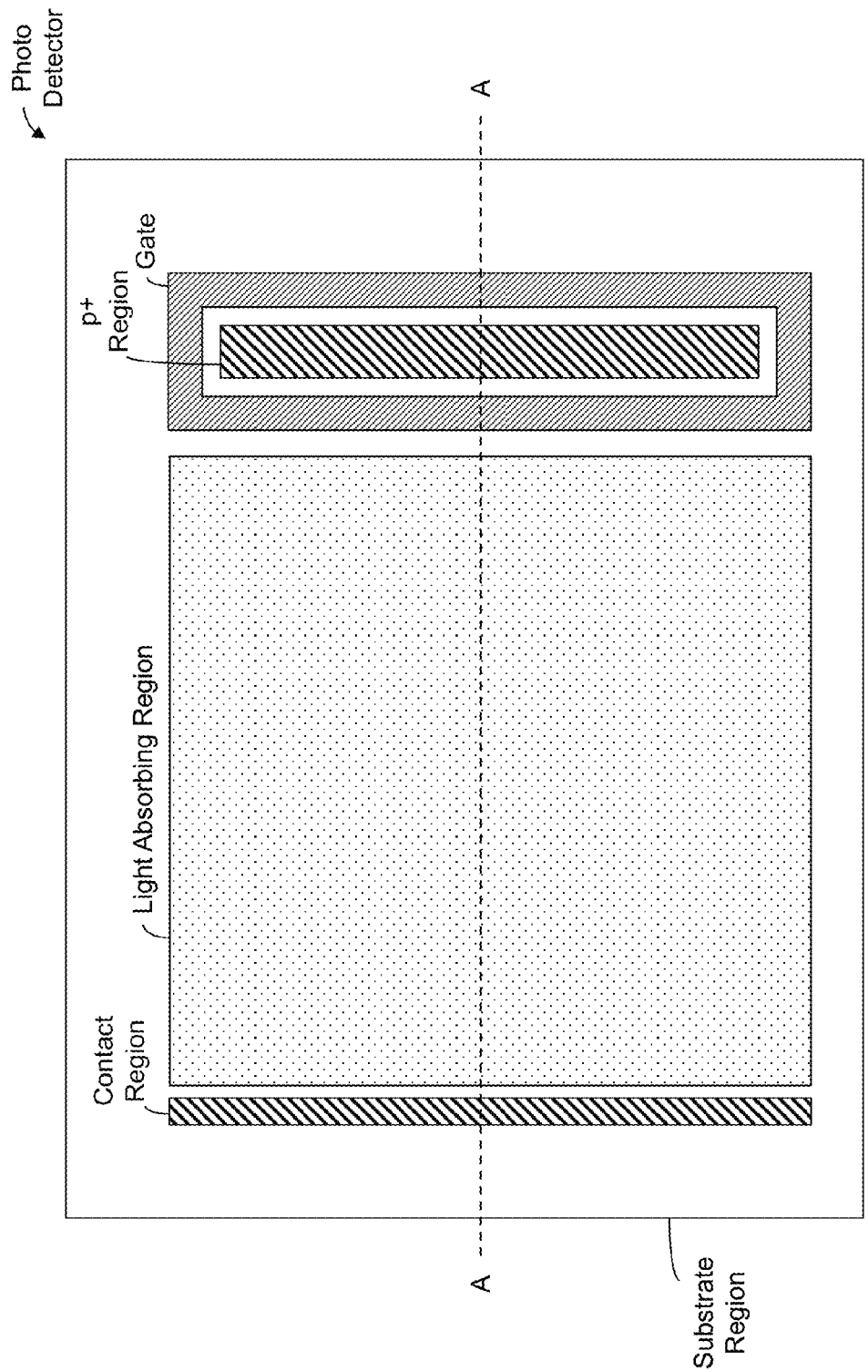
Figure 6:
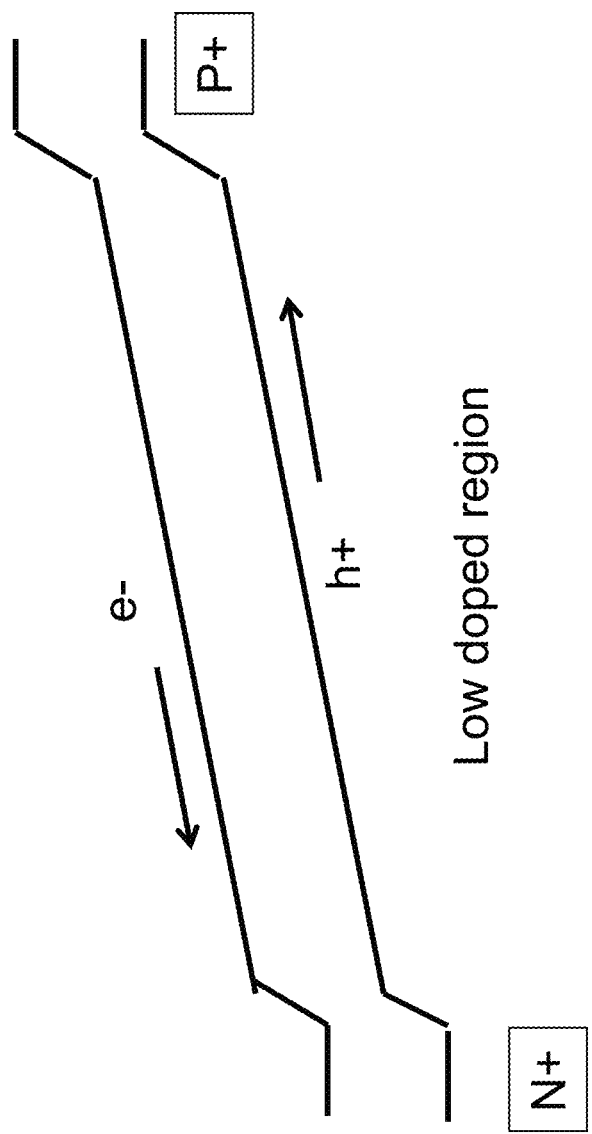
FIGS. 6-9 depicts the stages of operation of the photo detector from an energy band diagram perspective, in accordance with certain aspects of the present inventions, wherein a first voltage (for example, a negative voltage which, in this exemplary embodiment, may be −5V) is applied to the photo detector to reverse bias and/or maintain the photo detector in a detection hold state (FIG. 6—reverse bias voltage applied (i.e., no detection control signal applied to photo detector) to photo detector; photo detector in a non-detection state via applied hold voltage—charge carriers are "removed" from low doped region); wherein a second voltage (for example, a positive voltage which, in this exemplary embodiment, may be 1V) is applied to the photo detector to place the detector in a detection ready state wherein potential barriers adjacent to the n+ and p+ regions blocks or prevents (significant) current flow (FIG. 7—energy band diagram immediately after switching to the forward bias: photo detector is a detection ready state; potential barriers adjacent to the n+ and p+ regions of the photo detector block or prevent (significant) current flow); in the presence of incident light, carriers generated by light accumulate in the regions adjacent to the n+ and p+ of the photo detector; light generated carriers reduces potential barriers adjacent to the n+ and p+ regions of the photo detector (FIG. 8—the carriers generated by light accumulate in the regions adjacent to the n+ and p+ regions of the photo detector; light generated carriers reduces potential barriers adjacent to the n+ and p+ regions) such that current flows between n+ and p+ regions of the photo detector in the presence of detected light and in response to the control signal applied by the control circuitry wherein under these circumstances the detector is a detect state (FIG. 9—current flows between n+ and p+ regions of the photo detector in the presence of detected light and in response to the control signal applied by the control circuitry; under these circumstances, the barriers eventually disappear and the forward current flows).
Figure 7:
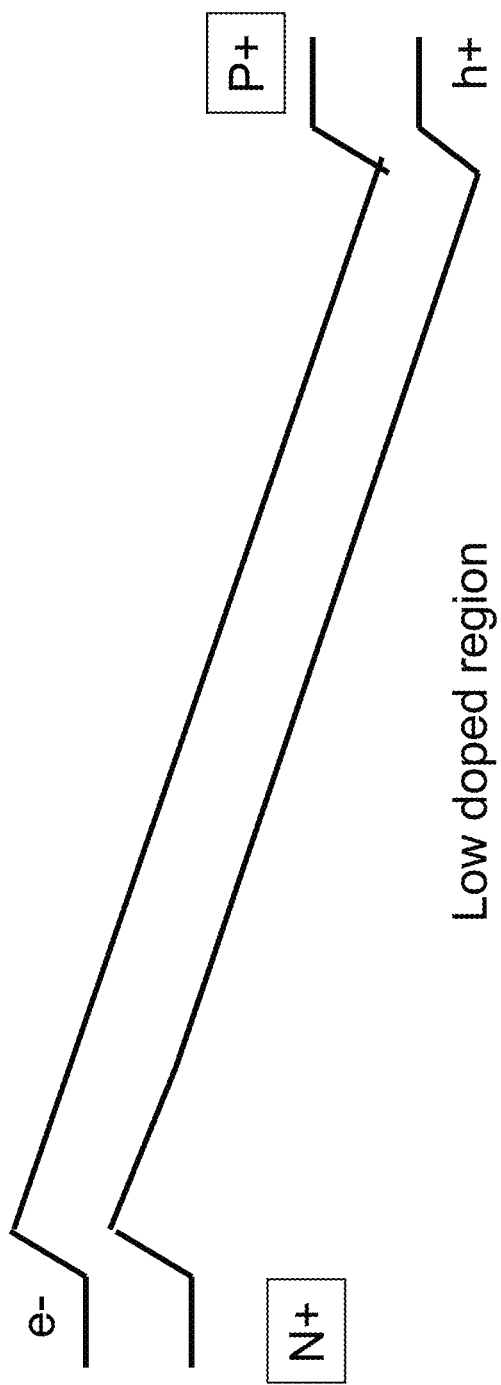
Figure 8:
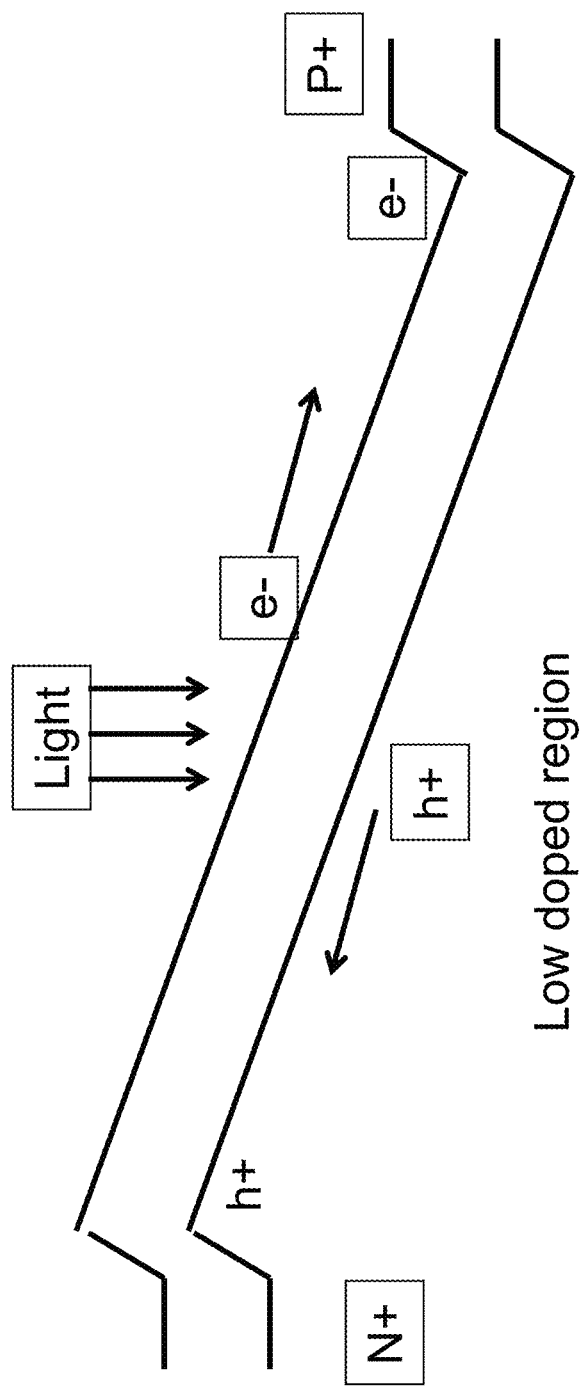
Figure 9:
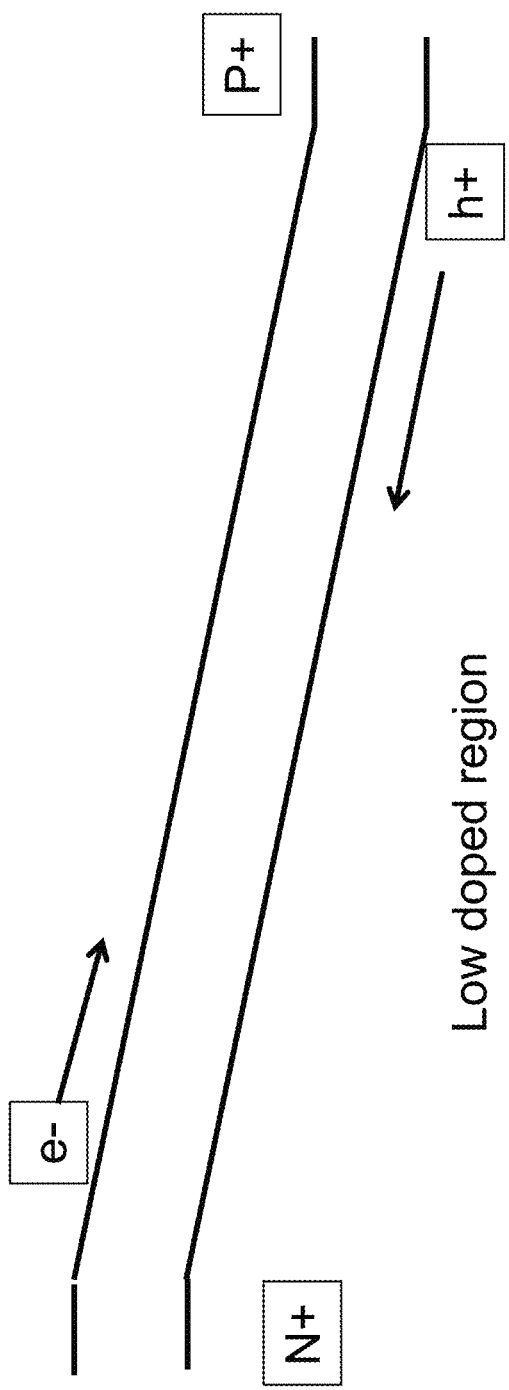

FIGS. 5B and 5C illustrate exemplary top views of the cross-sectional views of the photo detectors of FIG. 5A wherein dotted lines A-A in FIGS. 5B and 5C indicate the location of the cross-sectional views of FIG. 5A. Notably, although the contact regions of the exemplary embodiments of FIGS. 5A-5C have been described as a p+ region, in another embodiment, the contact region may be an n+ type.

With reference to FIGS. 4-9, in one embodiment, the circuitry and techniques of the present inventions may maintain the photo detector in a non-detection state via application of a reverse bias voltage being applied to the photo detector (i.e., no detection control signal applied to the photo detector). In this regard the photo detector is in a non-detection state via application of the hold voltage wherein charge carriers are "removed" from low-doped region. In one exemplary embodiment, the hold voltage is −5V. (See, FIGS. 4 and 6). Notably, in the non-detection state, little to no current flows through the photo detector regardless of the presence of incident light. Moreover, in operation, in the absence of incident light, little to no current flows through the photo detector regardless of the state of the photo detector and/or control signals. The circuitry and techniques of the present inventions may place the photo detector in a ready state via application of a detect voltage wherein potential barriers adjacent to the n+ and p+ regions block or prevent current flow (for example, significant current flow). (See, FIG. 7). The detect voltage, for example, +1V in this exemplary embodiment, places the photo detector in a forward bias state. Here, there is no light incident on the photo detector and, as such, little to no current flows through the photo detector.

When light is incident on the photo detector, carriers generated by light accumulate in the regions adjacent to the n+ and p+ regions thereby reducing potential barriers adjacent to the n+ and p+ regions. (See, FIG. 8). In response, a substantial current flows between n+ and p+ regions in the presence of light incident on the photo detector. Under these circumstances, the barriers eventually disappear and the forward current flows. (See, for example, FIGS. 4 and 9).

The illustrated/exemplary voltage levels to implement or enable sensing by the photo detector are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the voltages applied to n+ region and p+ region) become or are positive and negative.

Moreover, the detection time or triggering time of the photo detectors of the present inventions may be programmable or tunable, for example, to meet or accommodate response time specifications as well as power consumption specification. In one embodiment, the voltages applied to the n+ region and p+ region are adjusted to decrease the response time of the photo detector—for example, by increasing the electric field within the body region. Here, the electric field between the n+ region and p+ region and associated region is adjusted (for example, increased) to adjust the response time (for example, decrease) of the photo detector. In another embodiment, the voltages applied to the n+ region and p+ region are adjusted to reduce the power consumption of the photo detector. Thus, the response time and/or power consumption may be controlled, adjusted and/or programmed to, for example, accommodate desired/required specifications of the photo detector. All permutations response time and/or power consumption, and combinations of thereof, are intended to fall within the scope of the present inventions.

In addition thereto, or in lieu thereof, in one embodiment, the photo detector is placed in a predetermined or non-detection state before sensing the light (or data) via application of a hold voltage. For example, carriers may be removed from the low-doped region prior to sensing so that the concentration of carriers in that region at the initiation of sensing is below a predetermined value. In one embodiment, the photo detector is placed in a predetermined or non-detection state by applying a reverse bias voltage to the first and second doped regions to remove carriers from the body region. Establishing the photo detector in a predetermined or non-detection state (for example, periodically) before sensing may enhance or increase the stability and/or accuracy of the photo detector during sensing.

In one embodiment, the photo detector includes at least two doped regions—a p+ region and an n+ region. The doped semiconductor regions may be disposed and/or formed in or on the substrate and juxtaposed the low doped region. For example, the p-type semiconductor material may be formed in the substrate by doping the semiconductor with a p-type impurity (for example, boron).

The low-doped region may be fabricated in or on the substrate. In one embodiment the body region is an intrinsic or doped semiconductor (for example, intrinsic/undoped silicon, germanium or silicon-carbide or a lightly doped (with donor or acceptor impurities) silicon, germanium or silicon-carbide). Indeed, the low-doped region may be one or more materials from the Group IV semiconductor including silicon, germanium, silicon carbide and/or combinations thereof (for example, silicon-germanium). The low-doped region may be an intrinsic material or a material having impurities, for example, n-type or p-type material(s).

Importantly, the photo detector may be fabricated using any materials and/or techniques now known, described herein, and/or later developed.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description. Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects and/or embodiments thereof. For the sake of brevity, many of those permutations and combinations will not be discussed and/or illustrated separately herein.

Notably, the photo detectors of the present inventions may be implemented in a discrete device (for example, discrete photon receiver element) as well as in conjunction with any type of integrated circuitry (for example, integrated CMOS photon receiver circuitry), whether now known or later developed; all such configurations are intended to fall within the scope of the present inventions. Further, any manufacturing technique, whether now known or later developed, may be employed to fabricate the photo detector and/or photo detector-integrated circuit device of the present inventions; all such techniques are intended to fall within the scope of the present inventions.

Figure 10:
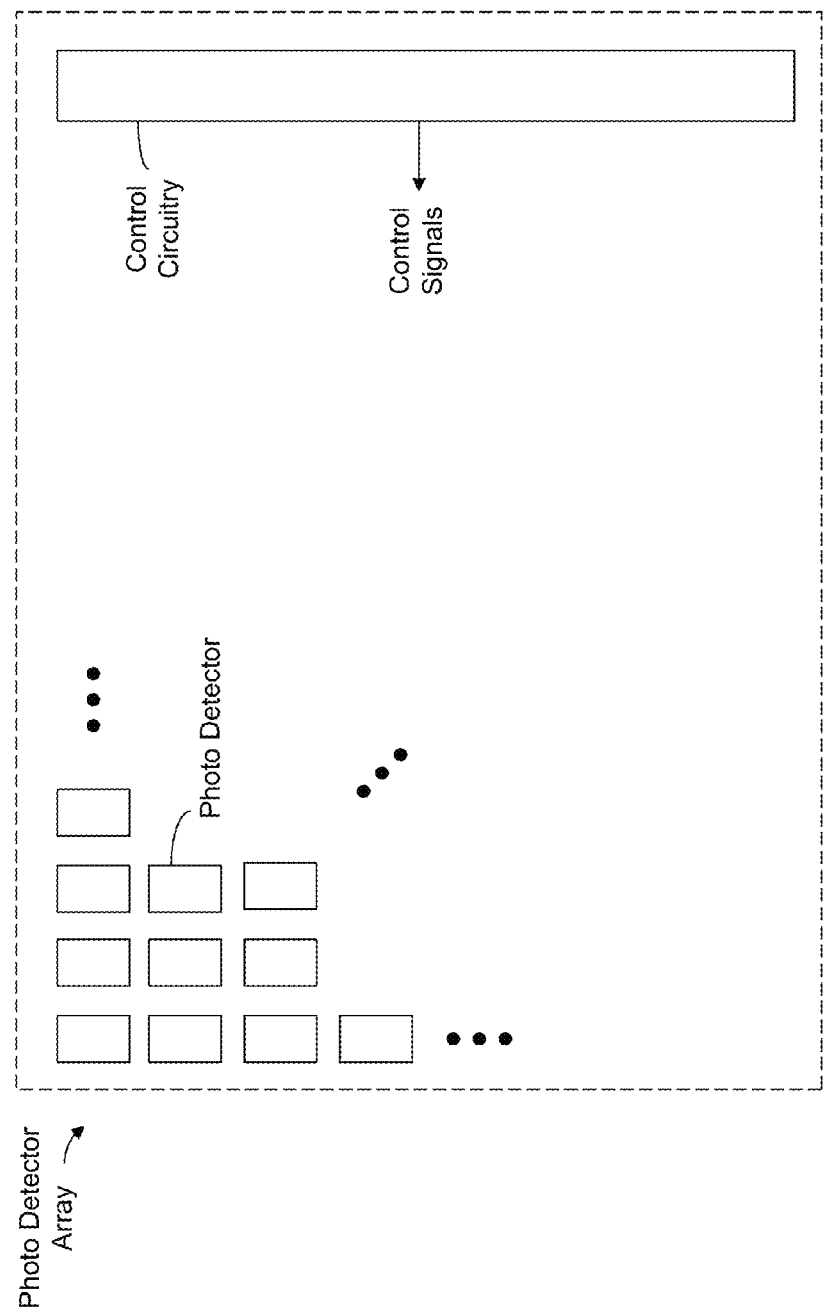
FIG. 10 illustrates an array of photo detector according to another aspect of the invention, wherein the photo detectors may be implemented via any of the embodiments described and/or illustrated herein; the array may include, in addition to the array of sensors, control circuitry to manage the acquisition, capture and/or sensing operations of the photo detectors of the array—for example, the control circuitry (which may be integrated on the same substrate as the sensors/detectors) may control or enable/disable the photo detectors or photo detectors in a manner so that data acquisition or sensing correlates to the data rate of the transmission; the photo detector or photo detector array may be coupled to a plurality of fiber optic output devices wherein each fiber optic device is associated with one or more photo detectors of the array and the control circuitry may control or enable/disable the subset of photo detectors in accordance with the associated output of the fiber optic device.

In another aspect, the present inventions relate to an array of photo detectors according to any of the embodiments described and/or illustrated herein. The array may include, in addition to the array of photo detectors, control circuitry to manage the acquisition, capture and/or sensing operations of the photo detectors of the array. (See, for example, FIG. 10). For example, the control circuitry may control or enable/disable the photo detectors in a manner so that data acquisition or sensing correlates to the data rate of the transmission. In another embodiment, the photo detector array is coupled to a plurality of fiber optic output devices wherein each fiber optic device is associated with one or more photo detectors of the array and the control circuitry may control or enable/disable the subset of photo detectors in accordance with the associated output of the fiber optic device.

The photo detector array may be formed from a plurality of discrete devices and/or from a plurality of photo detectors integrated on a die wherein the photo detector array portion includes a plurality of photo detectors to acquire, capture, convert and/or sense the incident light from one or more associated fiber optic output(s). The photo detectors may be configured and/or arranged in any array architecture as well as in conjunction with any type of integrated circuitry, whether now known or later developed; all such configurations are intended to fall within the scope of the present inventions. Further, any manufacturing technique, whether now known or later developed, may be employed to fabricate the array (which includes a plurality of photo detectors) and/or photo detector array-integrated circuit device embodiments of the present inventions; all such techniques are intended to fall within the scope of the present inventions.

Figure 11:
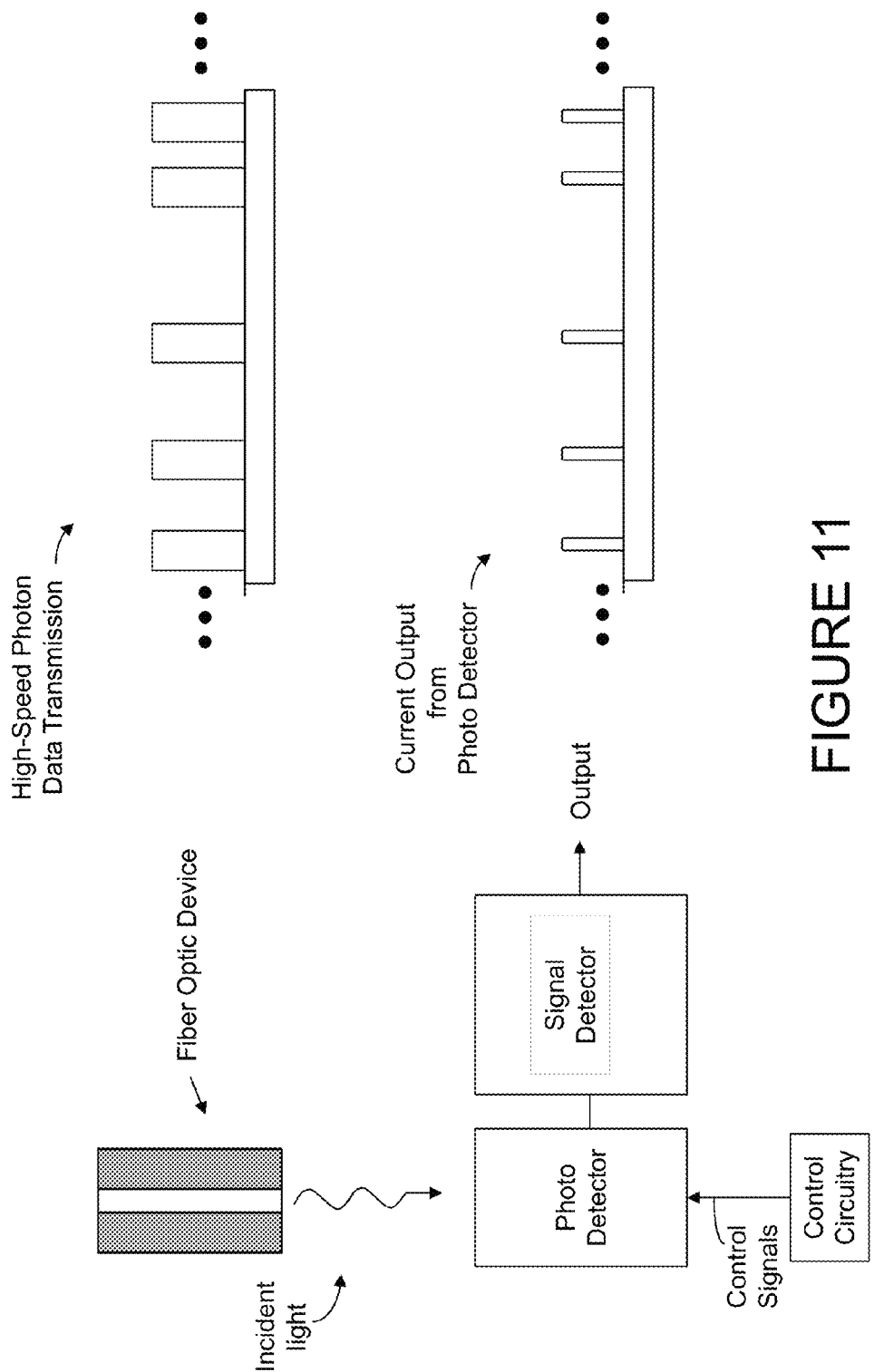
FIG. 11 illustrates the photo detector (in block diagram form) implemented in high-speed data transmission environment that employs photon data transmission (for example, via a fiber optic); the light sensor or photo detector may be implemented via any of the embodiments described and/or illustrated herein and may be coupled to a current amplifier or sensor (and other circuitry) to measure/condition the current output by the sensor (for example, output via the contact region and doped regions in response to the detection of light/data); notably, the current sensor may be a high-speed sense amplifier or the like—wherein all current sensing circuitry and architectures, now known or later developed, are intended to fall within the scope of the present inventions; moreover, the light sensor or photo detector may be discrete devices or integrated with the current amplifier or sensor (and/or other circuitry) as an integrated circuit.

As noted above, the present inventions may be implemented in high-speed data transmission that employs photon data transmission (for example, via a fiber optic). With reference to FIG. 11, the photo detector may be coupled to a signal detector (current detector and/or other circuitry) to measure/condition the current output by the photo detector (for example, output via the p+ and n+ doped regions in response to the detection of light/data in the exemplary embodiments illustrated in FIGS. 3, 4, 10 and 11). Notably, the current photo detector may be a high-speed current detector or the like. All current sensing circuitry and architectures, now known or later developed, are intended to fall within the scope of the present inventions.

Further, the p+ and n+ regions in the embodiments described and/or illustrated herein may be formed by or in a semiconductor (for example, silicon doped with acceptor/donor impurities).

Notably, the photo detector, photo detector array and/or die/device (including the photo detector and/or photo detector array) may include an anti-reflective material disposed there over or thereon. In one embodiment, an anti-reflective material is disposed over or on the light absorbing region of the photo detector or photo detectors (of the array of photo detectors). In another embodiment, an anti-reflective material may be disposed on or over the entire structure, or a significant portion thereof.

As noted above, the present inventions may be implemented in a discrete photo detector or in an integrated circuit device having a photon receiver section (which may include one or more photo detectors (including an array of photo detectors)). Moreover, the photo detectors of the present inventions may be implemented in the standard planar technology (as illustrated herein) or any 3D technology (for example, planar or vertical type), or pillar architectures). The body region of the photo detector may or may not be electrically floating in view of the insulation or non-conductive region (for example, in bulk-type material/substrate). As illustrated herein, the photo detector may be formed on an SOI substrate or bulk silicon substrate.

As mentioned above, the present inventions may employ any photo diodes or photo detectors to implement the present inventions, including the photo diode or photo detector layouts/architectures described in U.S. patent application Ser. No. 13/481,891, incorporated by reference herein. Exemplary photo detector layouts/architectures are discussed above and illustrated in FIGS. 5A-5C. Other photo detector layouts/architectures are discussed immediately below.

Figure 12A:
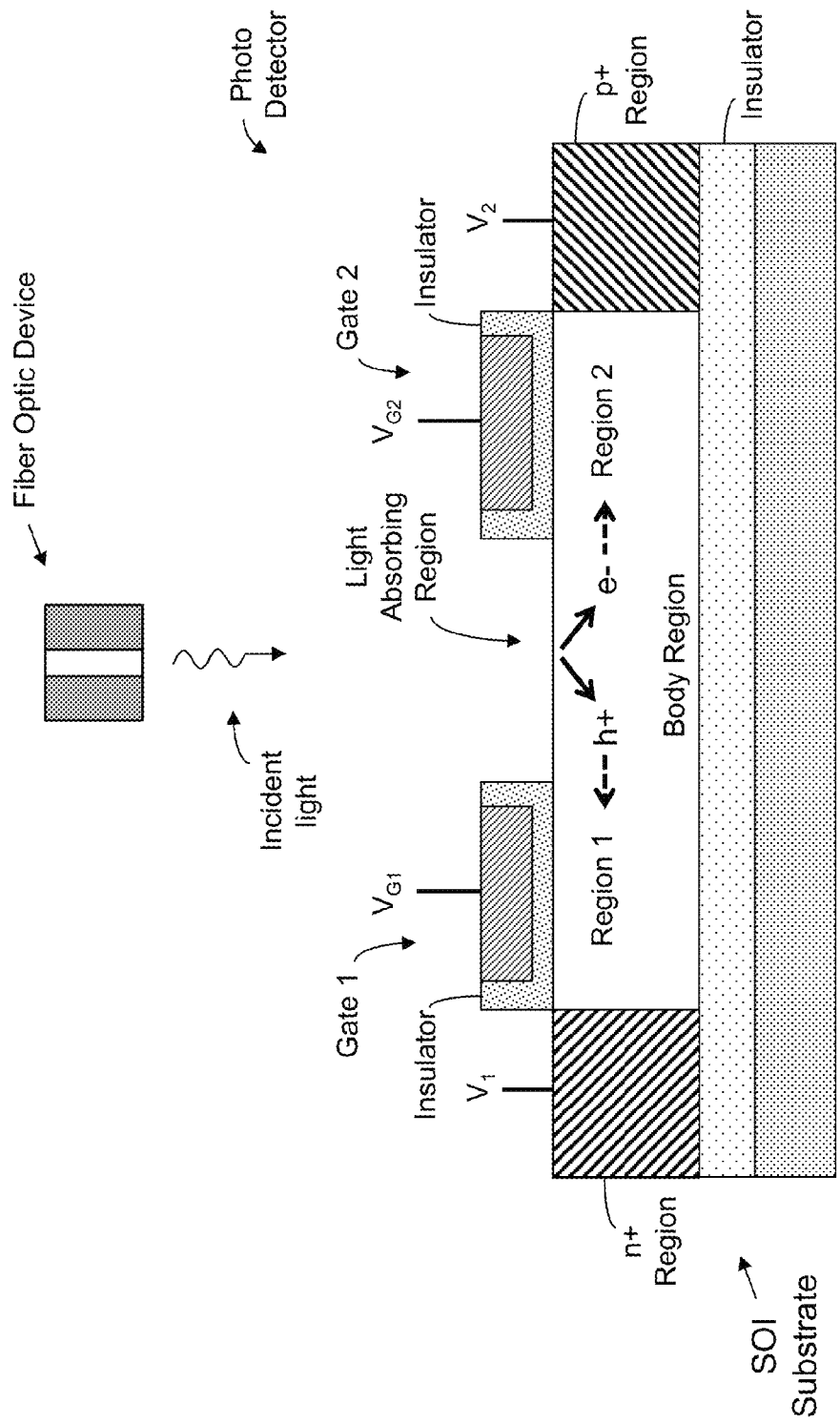
FIG. 12A is a cross-sectional view of an exemplary monolithic light sensor or photo detector of FIG. 1A, wherein the sensor, in this illustrated embodiment, is disposed in or on a semiconductor-on-insulator substrate (SOI substrate), for example, a silicon-on-insulator.
Figure 12B:
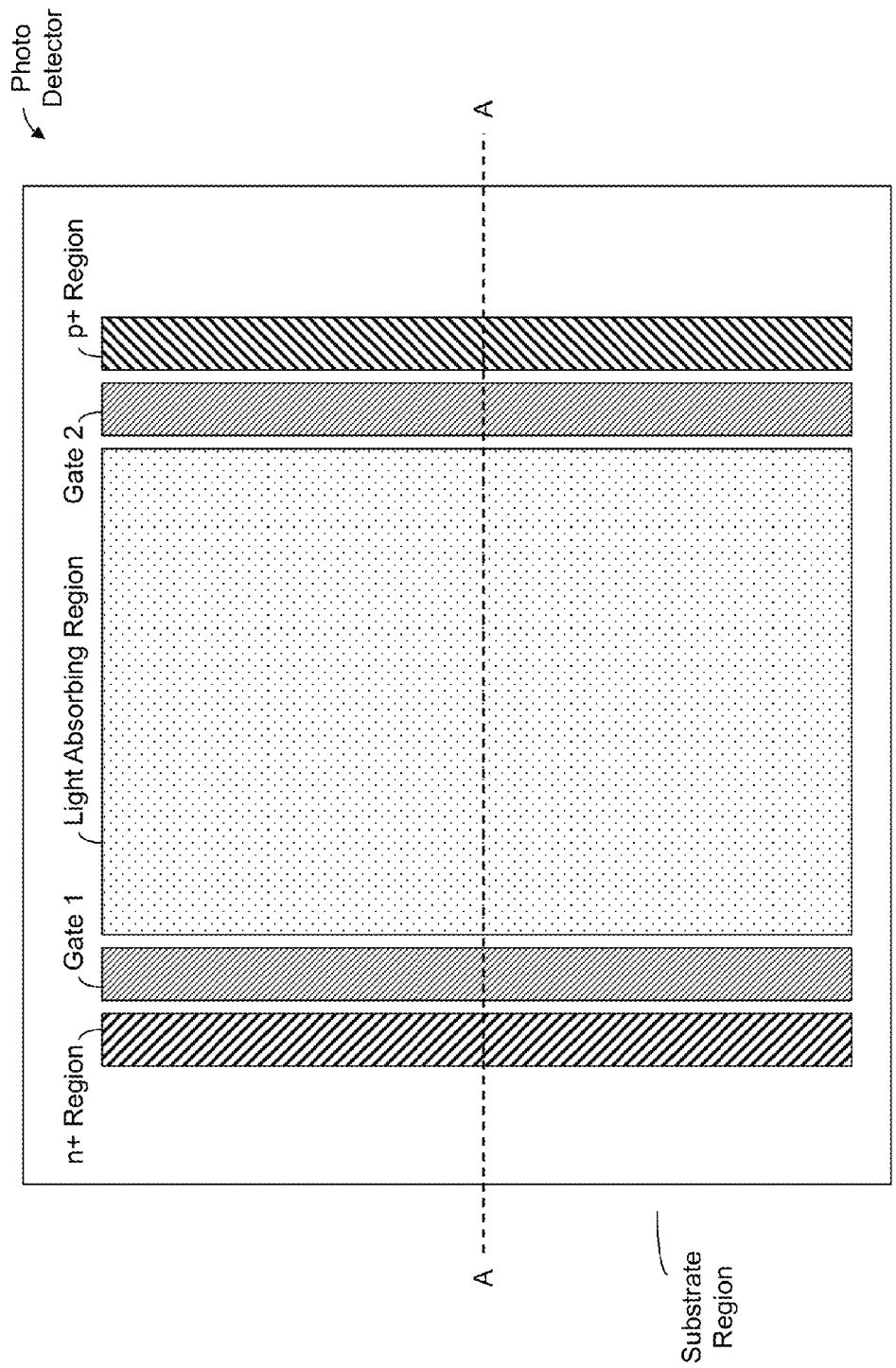
FIGS. 12B and 12C are illustrative top views of the exemplary monolithic photo detector of FIG. 1A; notably, with respect to FIG. 12C, gates 1 and 2 are interconnected as a unitary structure which is identified or designated "Gate."
Figure 12C:
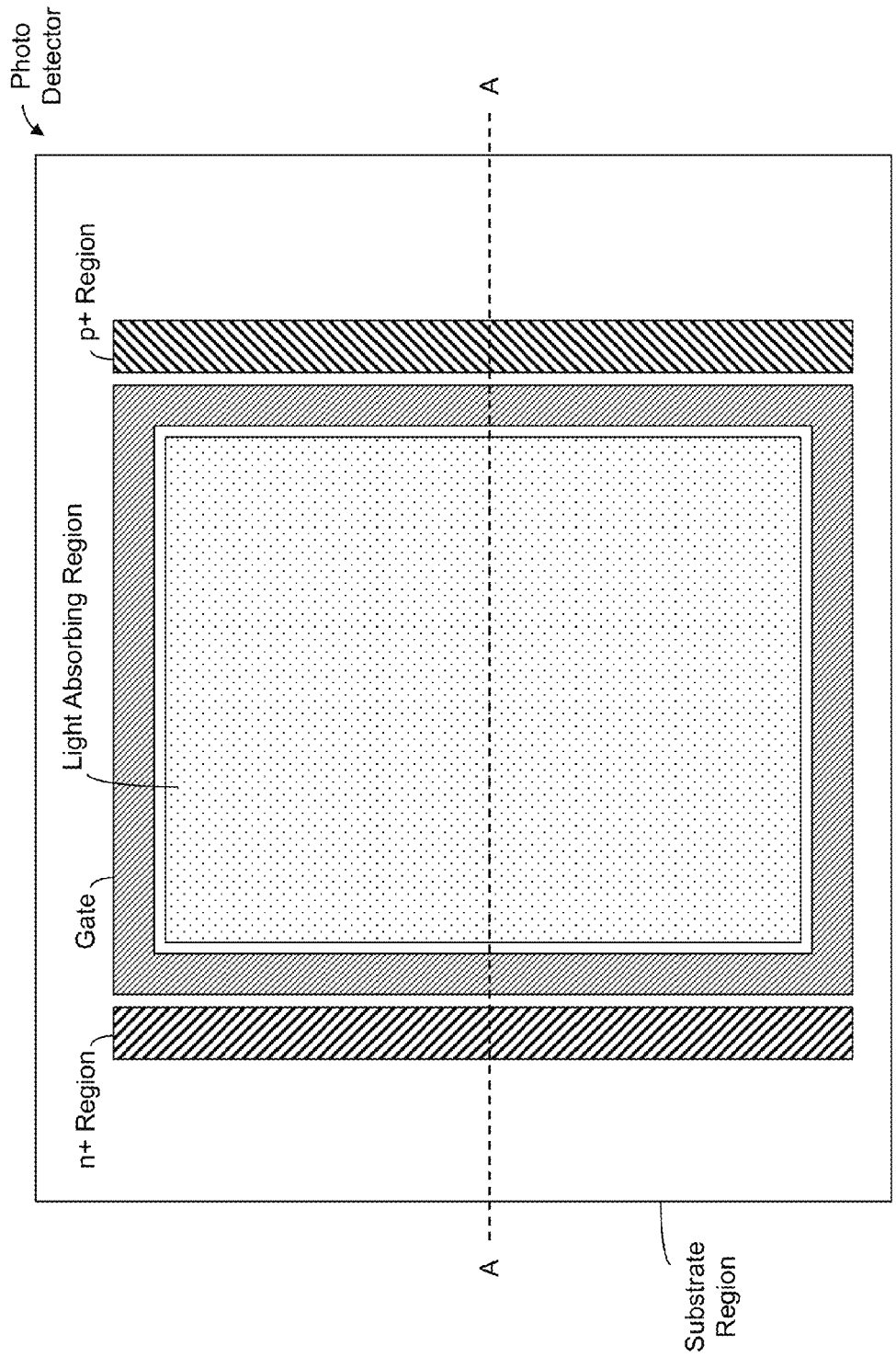

With reference to FIG. 12A, in one embodiment, a photo detector includes at least two control nodes or gates (illustrated in the exemplary embodiment as Gate 1 and Gate 2), a light absorbing region, a body region, a first doped region (illustrated in the exemplary embodiment as n+ region) and a second doped region (illustrated in the exemplary embodiment as p+ region). The photo detector, in this exemplary embodiment, is fabricated in or on a semiconductor on insulator (SOI) substrate (for example, a silicon or germanium region/layer/material disposed on or over an insulator region/layer/material (for example, a silicon oxide, silicon nitride and/or combination thereof).

Briefly, in one embodiment, the control nodes or gates (hereinafter "gates") may be comprised of a conductive type material (conductor or semiconductor), for example, a metal (for example, aluminum or copper), metal compound and/or a doped semiconductor (for example, silicon doped with donor or acceptor impurities). The gates are spaced from the body region via an insulator or dielectric material (for example, silicon oxide, silicon nitride or combinations or composites thereof, for example, ONO).

The body region may be an intrinsic or doped semiconductor (for example, intrinsic/undoped silicon or germanium or a lightly doped (with donor or acceptor impurities) silicon or germanium) including an intrinsic material or a material having impurities, for example, n-type or p-type materials. Indeed, the body region may be one or more materials from the Group IV semiconductor including silicon, germanium, silicon carbide and/or combinations thereof.

The photo detector according to this embodiment includes at least two doped semiconductor regions including n+ and p+ regions. These doped semiconductor regions may be formed within a semiconductor layer consisting of the body region. For example, the n-type semiconductor material may be formed from or by doping such semiconductor layer (for example, silicon layer) with an n-type impurity (for example, phosphorus or arsenic). The p-type semiconductor material may be formed from or by doping such semiconductor with a p-type impurity (for example, boron). Notably, the doped semiconductor regions (n+ and p+ regions) are outputs of the photo detector.

Importantly, the photo detector may be fabricated using any materials and/or techniques now known, described herein, and/or later developed.

With continued reference to FIG. 12A, in operation, the photo detector is enabled to detect incident light via application of selected or predetermined voltages to the gates and the doped regions (here, n+ and p+ regions). In one embodiment, a negative voltage applied to Gate 1 (for example, −2V), a negative or zero voltage is applied to the n+ region, a positive voltage applied to Gate 2 (for example, 2V) and a positive voltage (for example, 1V) is applied to the p+ region. Under these conditions and in this state, in response to light (for example, light which is output from a fiber optic device) incident on or applied to the light absorbing region of the photo detector, current flows between the n+ and p+ regions. That is, the applied or incident light generates electron-hole pairs in the body region of the photo detector—where the electrons and holes of such pairs are separated by an electric field within the body region. As noted above, the voltages (for example, static or fixed voltages) applied to the gates, n+ and p+ regions create or provide the electric field within the body region.

Figure 14:
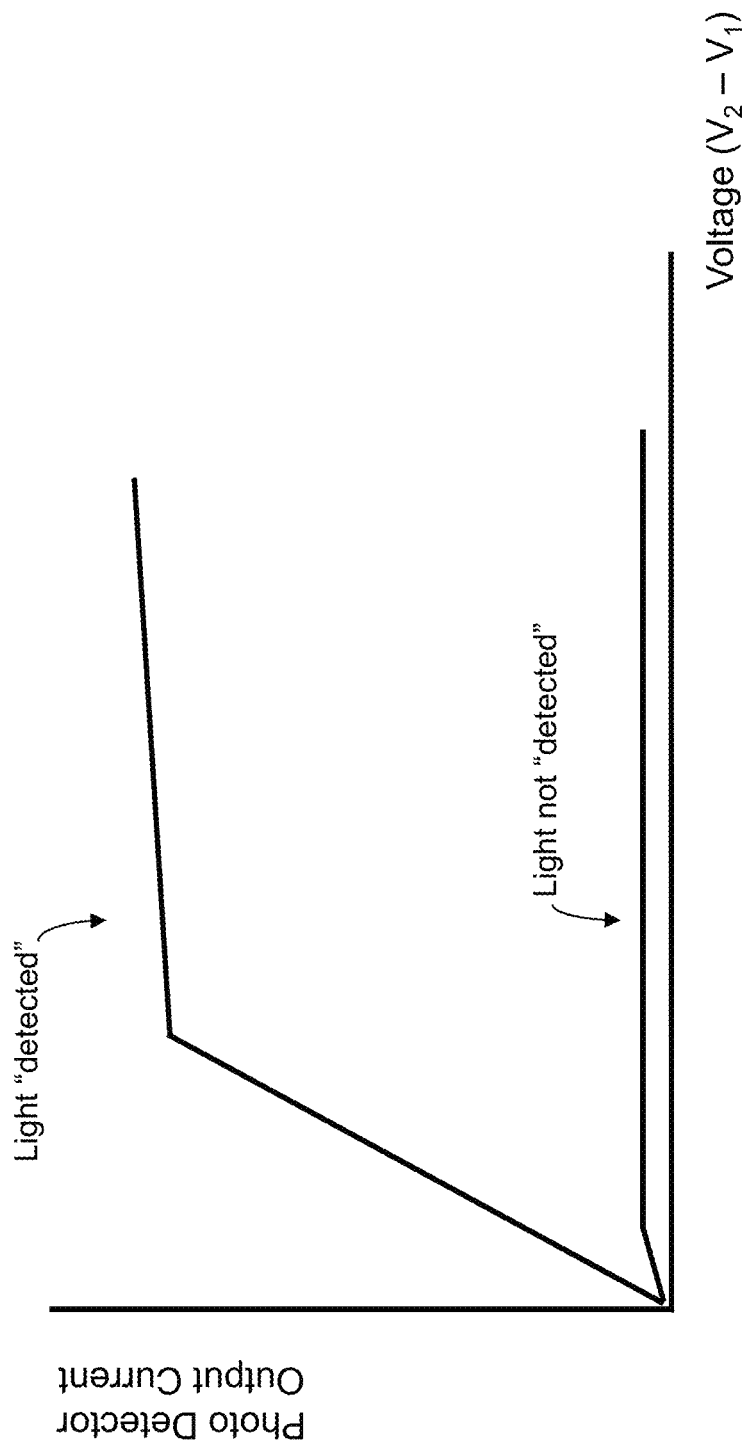
FIG. 14 is a graphical illustration of the relative output current of the light sensor or photo detector when the sensor detect light (i.e., light is "on") and when the sensor does not detect light (i.e., light is "off") in accordance with a change in voltage applied to the n+ and p+ regions.

In particular, positive carriers (i.e., holes) move towards the region 1, disposed under Gate 1, and negative carriers (i.e., electrons) move towards the region 2, disposed under Gate 2. The excess of holes in the region 1 will induce a lowering of the barrier to electron movement (band gap) and electron current flow from n+ region. Similarly, excess of electrons in the region 2 provides, induces or causes a lowering of the hole barrier and hole current flowing from p+ region. (Compare, FIG. 13A and FIG. 13B). Under these circumstances, the photo detector is in a conductive state or mode which provides a large internal current gain. Additionally, a positive feedback mechanism accelerates accumulation of excess carriers under the respective gates, which, in turn, reduce the potential barriers related corresponding to such regions and causes a current to flow between the p+ and n+ regions of the photo detector and an output current upon detecting or in response to the incident light. (See, for example, FIG. 14).

Notably, in the absence of incident light, little to no current flows between the p+ and n+ regions due to the barrier generated or caused by the voltages applied to Gates 1 and/or 2. (See, for example, FIGS. 13A and 14). Moreover, the photo detector may be disabled via removing/changing the voltages applied to one or more of Gate 1, n+ region, p+ region and/or Gate 2, and/or applying opposite polarity voltages to one or more of Gate 1, n+ region, p+ region and/or Gate 2. For example, increasing the amplitude on one or both of the voltages applied to the gates may place the sensor in a non-conductive state.

The illustrated/exemplary voltage levels to implement or enable sensing by the photo detector are merely exemplary. The indicated voltage levels may be relative or absolute.

Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the voltages applied to Gate 1, n+ region, p+ region and/or Gate 2) become or are positive and negative.

Moreover, the detection time or triggering time of the photo detectors may be programmable or tunable, for example, to meet or accommodate response time specifications as well as power consumption specification. In one embodiment, the voltages applied to the gates are adjusted to increase the response time of the photo detector—for example, by increasing the electric field within the body region. Here, the electric field between the gate and associated region is adjusted (for example, increased) to adjust the response time (for example, increase) of the photo detector. In another embodiment, the voltages applied to the gates are adjusted to reduce the power consumption of the photo detector. Thus, the response time and/or power consumption may be controlled, adjusted and/or programmed to, for example, accommodate desired/required specifications of the photo detector. All permutations response time and/or power consumption, and combinations of thereof, are intended to fall within the scope of the present inventions.

In addition thereto, or in lieu thereof, in one embodiment, the photo detector is placed in a predetermined state before sensing the light (or data). For example, carriers may be removed from the body region prior to sensing so that the concentration of carriers in the body region (and beneath the gates (Regions 1 and 2)) at the initiation of sensing is below a predetermined value. In one embodiment, the photo detector is placed in a predetermined state by applying the same voltage to the first and second doped regions (i.e., V1=V2) and applying voltage pulses to the gates Gate 1 and Gate 2 to remove carriers from the body region thereby providing depletion regions under gates Gate 1 and Gate 2. Establishing the photo detector in a predetermined state (for example, periodically) before sensing may enhance or increase the stability and/or accuracy of the photo detector during sensing.

Figure 15A:
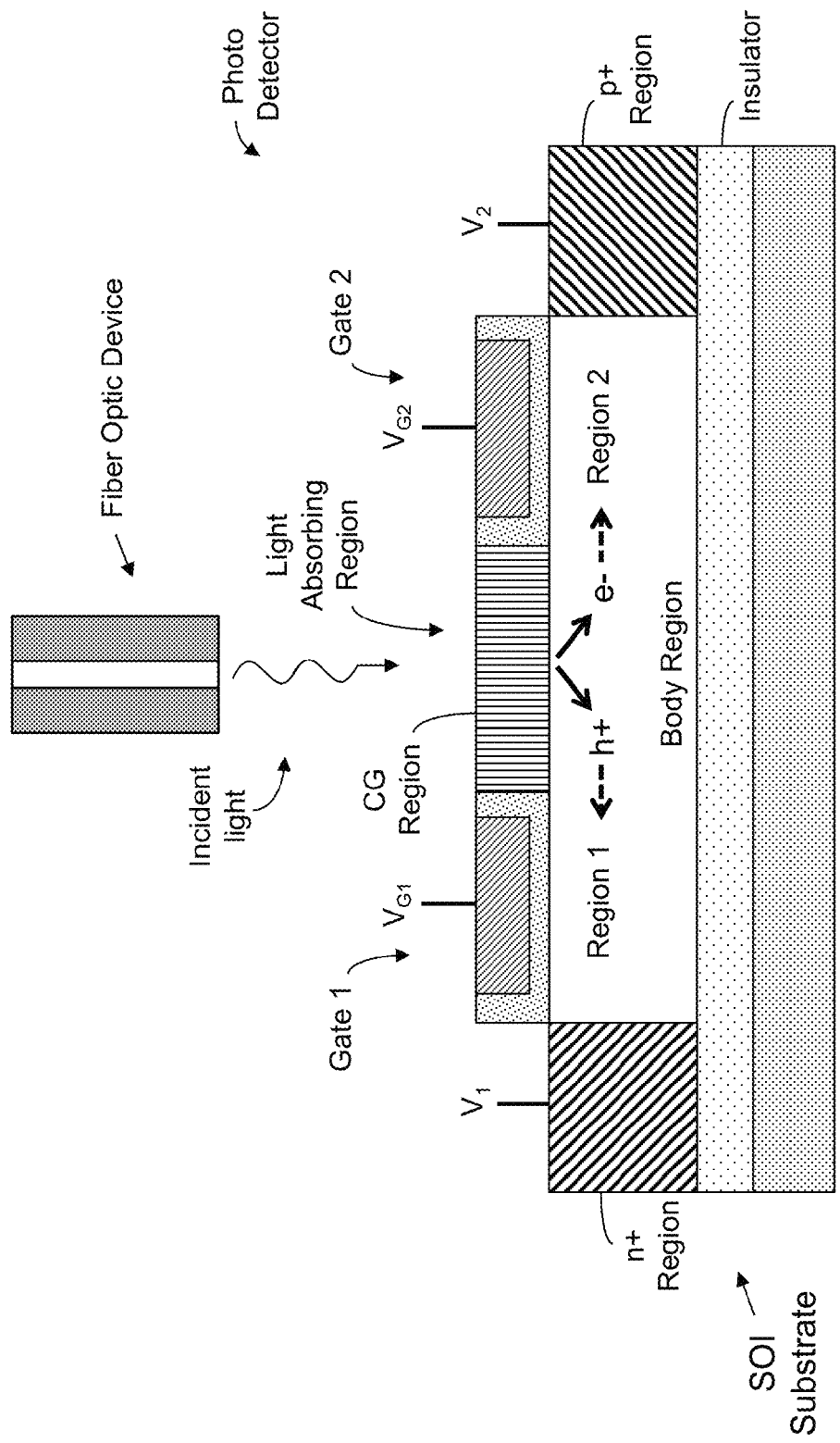
FIG. 15A is a cross-sectional view of another exemplary monolithic light sensor or photo detector according to another embodiment, wherein the sensor, in this illustrative embodiment, is disposed in or on an SOI substrate and includes a carrier generation region (CG region) disposed between control nodes or gates (illustrated in the exemplary embodiment as Gate 1 and Gate 2); the CG region may include a material which facilitates greater/higher generation of carriers in response to incident light wherein, in one embodiment, the CG region includes a material which generates more electron-hole carriers, relative to the sensor embodiment of FIG. 10A, in response to incident light; in one embodiment, the CG region includes germanium, gallium-arsenide or silicon-germanium, or combinations thereof (for example, both germanium and gallium-arsenide), and/or a highly doped semiconductor material (for example, highly doped silicon) which is more responsive to photons than a similar undoped or a lightly doped semiconductor material.

With reference to FIG. 15A, in another embodiment, the photo detector includes a carrier generation region (CG region) in addition to at least two control nodes or gates (illustrated in the exemplary embodiment as Gate 1 and Gate 2), a light absorbing region, a body region, a first doped region (illustrated in the exemplary embodiment as n+ region) and a second doped region (illustrated in the exemplary embodiment as p+ region). The CG region may include a material which facilitates greater/higher generation of carriers in response to incident light. That is, in one embodiment, the CG region includes a material which generates more electron-hole carriers, relative to the embodiment illustrated in FIG. 12A, in response to incident light. For example, in one embodiment, the CG region includes germanium, gallium-arsenide or silicon-germanium, or combinations thereof (for example, both germanium and gallium-arsenide). The CG region may also include a highly doped semiconductor material (for example, highly doped silicon) which is more responsive to photons than a similar undoped or a lightly doped semiconductor material.

In this embodiment, in response to an incident light, electrons and holes are created in the CG region and thereafter then move into the body region (due to the electric field formed by the voltages applied to the gates, n+ region and p+ region. Then, as described above with respect to the photo detector of FIG. 12A, the electrons and holes are "separated" within the body region by an electric field provided by the voltages applied to the gates, n+ region and p+ region. Notably, the operation thereafter is substantially the same as described above with respect to the photo detector of FIG. 12A and, as such, for the sake of brevity will not be repeated.

The CG region in this embodiment facilitates greater/higher generation of carriers in response to incident light having the same or lower photon energy. As such, the photo detector of FIG. 15A may detect light (photon transmission) having a lower energy in connection with the transmission thereof.

In another embodiment, the CG region includes a material that is less responsive to photon energy. In this embodiment, the CG region includes a material which generates fewer electron-hole carriers, relative to the embodiment illustrated in FIG. 12A, in response to incident light. For example, in one embodiment, the CG region includes amorphous silicon or lightly doped polycrystalline silicon. The photo detector of this embodiment may be less susceptible to noise that may be present on or in the incident light (data).

Figure 15B:
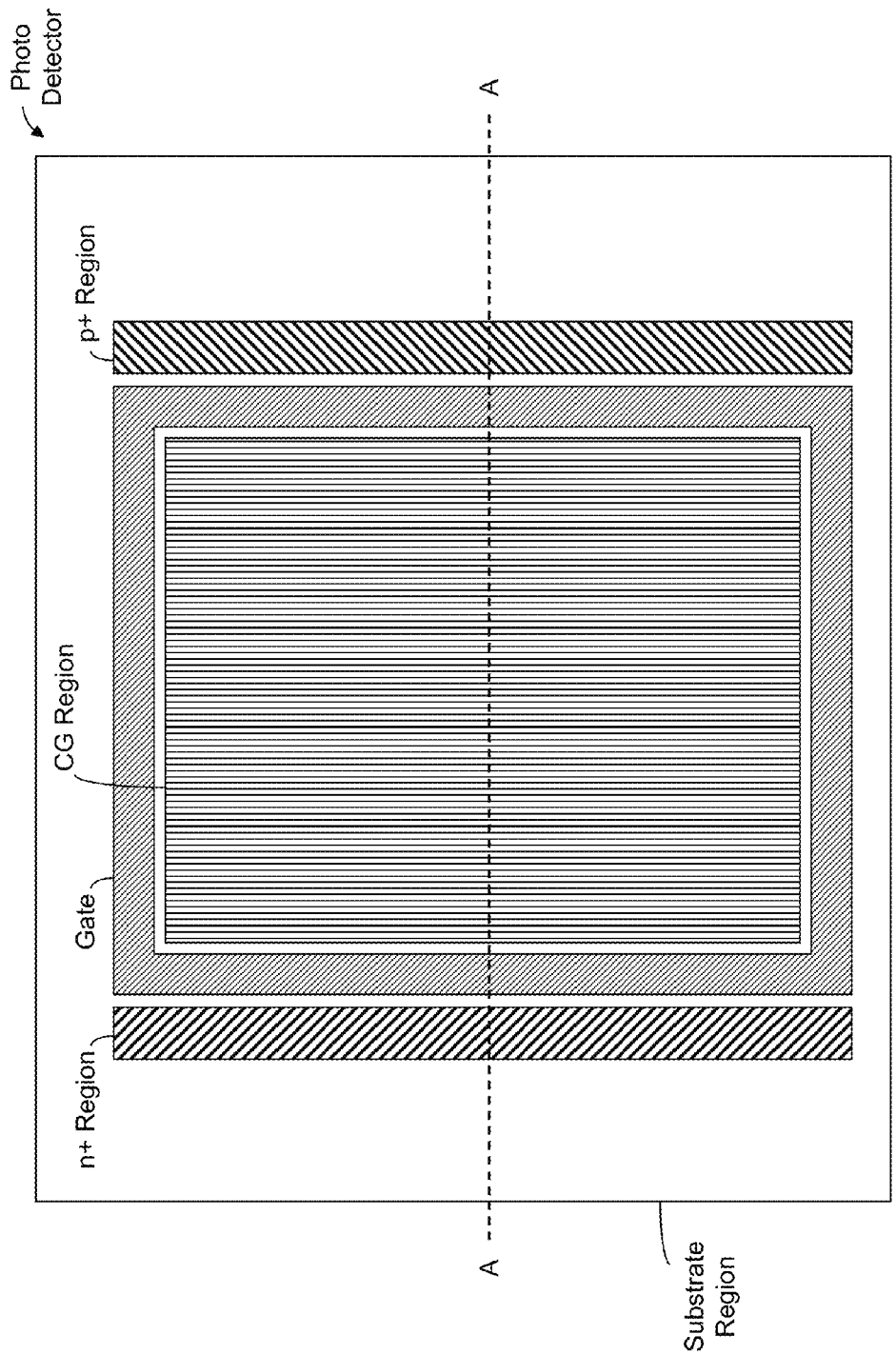
FIGS. 15B and 15C are illustrative top views of the exemplary monolithic photo detector of FIG. 15A according to certain aspects and embodiments.
Figure 15C:
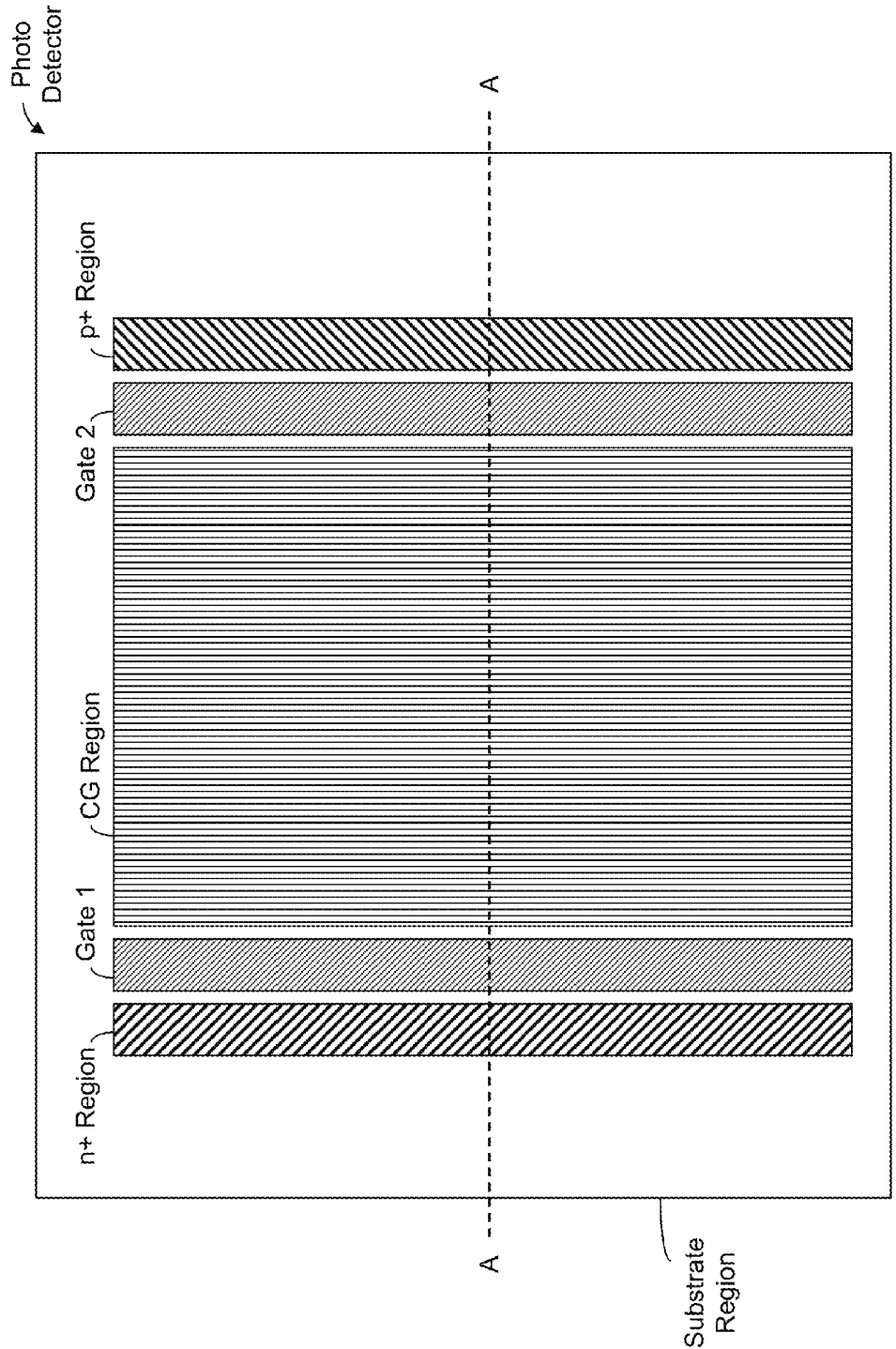

Notably, FIGS. 15B and 15C illustrate exemplary top views of the cross-sectional views of the photo detectors of FIG. 15A wherein dotted lines A-A indicate the location of the cross-sectional views of FIGS. 15B and 15C. With respect to FIG. 15B, gates 1 and 2 are interconnected as one structure.

Figure 16A:
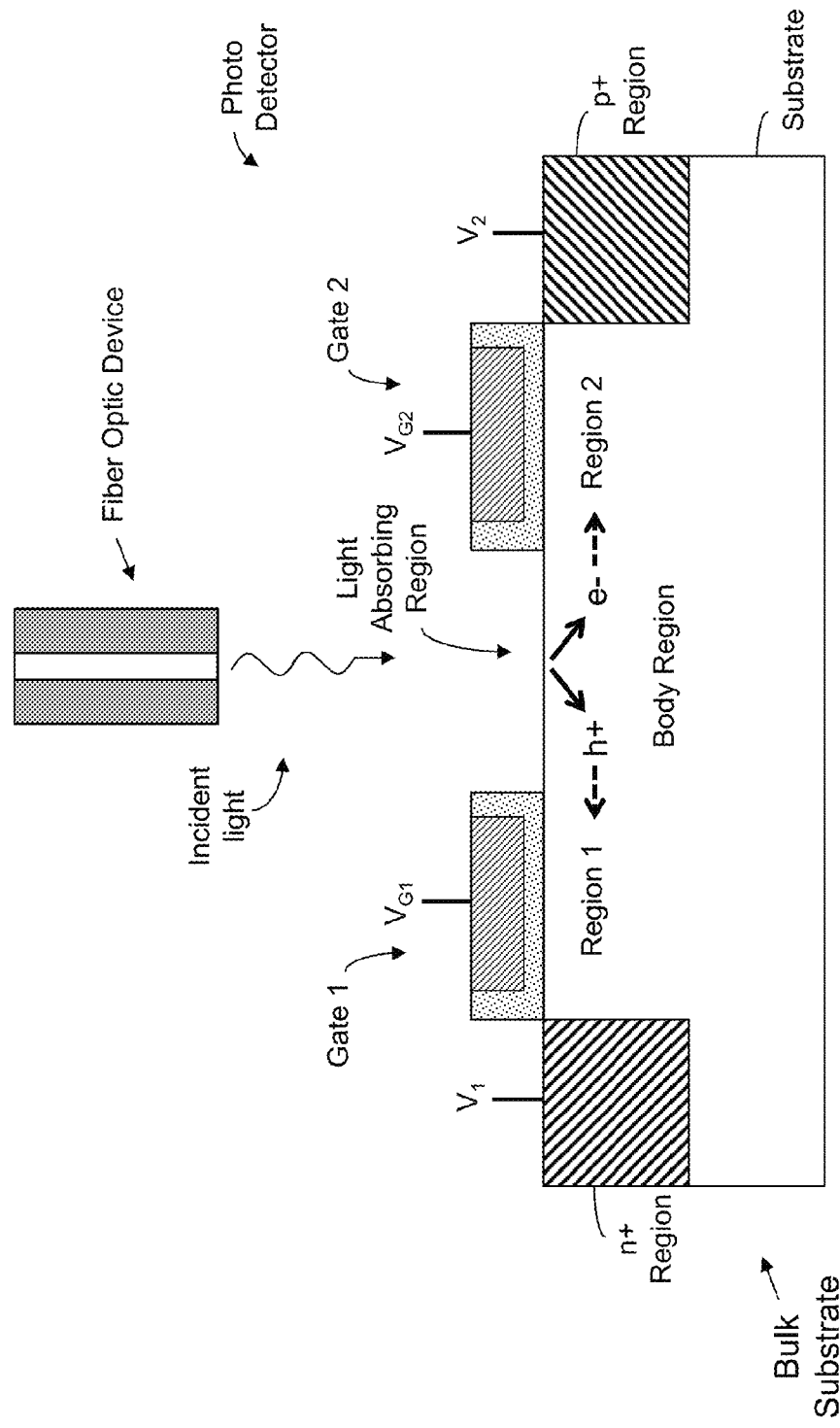
FIGS. 16A and 16B are cross-sectional views of exemplary monolithic light sensor or photo detector according to another embodiment, however in these illustrated embodiments (and unlike the embodiments of FIGS. 12A and 15A), the sensors are disposed in or on a bulk substrate (for example, one or more materials from the Group IV semiconductor including silicon (such as, bulk-silicon substrate), germanium, and silicon carbide).
Figure 16B:
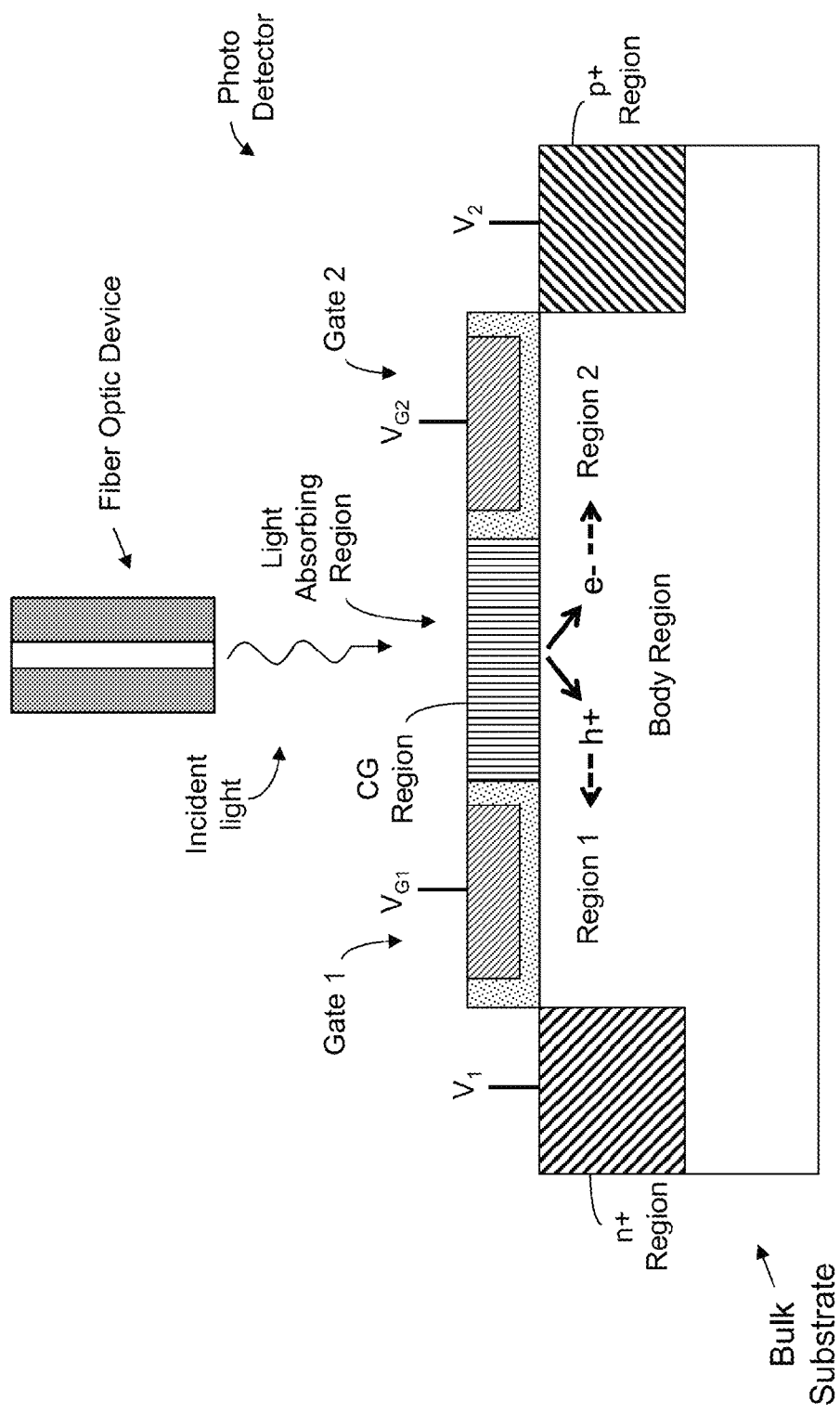

With reference to FIGS. 16A and 16B, in yet another embodiment, the photo detector may be fabricated on or in a bulk wafer/substrate. The discussion above pertaining to the materials, fabrication and operation, in relation to the embodiments corresponding to the SOI wafer/substrate, are entirely applicable here. That is, with reference to FIGS. 16A and 16B, a photo detector according to this embodiment includes at least two control nodes or gates (illustrated in the exemplary embodiment as Gate 1 and Gate 2), a light absorbing region, a body region, a first doped region (illustrated in the exemplary embodiment as n+ region) and a second doped region (illustrated in the exemplary embodiment as p+ region). The photo detector, in this exemplary embodiment, is fabricated in or on a bulk semiconductor wafer/substrate (for example, undoped or lightly doped silicon, germanium, or gallium arsenide.

Notably, where the photo detector is fabricated in or on a bulk semiconductor wafer/substrate, the low or lightly doped silicon substrate may "appear" as a dielectric in those instances where the photo detector device operates at high frequencies. As such, in operation, a significant majority of the carriers are maintained in a region of the body near the surface of the device closest to the incident light. In this way, a current is formed between the n+ and p+ regions in the body region immediately below the gates.

As mentioned above, the detection time or triggering time of the exemplary photo detectors of FIGS. 16A and 16B may be programmable or tunable, for example, to meet or accommodate response time specifications as well as power consumption specification. In one embodiment, the voltages applied to the gates are adjusted to increase the response time of the photo detector (for example, by increasing the electric field). In another embodiment, the voltages applied to the gates are adjusted to reduce the power consumption of the photo detector. All permutations and combinations thereof are intended to fall within the scope of the present inventions.

Figure 17A:
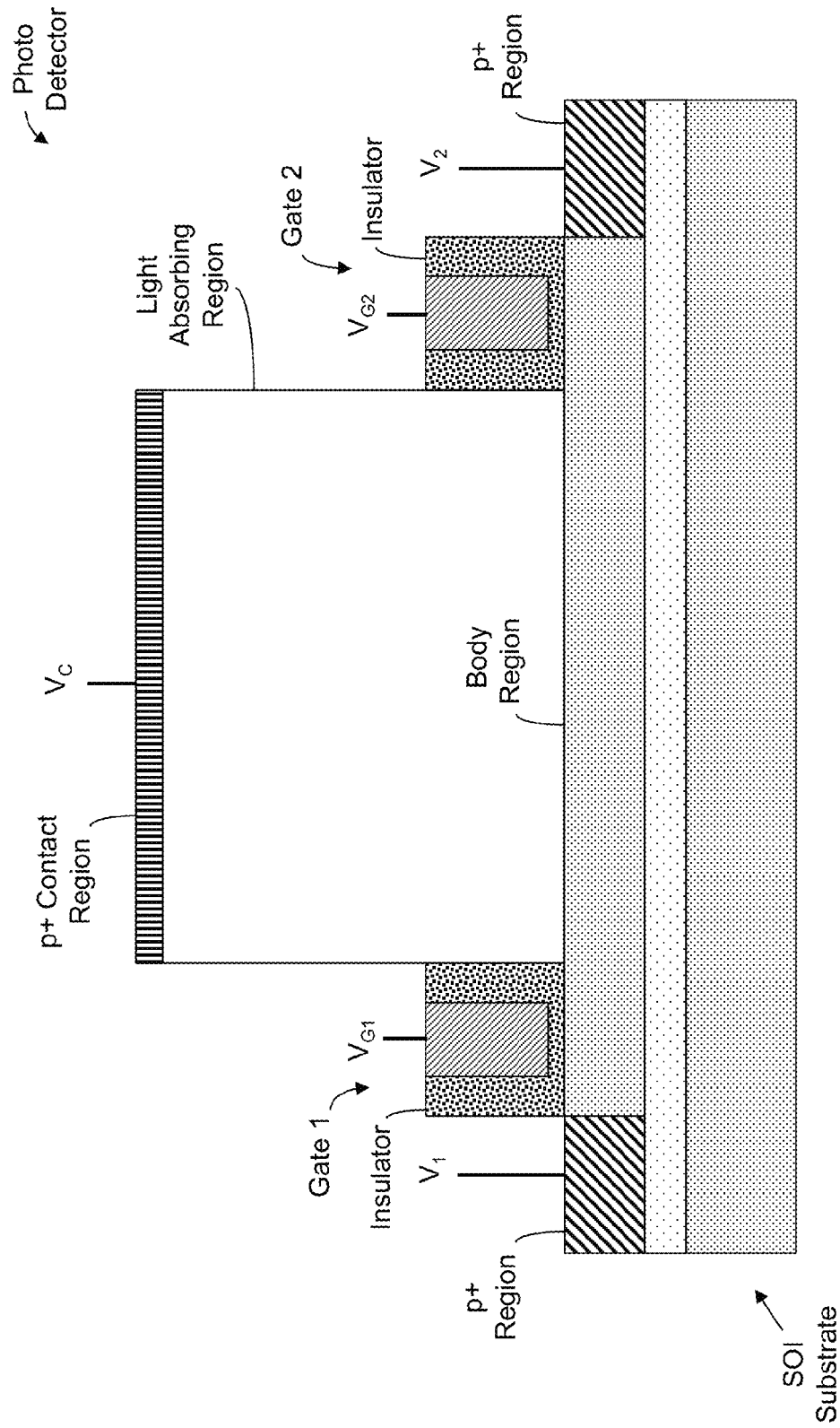
FIGS. 17A and 17B are cross-sectional views of monolithic photo detectors or photo detectors according to another embodiment, wherein the sensor in illustrated embodiment of FIG. 17A is disposed in or on a SOI substrate, for example, a silicon-on-insulator, and in the illustrated the embodiment of FIG. 17B is disposed on a in or on a bulk substrate.

With reference to FIGS. 17A and 17B, a photo detector according to another embodiment includes at least one control node or gate (the exemplary cross-sectional view of the photo detector of FIGS. 17A and 17B illustrates two control nodes or gates—see, Gate 1 and Gate 2), a light absorbing region, a body region, and at least one doped impurity region (the exemplary embodiment of FIGS. 17A and 17B again illustrate two doped regions—see p+ regions) which is disposed in a positional relationship to one or more control nodes or gates. The photo detector also includes a contact region which, in operation, is an output of the photo detector. The photo detector in the exemplary embodiment of FIG. 17A is fabricated in or on a semiconductor on insulator (SOI) substrate (for example, a silicon or germanium region/layer/material disposed on or over an insulator region/layer/material (for example, a silicon oxide, silicon nitride and/or combination thereof). The photo detector in the exemplary embodiment of FIG. 17B may be fabricated on silicon, (for example, a standard bulk silicon), silicon-germanium, gallium-arsenide or an insulator (for example, glass or the like).

Briefly, in one embodiment, the control nodes or gates (hereinafter "gates") may be comprised of a conductive type material (conductor or doped semiconductor), for example, a metal (for example, aluminum or copper), metal compound and/or a doped semiconductor (for example, silicon doped with donor or acceptor impurities). The gates are spaced from the body region via an insulator or dielectric material (for example, silicon oxide, silicon nitride or combinations or composites thereof, for example, ONO).

The body region may be fabricated in or on the substrate. In one embodiment the body region is an intrinsic or doped semiconductor (for example, intrinsic/undoped silicon, germanium or silicon-carbide or a lightly doped (with donor or acceptor impurities) silicon, germanium or silicon-carbide). Indeed, the body region may be one or more materials from the Group IV semiconductor including silicon, germanium, silicon carbide and/or combinations thereof (for example, silicon-germanium). The body may be an intrinsic material or a material having impurities, for example, n-type or p-type material(s).

As noted above, the photo detector includes at least one doped region—see, p+ regions. The doped semiconductor regions may be disposed and/or formed in or on the substrate and juxtaposed the body region. For example, the p-type semiconductor material may be formed in the substrate by doping the semiconductor with a p-type impurity (for example, boron). Notably, the doped semiconductor regions (p+ regions) are also control nodes of the photo detector and, in operation, an output of the photo detector.

The light absorbing region, in one embodiment, is disposed and/or formed on the substrate and may be comprised of a material having a high electron mobility, for example, germanium, silicon-germanium or gallium arsenide. In this way, in operation, electrons which are displaced from certain orbitals, in response to impinging light or photons, may more readily or easily move within the light absorbing region.

Figure 17B:
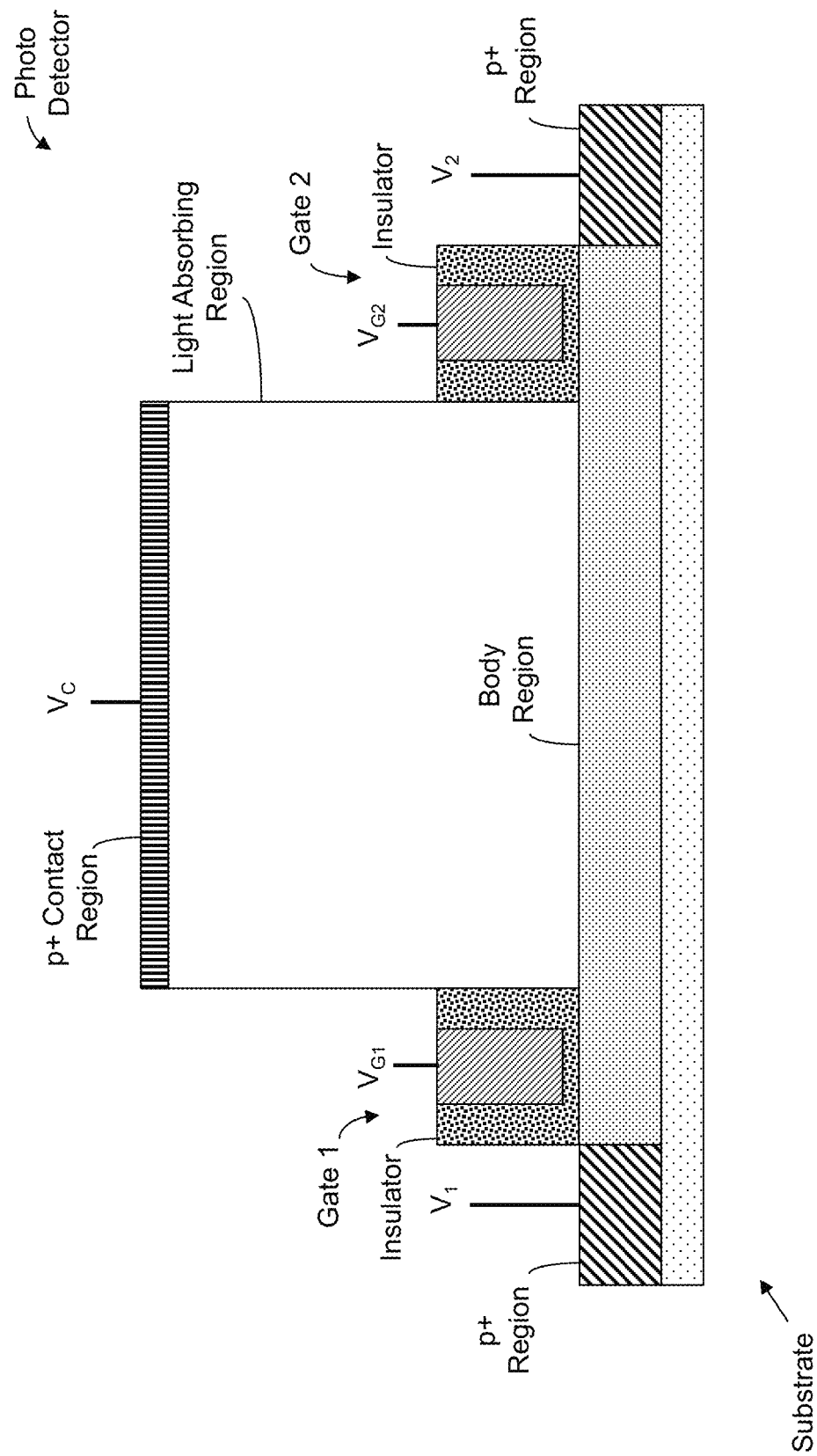

With continued reference to FIGS. 17A and 17B, the contact region is disposed and/or formed on or in the contact region and may be comprised of a conductive type material (conductor or semiconductor), for example, a metal (for example, aluminum or copper), metal compound and/or a doped semiconductor (for example, silicon, silicon-germanium or gallium arsenide doped with donor or acceptor impurities). In one embodiment, the contact region is an acceptor type material such as p-type semiconductor material formed from or by doping a semiconductor with a p-type impurity (for example, boron, germanium, silicon-germanium, silicon-carbide or gallium arsenide. Indeed, in one embodiment, the contact region is a p+ type material consisting of one or more materials from the Group IV semiconductor including silicon, germanium, silicon carbide and/or combinations thereof.

Importantly, the photo detector may be fabricated using any materials and/or techniques now known, described herein, and/or later developed.

Figure 17C:
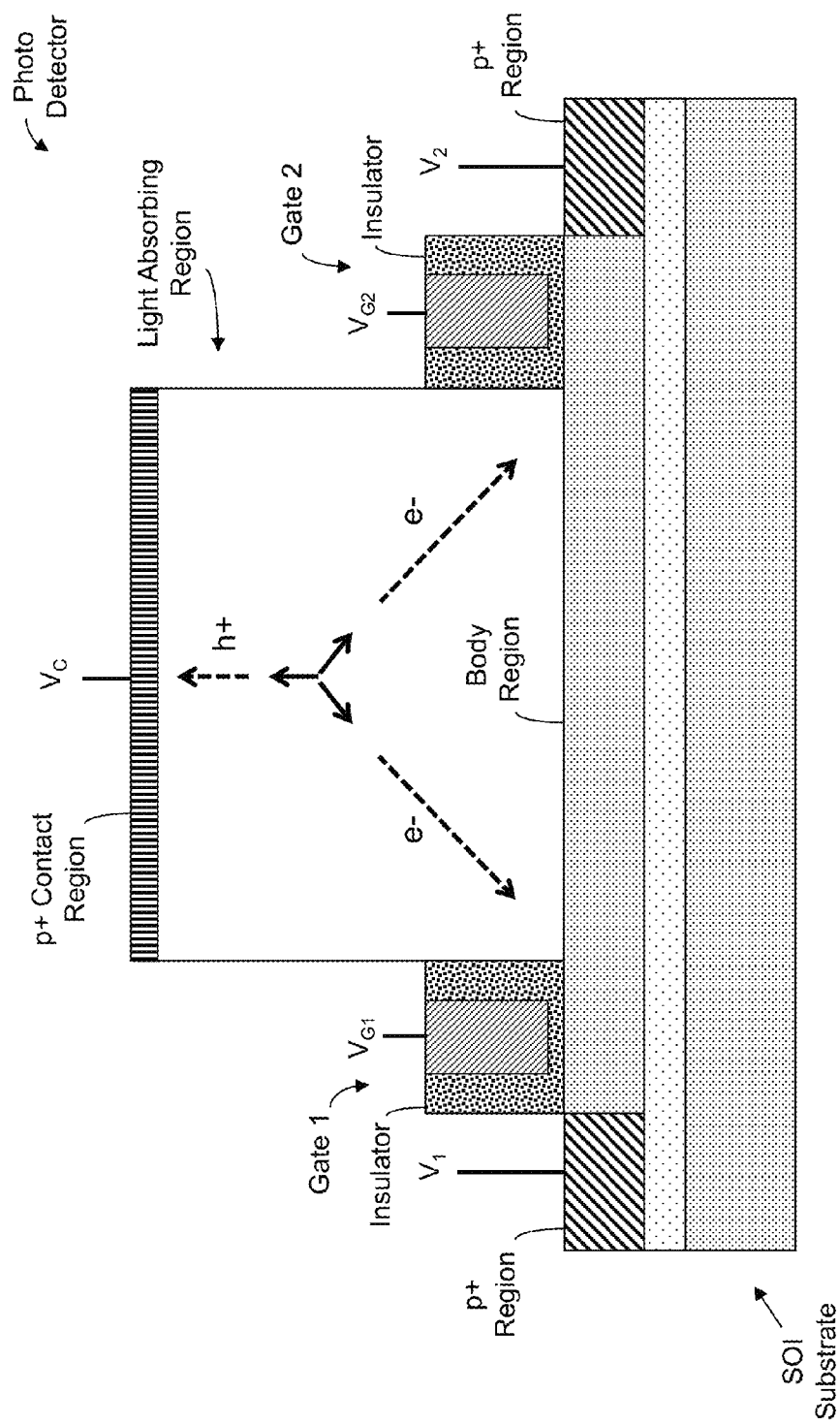
FIGS. 17C-17E are cross-sectional views of the general operation of the photo detectors of FIGS. 17A and 17B, in accordance with an embodiment, wherein applying selected or predetermined voltages to the gates, the doped regions (in this illustrated embodiment, p+ regions) and contact region (in this embodiment, a p+ contact region) of the photo detector facilitates detection of light incident on the sensor.

With reference to FIG. 17C, in operation, the photo detector detects incident light via application of selected or predetermined voltages to the gates, the doped regions (in this illustrated embodiment, p+ regions) and contact region (in this embodiment, a p+ contact region). In one embodiment, a positive voltage is applied to Gates 1 and 2 (for example, VG1=VG2=+2V), a positive voltage is applied to the p+ regions (for example, V1=V2=+1V), and a negative or ground voltage applied to the p+ contact region (for example, VC=0V). Under these conditions, an electric field forms and some positive carriers (i.e., holes) flow to the contact region and negative carriers (i.e., electrons) flow to the p+ region via the body region. The photo detector is essentially in a non-conductive state wherein a current between the contact region and the p+ regions is quite small.

Figure 17D:
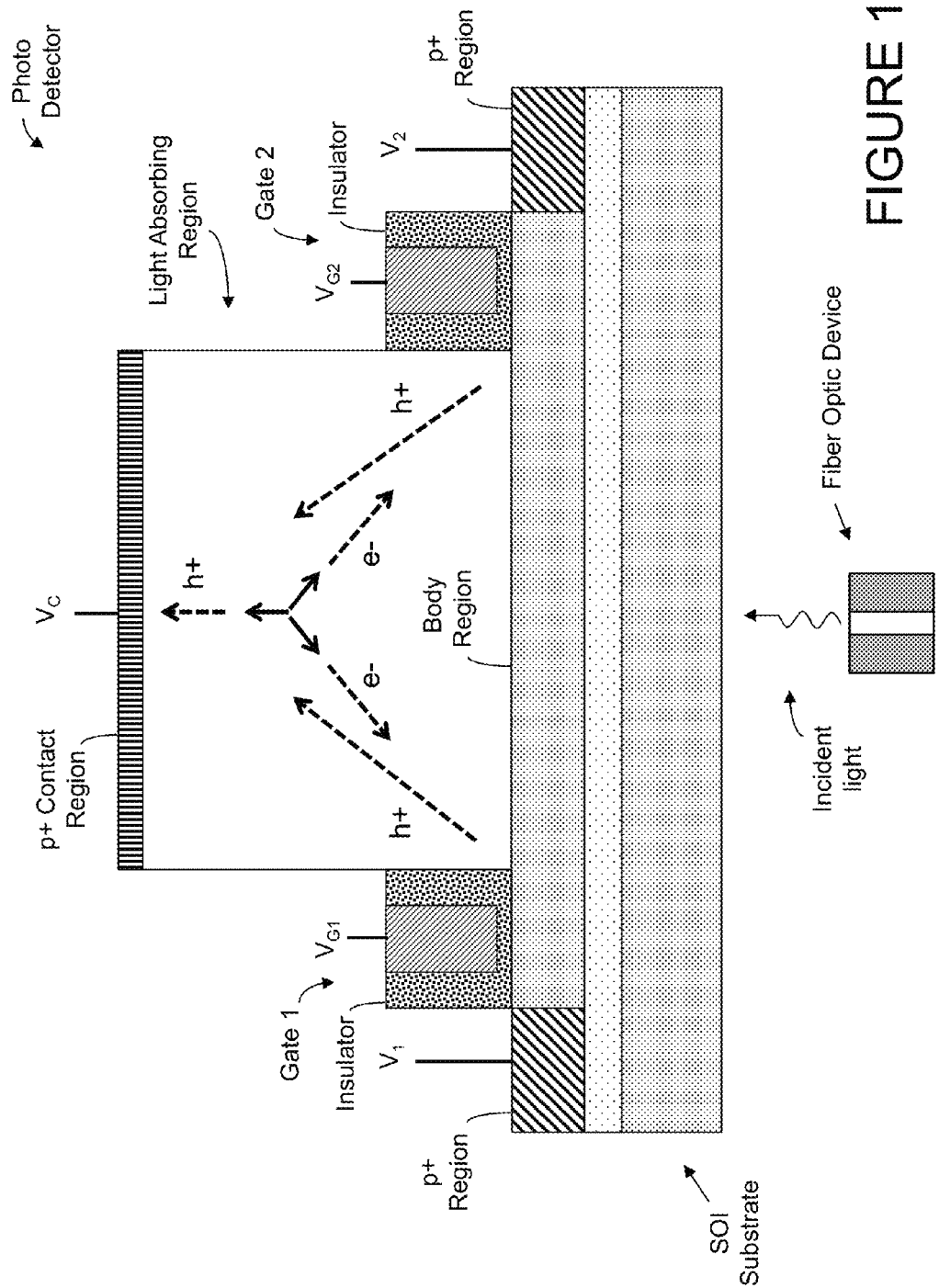
Figure 17E:
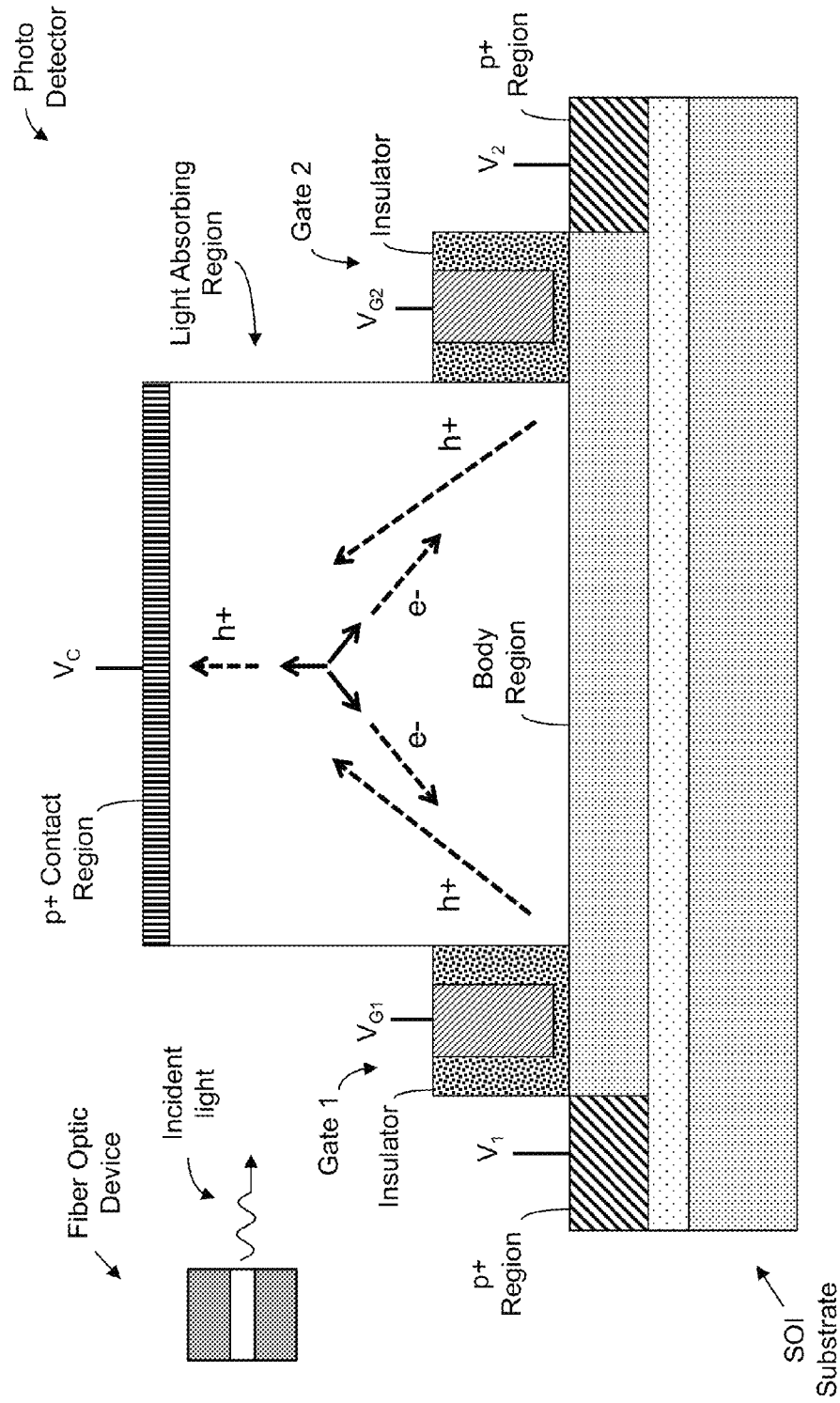

With reference to FIGS. 17D and 17E, in response to light incident on or applied to the light absorbing region of the photo detector (for example, light which is output from a fiber optic device), electron-hole pairs are generated in the light absorbing region (for example, germanium or silicon-germanium). The electron-hole pairs separate, in the presence of the electric field produced or provided by the voltages (for example, static or fixed voltages) applied to the gates, p+ regions and the p+ contact region. In this regard, holes are attracted to and flow to the p+ contact region and electrons are attracted to and flow to the body region and, in particular, to the body region near and/or beneath the gates (i.e., gate 1 and gate 2). That is, the electron-hole pairs are separated by an electric field and the holes flow to the p+ contact region and the electrons flow to portions of the body region near and/or beneath the gates. This induces or causes the potential barrier lowering for holes in the body region located near and/or beneath the gates as excess electrons accumulate in that region. Under these circumstances, an additional and/or greater hole current is created and flows from the p+ regions through a portion of the body region and the light absorbing region to the p+ contact region thereby increasing the magnitude of the output current.

Thus, negative carriers (i.e., electrons) accumulate beneath the gates and, in response thereto, positive carriers (i.e., holes) from the p+ regions juxtaposed the gates, flow to the contract region (here a p+ contact region). In this way, the photo detector is in a conductive state or mode, which provides a large internal current gain. The current flows between the p+ regions and the contact region and an output current upon detecting or in response to the incident light. Notably, in the absence of incident light, little to no current flows between the p+ regions and the contact region due to the barrier caused or provided by the voltages applied to the gates. Moreover, the photo detector may be disabled via removing/changing the voltages applied to one or more of Gates 1 and 2, contact region, p+ regions, and/or applying voltages of opposite polarity to one or more of one or more of Gates 1 and 2, contact region, p+ regions. For example, decreasing the voltages applied to the gates and/or p+ regions may place the photo detector in a non-conductive state.

The illustrated/exemplary voltage levels to implement or enable sensing by the photo detector are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the voltages applied to Gates 1 and 2, p+ regions and/or contact region become or are positive and negative.

Moreover, like that described in the previous embodiments, the detection time of the photo detectors may be programmable or tunable, for example, to meet or accommodate response time specifications as well as power consumption specification. In one embodiment, the voltages applied to the gates are adjusted to increase the response time of the photo detector (for example, by increasing the electric field). In another embodiment, the voltages applied to the gates are adjusted to reduce the power consumption of the photo detector. Thus, the response time and/or power consumption may be adjusted, for example, to accommodate desired/required specifications. All permutations response time and/or power consumption, and combinations of thereof, are intended to fall within the scope of the present inventions.

Figure 18:
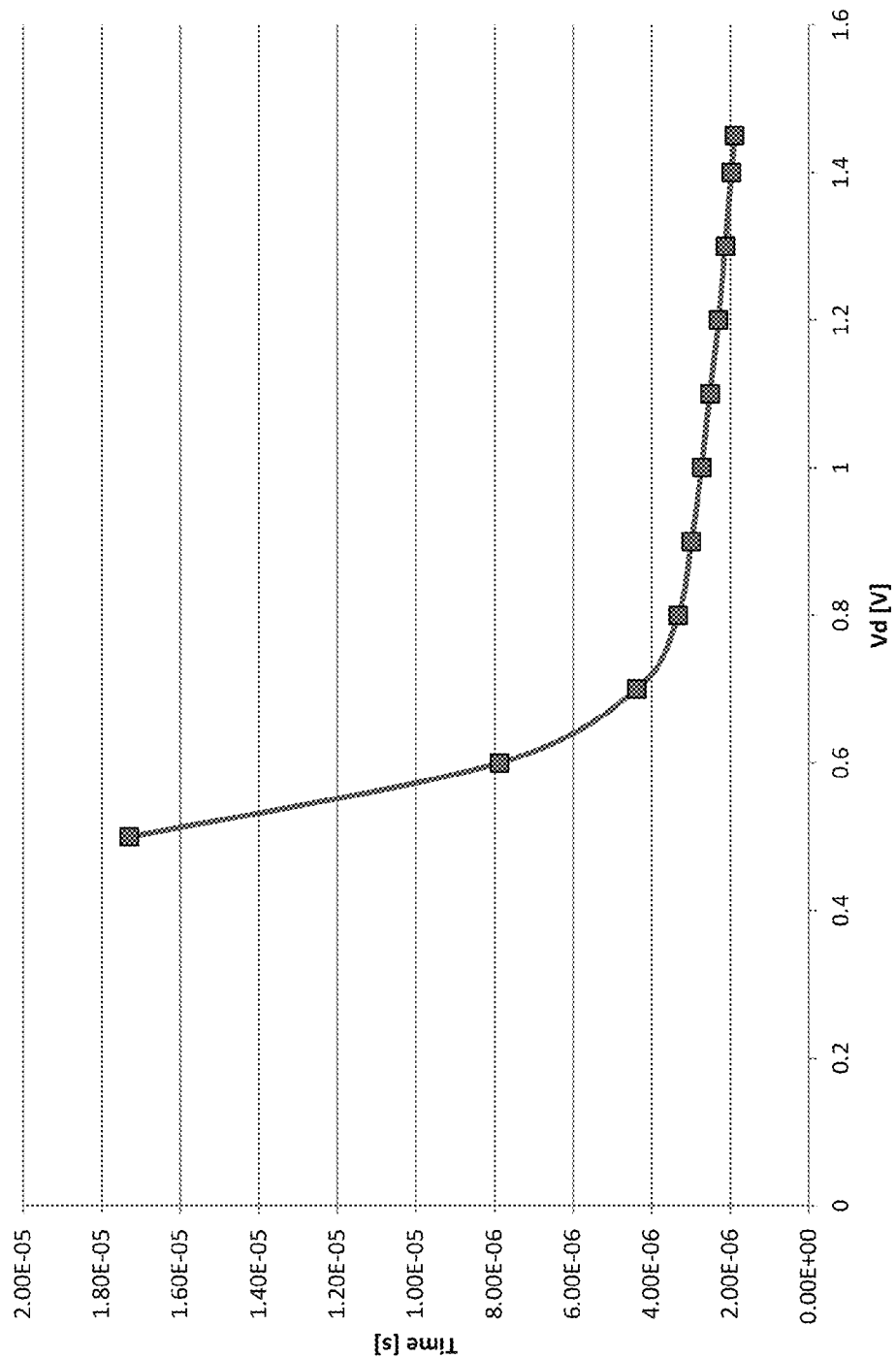
FIG. 18 shows an exemplary embodiment of the effect of increase of electric field applied to the n+ and p+ regions on the response time of the photo detector.

Furthermore, in one embodiment, the voltages applied to the n+ region and p+ region are adjusted to decrease the response time of the photo detector—for example, by increasing the electric field within the body region. Here, the electric field between the n+ region and p+ region and associated region is adjusted (for example, increased) to adjust the response time (for example, decrease) of the photo detector. In another embodiment, the voltages applied to the n+ region and p+ region are adjusted to reduce the power consumption of the photo detector. FIG. 18 shows an exemplary embodiment of the effect of increase of electric field applied to the n+ and p+ regions on the response time of the photo detector. Thus, the response time and/or power consumption may be controlled, adjusted and/or programmed to, for example, accommodate desired/required specifications of the photo detector. All permutations response time and/or power consumption, and combinations of thereof, are intended to fall within the scope of the present inventions.

In addition thereto, or in lieu thereof, in one embodiment, the photo detector is placed in a predetermined state before sensing the light (or data). For example, carriers may be removed from the body region prior to sensing so that the concentration of carriers in the body region (and near and/or beneath the gates) at the initiation of sensing is below a predetermined value. In one embodiment, the photo detector is placed in a predetermined state by applying predetermined voltages to the p+ regions and applying voltage pulses to the gates to remove carriers from the body region thereby providing depletion regions under gates Gate 1 and Gate 2. Establishing the photo detector in a predetermined state (for example, periodically) before sensing may increase or enhance the stability, response time and/or accuracy of the photo detector during sensing/operation.

Figure 19A:
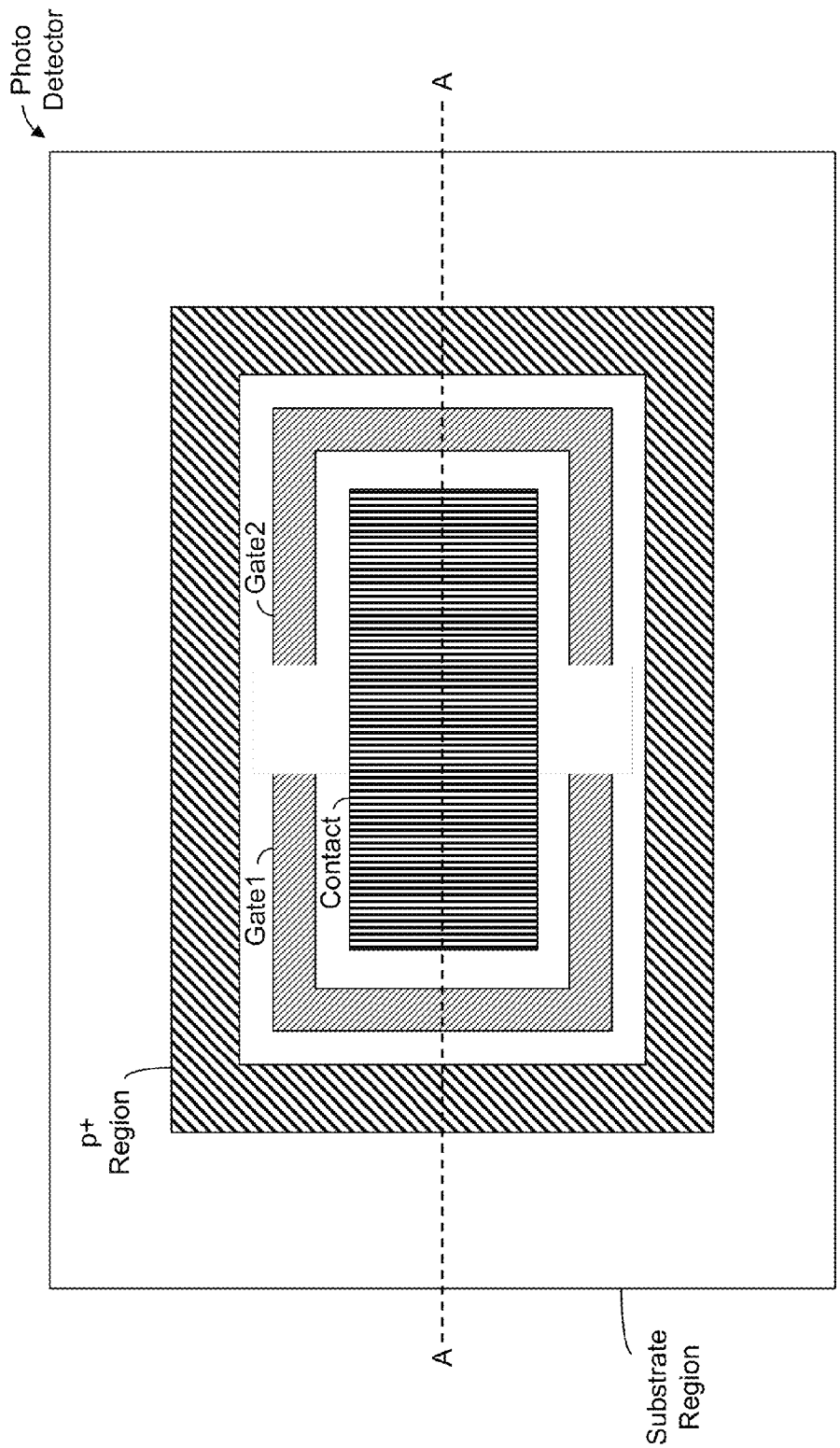
FIGS. 19A-19C illustrate exemplary top views of the cross-sectional views of the sensors of FIGS. 17A-17C wherein dotted lines A-A indicate the location of the cross-sectional views of FIGS. 17A-17C; notably, with respect to FIG. 19C, gates 1 and 2 are interconnected as a unitary structure which is identified or designated "Gate."
Figure 19B:
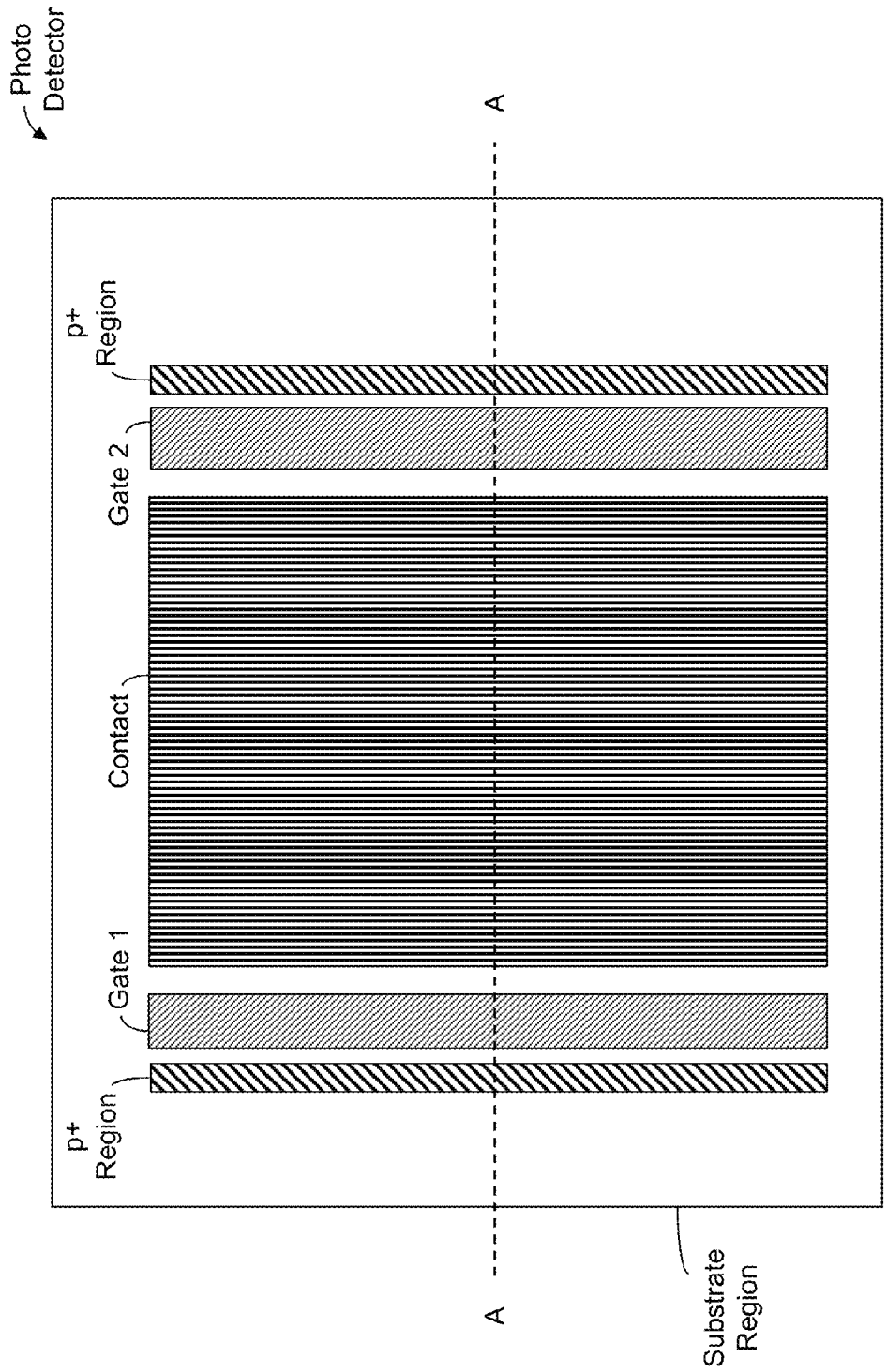
Figure 19C:
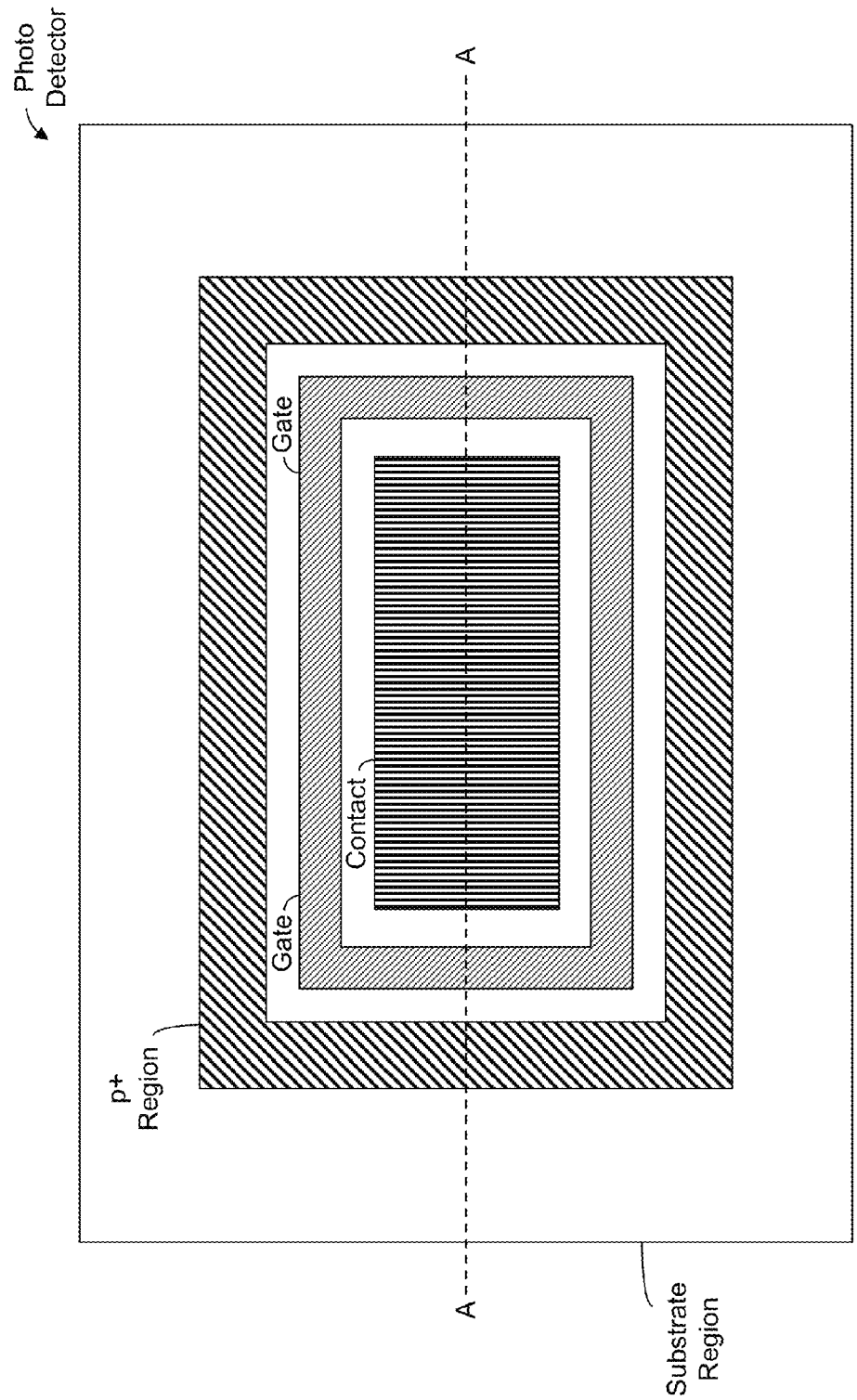

Notably, FIGS. 19A-19C illustrate exemplary top views of the cross-sectional views of the photo detectors of FIGS. 17A-17C wherein dotted lines A-A indicate the location of the cross-sectional views of FIGS. 17A-17C. With respect to FIG. 19C, the gates 1 and 2 are interconnected as one structure.

Figure 20A:
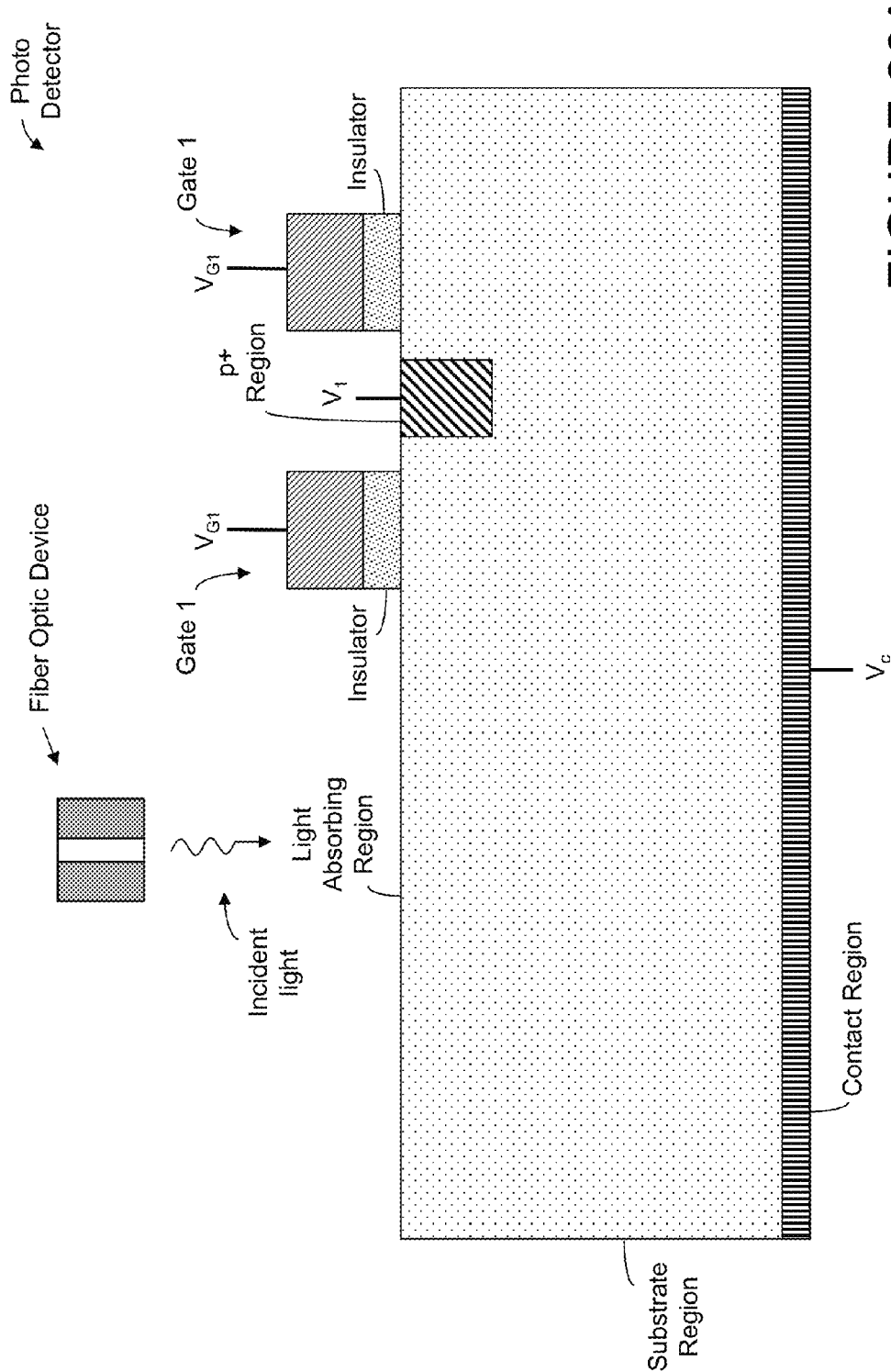
FIG. 20A is a cross-sectional view of a monolithic light sensor or photo detector according to another sensor or detector, wherein the contact region of this illustrative photo detector is disposed on a backside of the bulk substrate wafer/die.

With reference to FIG. 20A, in another embodiment, the photo detector includes a contact region disposed on a backside surface of the substrate region (for example, the major surface which is opposing the major surface upon which the p+ region and gates are disposed). In this embodiment, the primary light absorbing region is a portion of the substrate region which, in an exemplary embodiment, may be silicon (for example, a low doped p-type silicon substrate), silicon-germanium or gallium-arsenide or combinations thereof (for example, both germanium and gallium-arsenide). Here, the light absorbing region is a material which facilitates generation of carriers in response to incident light. The light absorbing region may be a doped or undoped material (for example, a highly doped semiconductor material (for example, highly doped silicon) which is more responsive to photons than a similar undoped or a lightly doped semiconductor material).

In this embodiment, in response to incident light, electrons and holes are created in the light absorbing region and are separated in the presence of an electric field produced or provided by the voltages (for example, static or fixed voltages) applied to the p+ region (for example, V1=+3V), gates (for example, greater than VG1=+4V) and the contact region (a negative or ground voltage, VC=0V) wherein, in this exemplary embodiment, the contact region is a p+ type contact region. Under these circumstances, the holes flow to the p+ contact region and electrons flow to the body region and, in particular, to the body region near and/or beneath the gates (i.e., Gate 1). Like that described above, as excess electrons accumulate in the body region located near and/or beneath the gates, the electron barrier (band gap) is lowered therein. This results in an additional and/or greater hole current flow from the p+ regions through a portion of the substrate region to the contact region. The operation of the photo detector of FIG. 20A is substantially the same as described above with respect to the photo detector of FIGS. 17A and 17B. For the sake of brevity, that discussion will not be repeated.

Figure 20B:
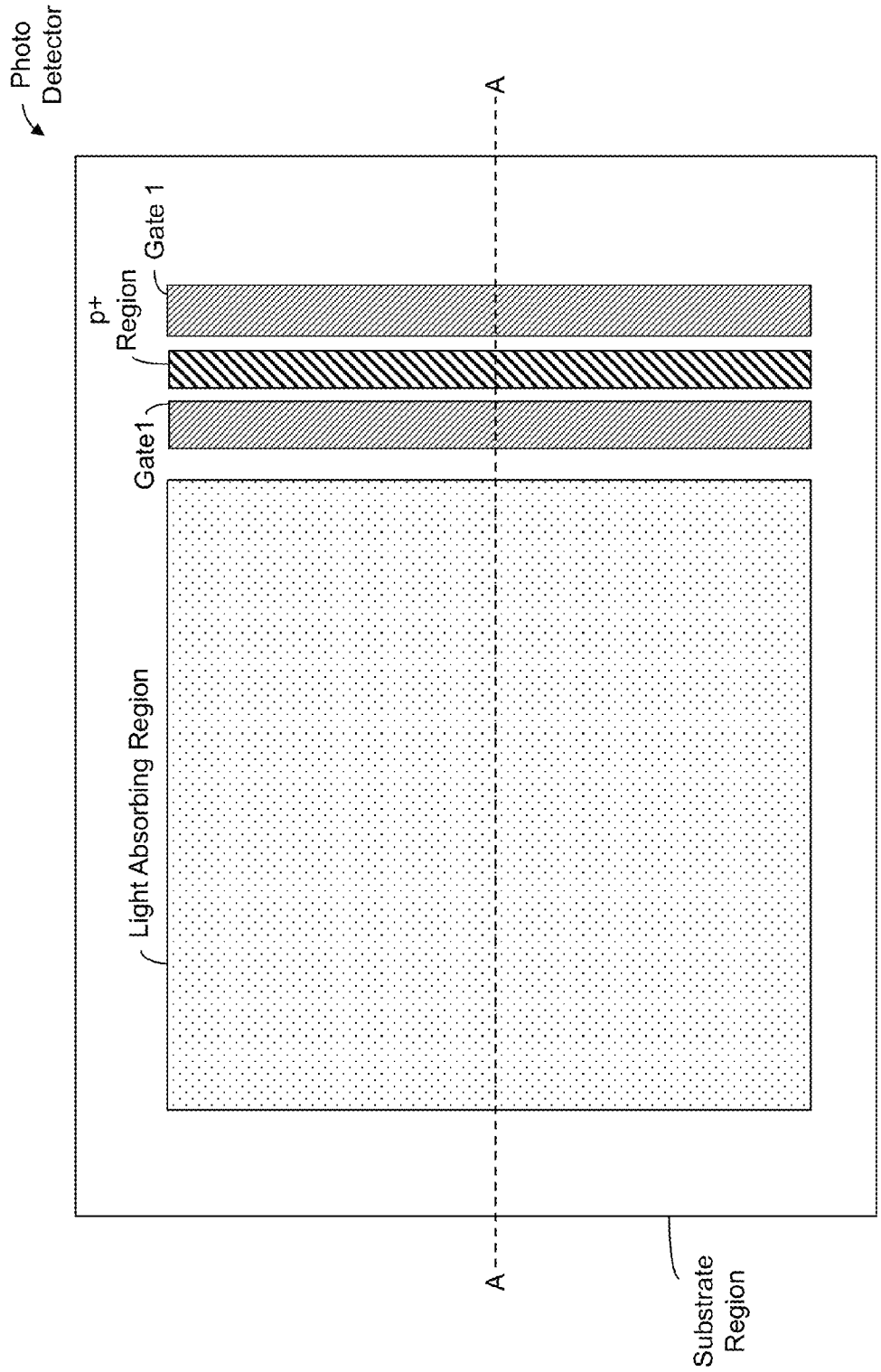
FIGS. 20B and 20C illustrate exemplary top views of the cross-sectional view of the sensor/detector of FIG. 20A wherein dotted lines A-A indicate the location of the cross-sectional view of FIG. 20A.
Figure 20C:
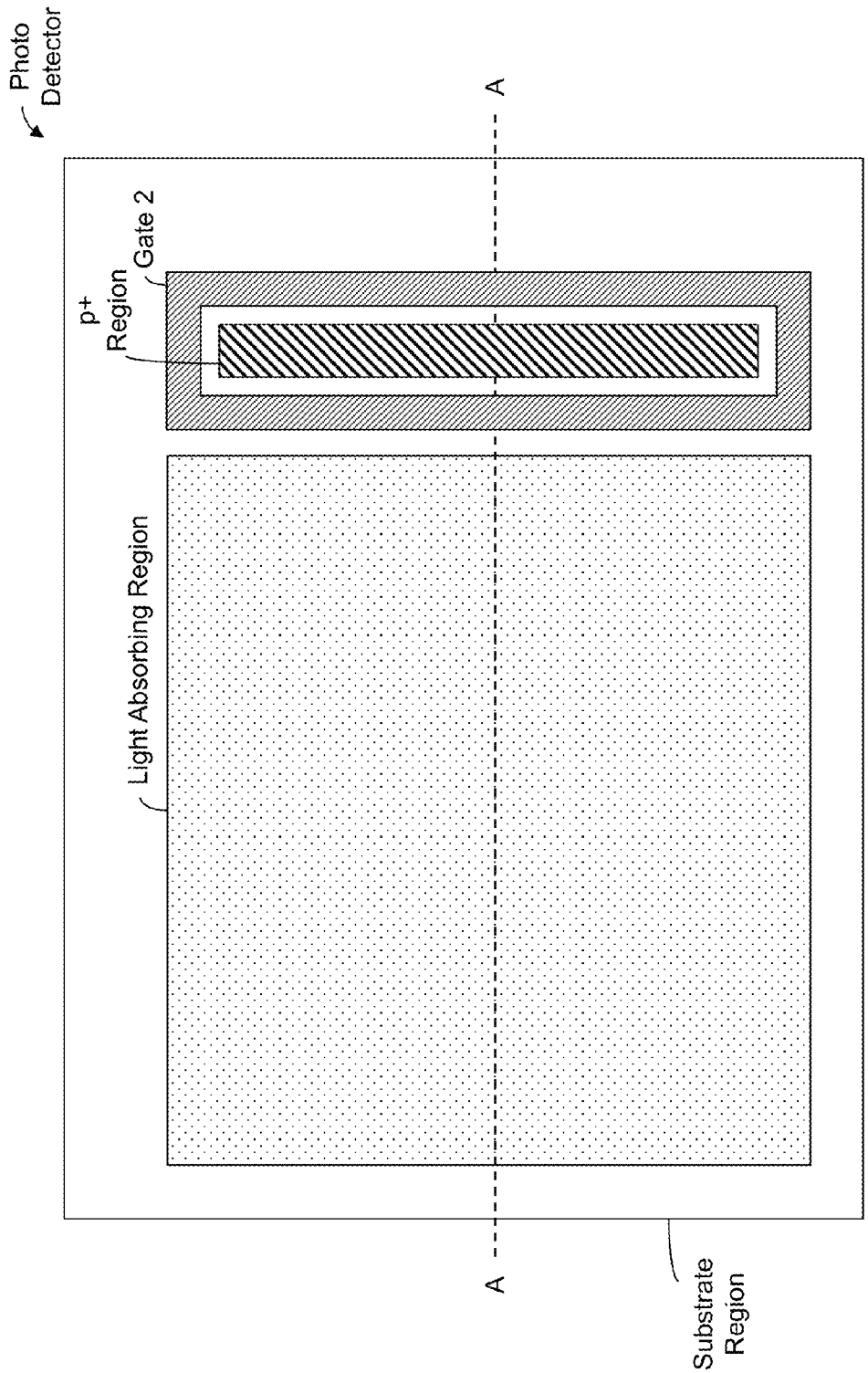

Notably, the materials and configuration of the gates and the doped region (p+ region) may be the same as that described in connection with the embodiment of FIGS. 17A and 17B. Moreover, FIGS. 20B and 20C illustrate exemplary top views of the cross-sectional views of the photo detectors of FIG. 20A wherein dotted lines A-A indicate the location of the cross-sectional views of FIG. 20A.

In one embodiment, the exemplary photo detector of FIG. 20A may include two or more p+ region, each p+ region having associated gates. For example, with reference to FIG. 21A, in yet another embodiment, the photo detector includes at least two doped regions (p+ regions) each having a positional relationship to associated gates or control nodes—namely, gate 1 and gate 2, respectively. The materials and configuration of the gates and the doped region (p+ region) may be the same as that described in connection with the embodiment of FIGS. 17A, 17B and 20A. For the sake of brevity, that discussion will not be repeated.

Moreover, the operation of the photo detector of FIG. 21A is substantially the same as described above with respect to the photo detector of FIG. 20A. That is, in response to incident light, electrons and holes are created in the light absorbing region and are separated in the presence of an electric field produced or provided by the voltages (for example, static or fixed voltages) applied to the p+ region (for example, +3V), gates (for example, greater than +4V) and the contact region (a negative or ground voltage). As excess electrons accumulate in the substrate region located near and/or beneath the gates, the potential barrier for holes lowers in that region thereby providing for a hole current which flows from the p+ regions to the contact region. Notably, in this exemplary embodiment, the contact region is again a p+ type contact region.

Figure 21B:
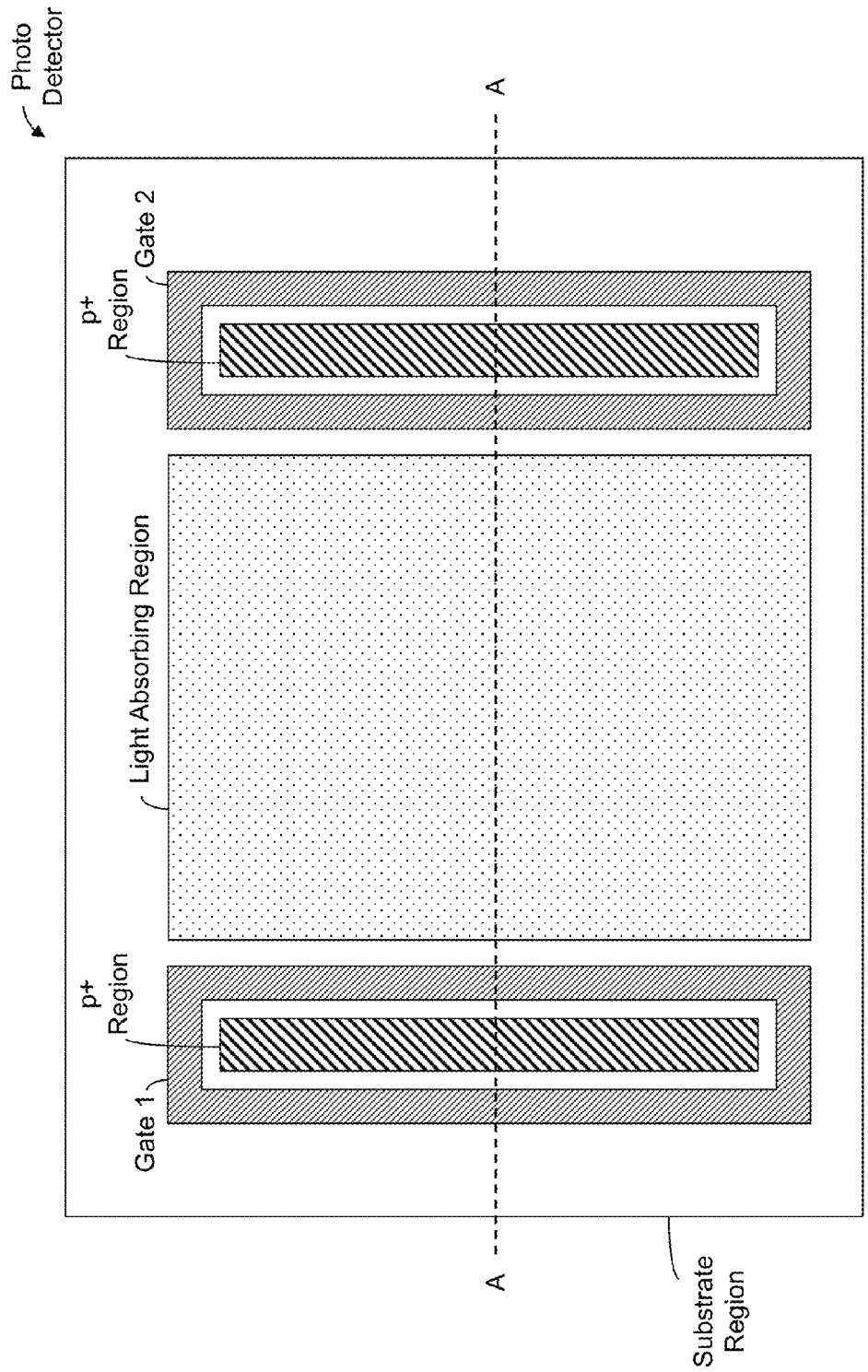
FIGS. 21B-21D illustrate exemplary top views of the cross-sectional view of the photo detector of FIG. 21A wherein dotted lines A-A indicate the location of the cross-sectional view of FIG. 21A; notably, with respect to FIG. 21D, gates 1 and 2 are interconnected as a unitary structure which is identified or designated "Gate."
Figure 21C:
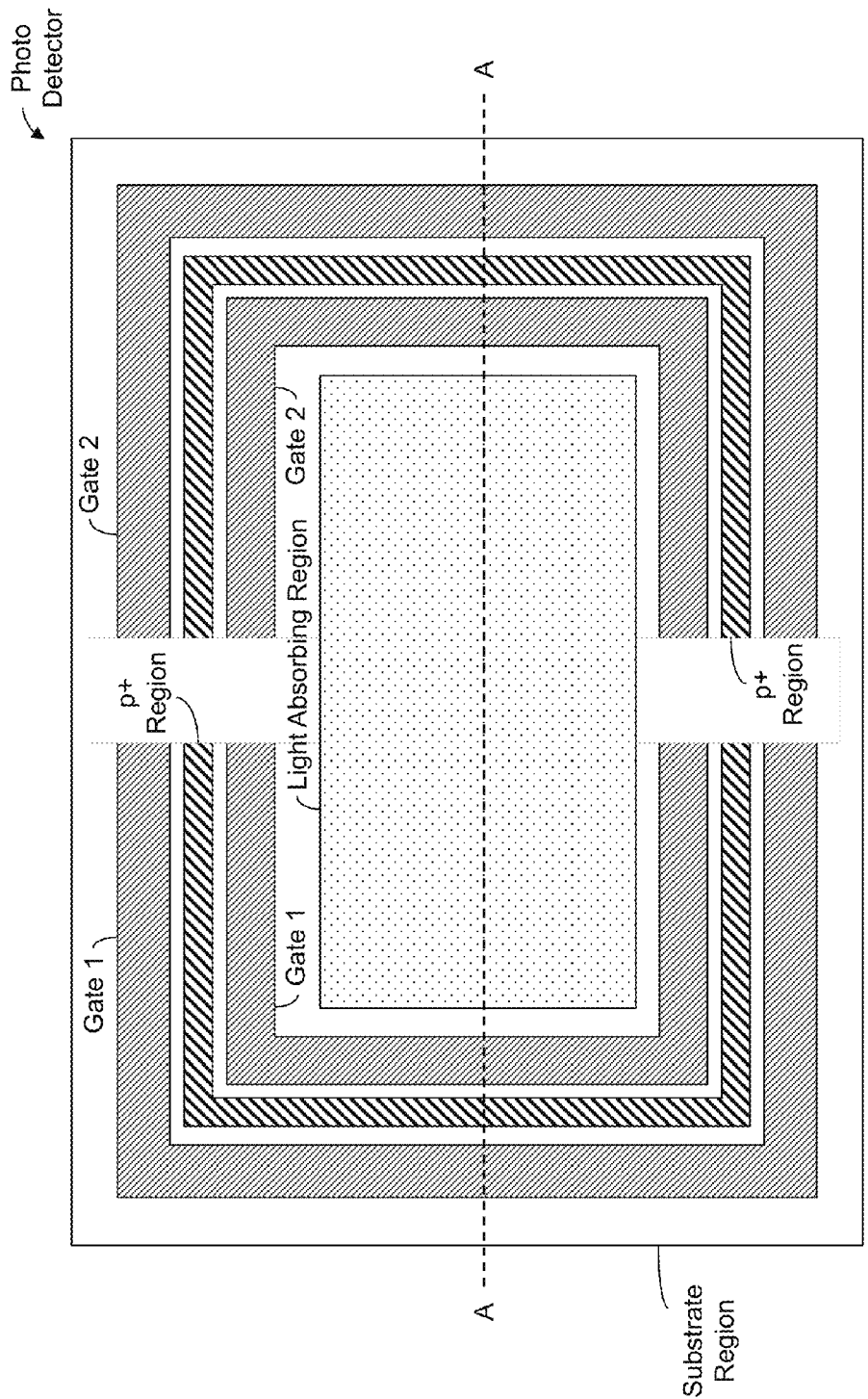
Figure 21D:
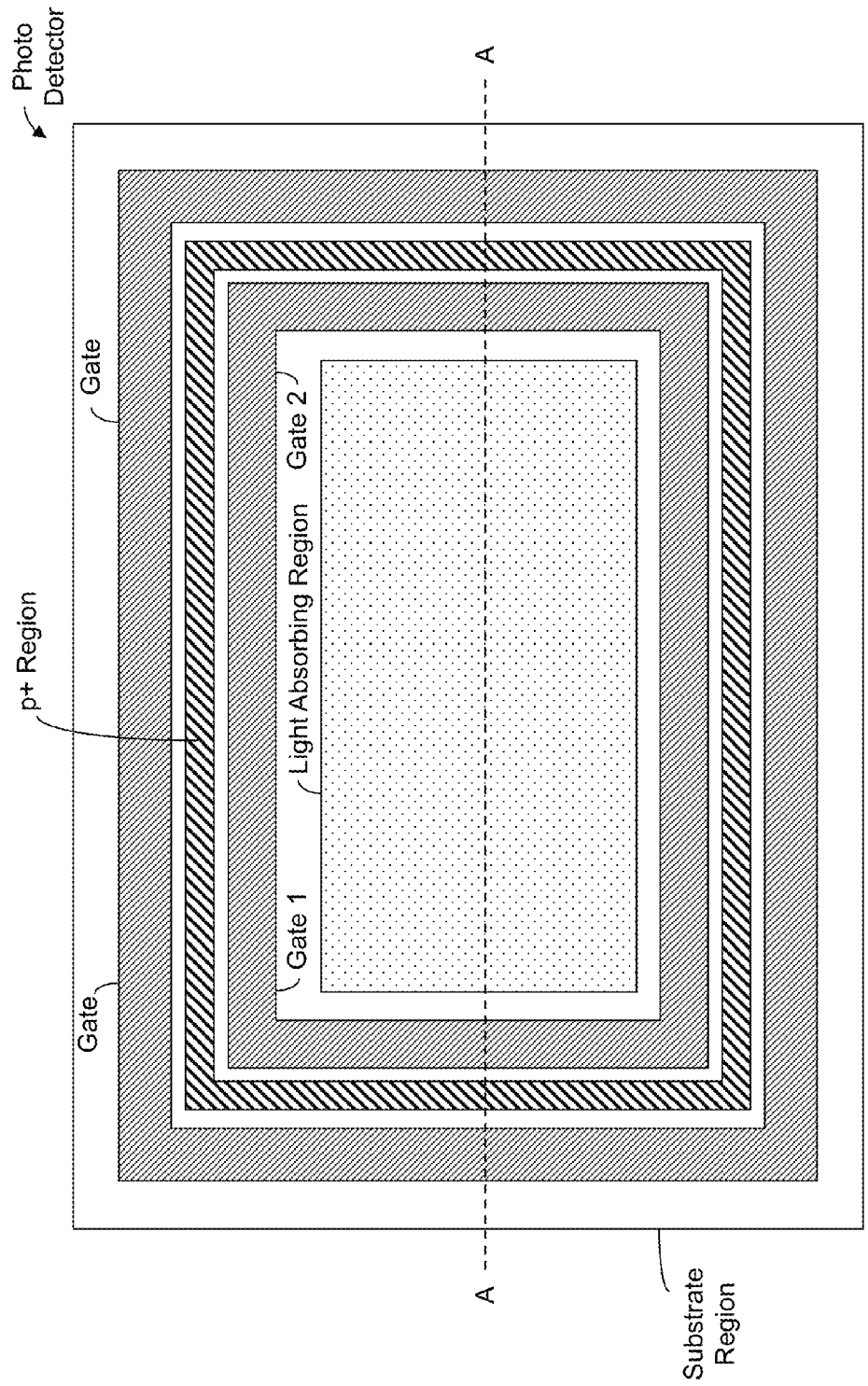

FIGS. 21B and 21C illustrate exemplary top views of the cross-sectional views of the photo detectors of FIG. 21A wherein dotted lines A-A in FIGS. 21B and 21C indicate the location of the cross-sectional views of FIG. 21A. With respect to FIG. 21D, gates 1 and 2 may be interconnected as one structure.

Notably, the exemplary photo detector illustrated in FIG. 21A, relative to the photo detector illustrated in FIG. 20A, may generate a larger current in response to incident light. That is, the plurality of p+ regions (having associated gates juxtaposed thereto) may in combination generate a larger current in response to incident light. Moreover, the photo detector embodiment of FIG. 21A may be employed as a "building block" of an array of photo detectors of a photo detector device wherein the gates are electrically connected and the outputs are connected in parallel. Indeed, all of the embodiments herein may be employed as "building blocks" of an array of photo detectors of a photo detector device. In the embodiment of FIG. 21A, it is preferable that substrate is low doped and an electric field exists in the region between the contact region and the p+ regions.

Figure 22A:
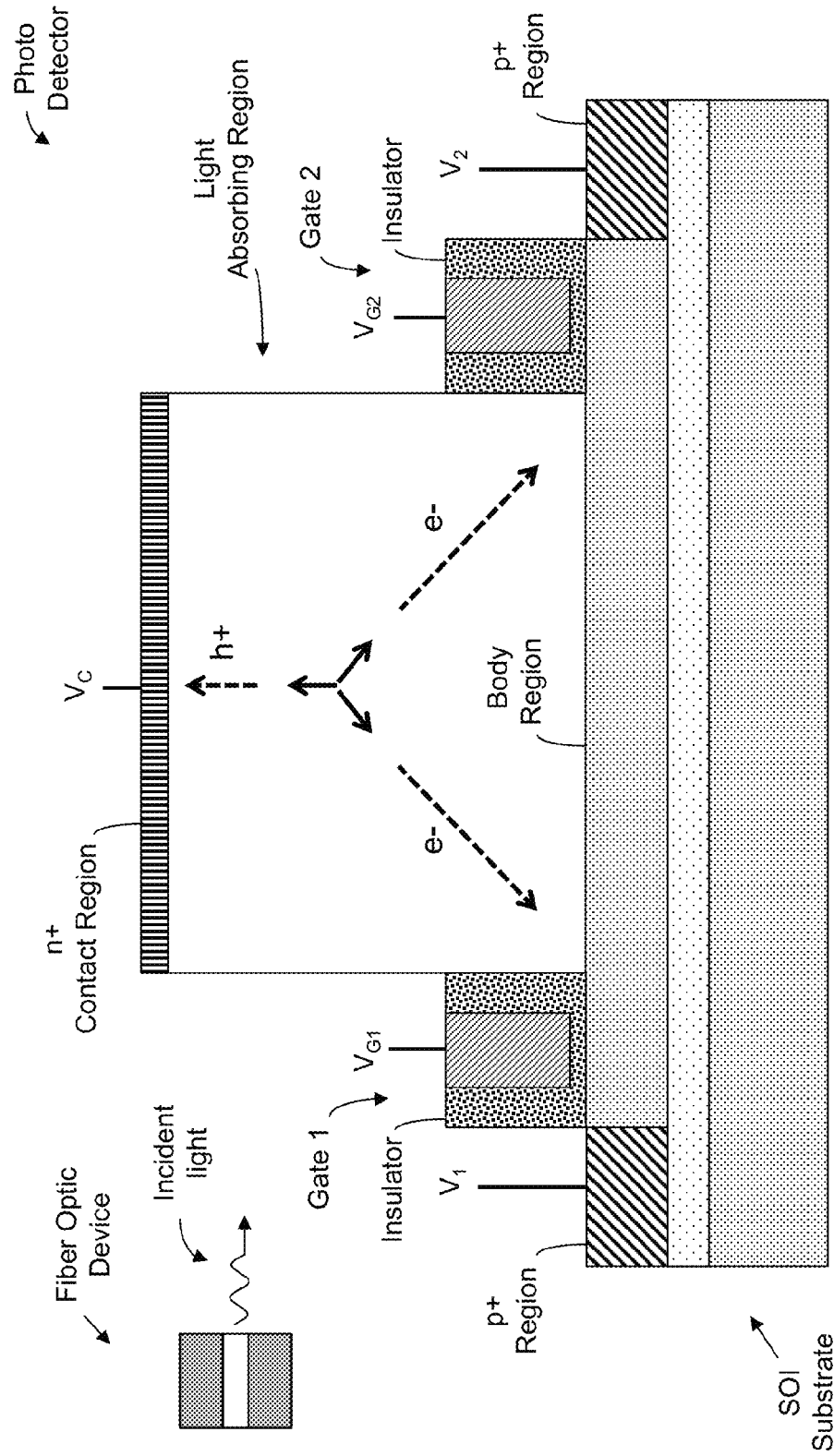
FIGS. 22A and 22B are cross-sectional views of monolithic light sensors or photo detectors according to another embodiment of the photo detectors of illustrated in FIGS. 17A and 17B, respectively, wherein in this embodiment the contact regions are n+ type material; notably, where the contact region of the embodiment of FIG. 22A or 22B is an n+ type contact region, the sensor may be characterized as an n+pnp+ type structure and the materials, processing, architecture and layout of the sensor may be the same as those of the embodiment of FIGS. 17A and 17B except for the n+ contact region.
Figure 22B:
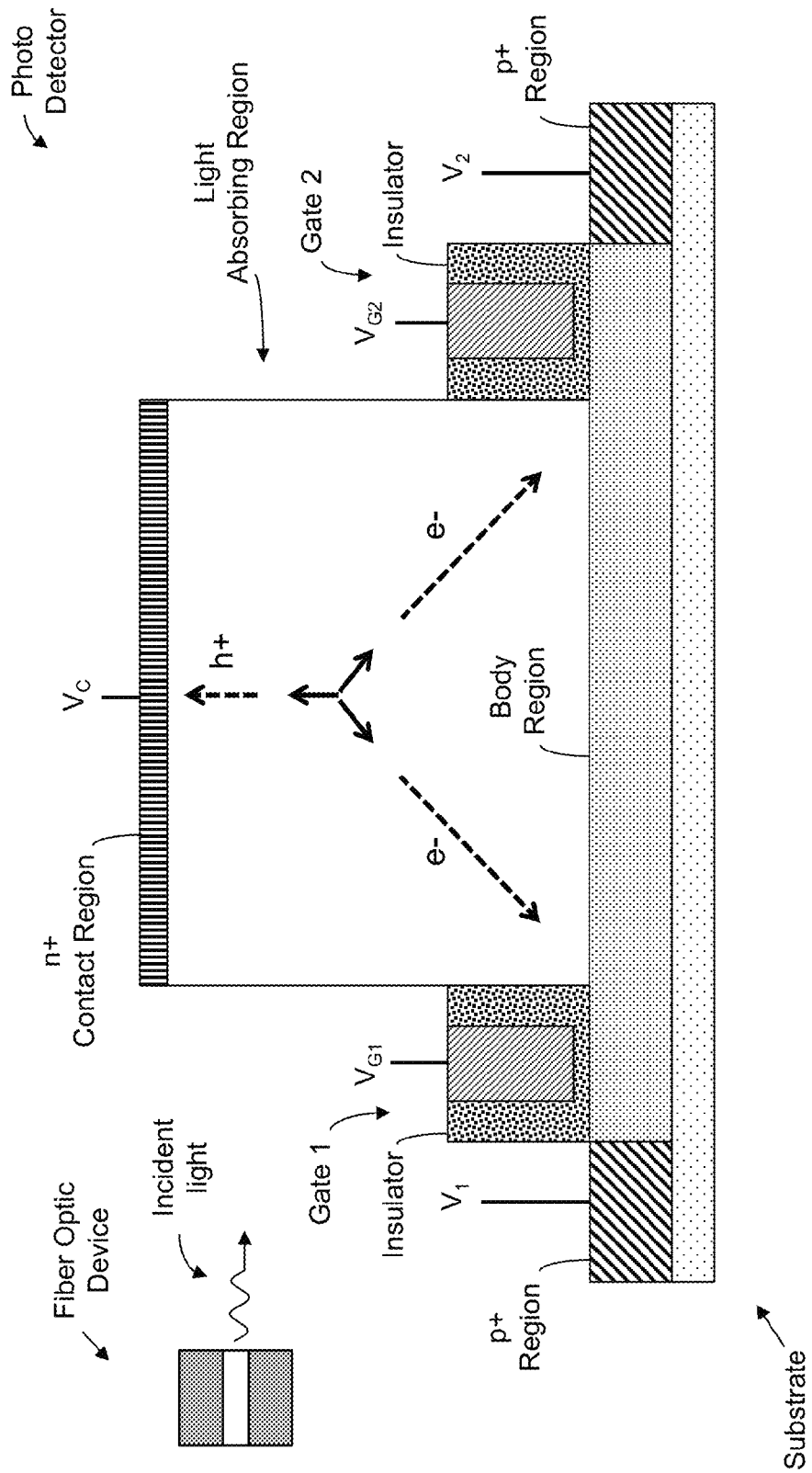
Figure 22C:
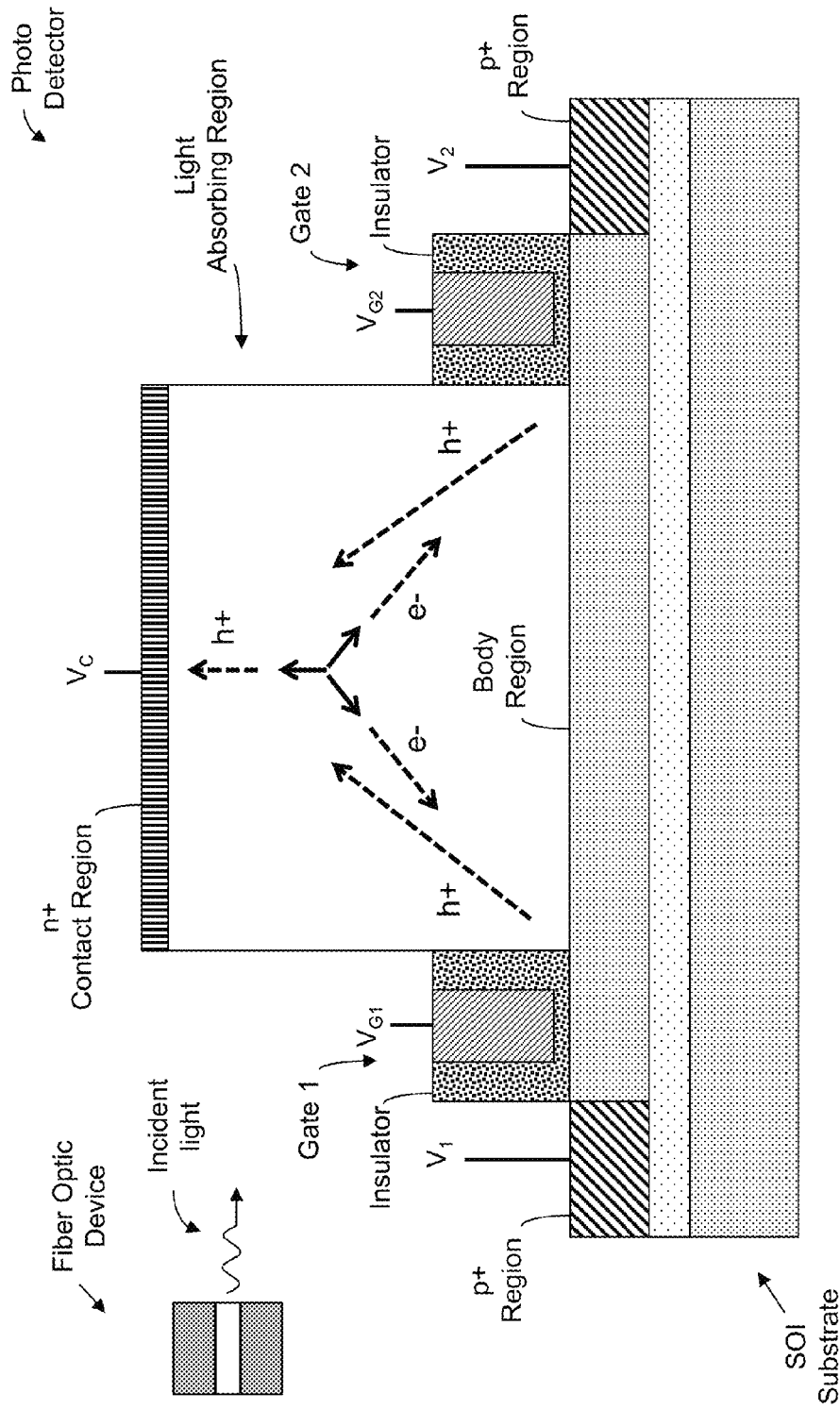
FIGS. 22C and 22D are cross-sectional views of the general operation of the sensors or detectors of FIGS. 22A and 22B in accordance with an embodiment, wherein the sensor detects incident light via application of selected or predetermined voltages to the gates, the doped regions (in this illustrated embodiment, p+ regions) and contact region (in this embodiment, a p+ contact region).
Figure 22D:
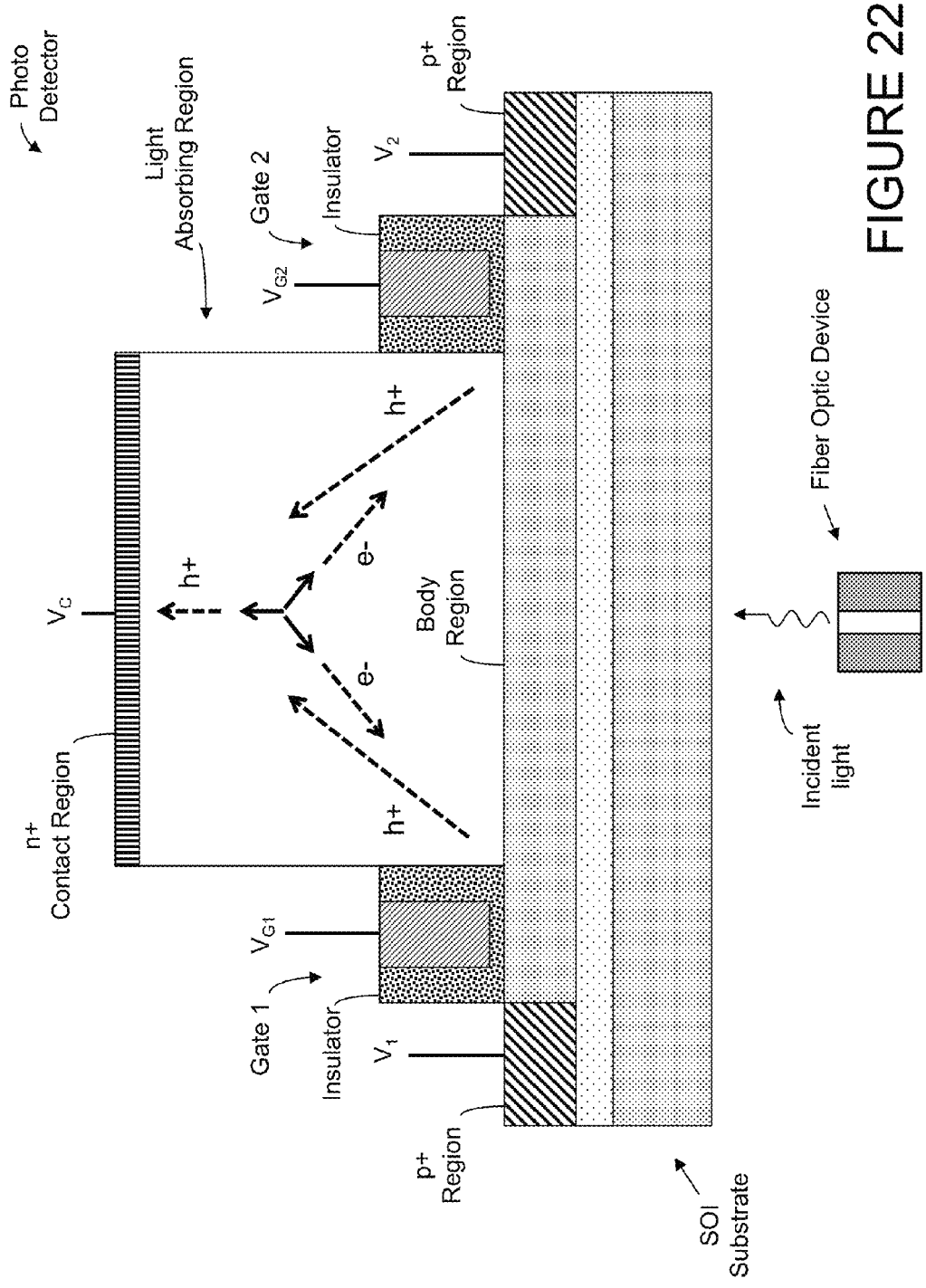

Although the contact regions of the aforementioned embodiments have often been described as a p+ region, in another embodiment, the contact region may be an n+ type. For example, with reference to FIGS. 22A and 22B, where the contact region of the embodiment of FIG. 22A or 22B is an n+ type contact region, the photo detector may be characterized as an n+pnp+ type structure. Here, the materials, architecture and layout of the photo detector may be the same except for the n+ contact region. Accordingly, the discussion above in connection with FIGS. 17A and 17B (for example, the materials) are applicable to this embodiment and, for the sake of brevity will not be repeated.

With reference to FIGS. 22A-22D, in operation, in response to an incident light, electrons and holes are created in the light absorbing region and thereafter are separated where electrons move into the body region (due to the electric field formed by the voltages applied to the gates, n+ contact region, gates and p+ regions), and holes move to the n+ contact region. In one embodiment, the electric field is provided via a positive voltage applied to Gates 1 and 2 (for example, VG1=VG2=+2V), a positive voltage is applied to the p+ regions (for example, V1=V2=+1V), and a negative or ground voltage applied to the contact region (in this exemplary embodiment a n+ contact region, VC=0V).

Thus, the electron-hole pairs are separated by an electric field and the holes flow to the n+ contact region and the electrons flow to portions of the body region near and/or beneath the gates. As excess electrons accumulate in the body region located near and/or beneath the gates, the potential barrier for holes lowers in the body region located near and/or beneath the gates providing for an additional and/or greater hole current to flow from the p+ regions to the contact region thereby increasing the magnitude of the output current.

Thus, the photo detectors of FIGS. 22A-22D, in a conductive state or mode, provides a large internal current gain due to a positive feedback mechanism of accumulation of excess negative carriers under the gates, which, in turn, reduces the band gaps corresponding to such regions. The current flows between the p+ regions and the n+ contact region and an output current upon detecting or in response to the incident light.

In each of the embodiment described herein, the detection time or triggering time of the exemplary photo detectors may be programmable or tunable, for example, to meet or accommodate response time specifications as well as power consumption specification. In one embodiment, the voltages applied to the gates are adjusted to increase the response time of the photo detector (for example, by increasing the electric field). In another embodiment, the voltages applied to the gates are decreased to reduce the power consumption of the photo detector. All permutations and combinations thereof are intended to fall within the scope of the present inventions.

Notably, the photo detectors may be implemented in a discrete device (for example, discrete photon receiver element) as well as in conjunction with any type of integrated circuitry (for example, integrated CMOS photon receiver circuitry), whether now known or later developed; all such configurations are intended to fall within the scope of the present inventions. Further, any manufacturing technique, whether now known or later developed, may be employed to fabricate the photo detector and/or photo detector-integrated circuit device of the present inventions; all such techniques are intended to fall within the scope of the present inventions.

Figure 23A:
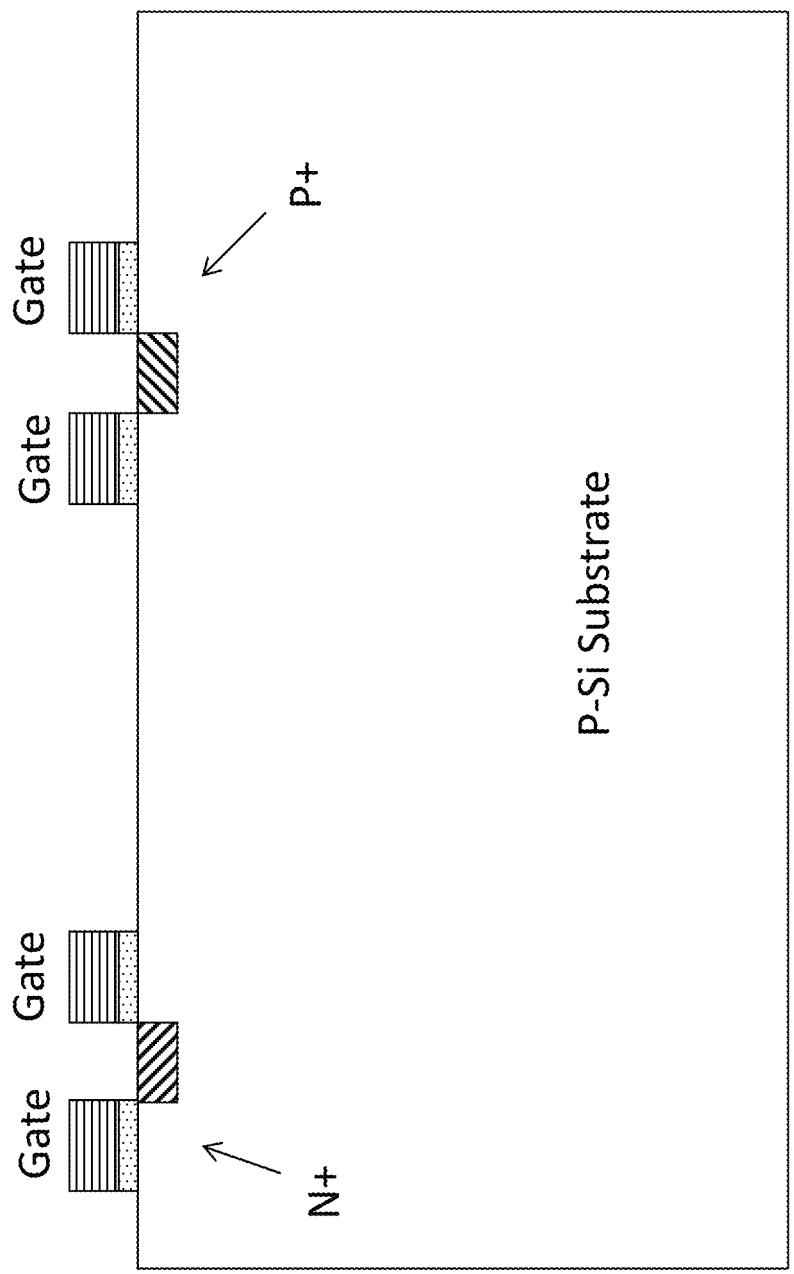
FIGS. 23A and 23F are cross-sectional views of light sensors or photo detectors in accordance with an embodiment.
Figure 23B:
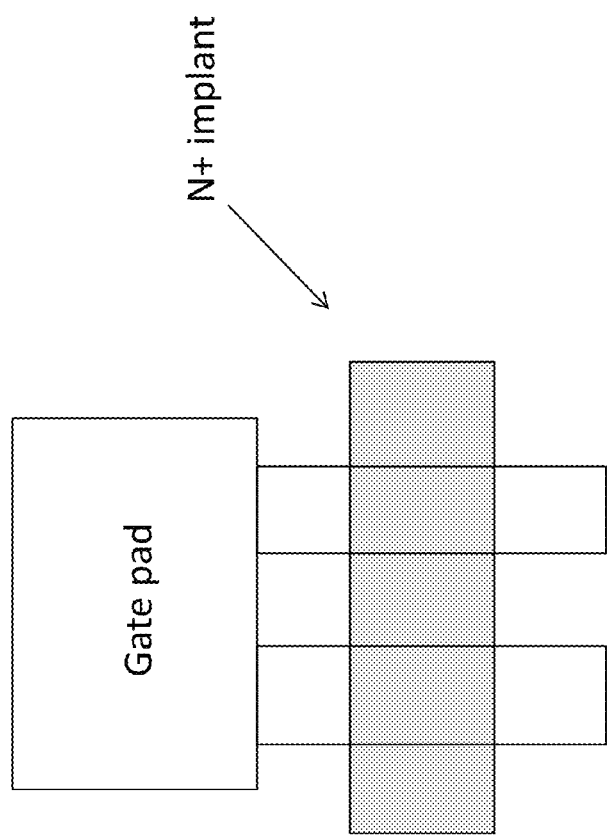
Figure 23D:
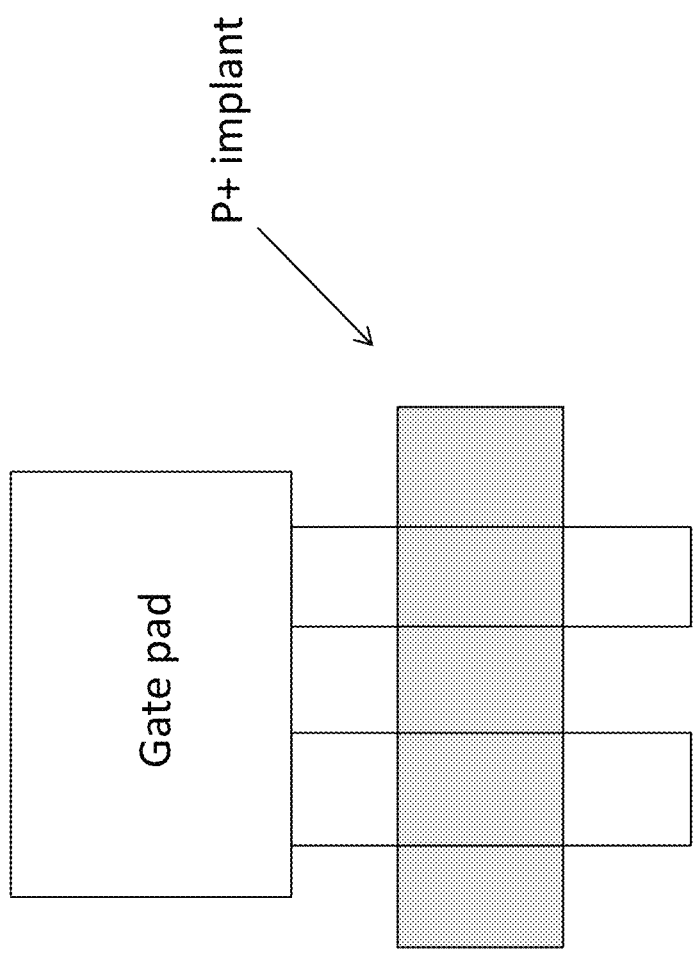
Figure 23E:
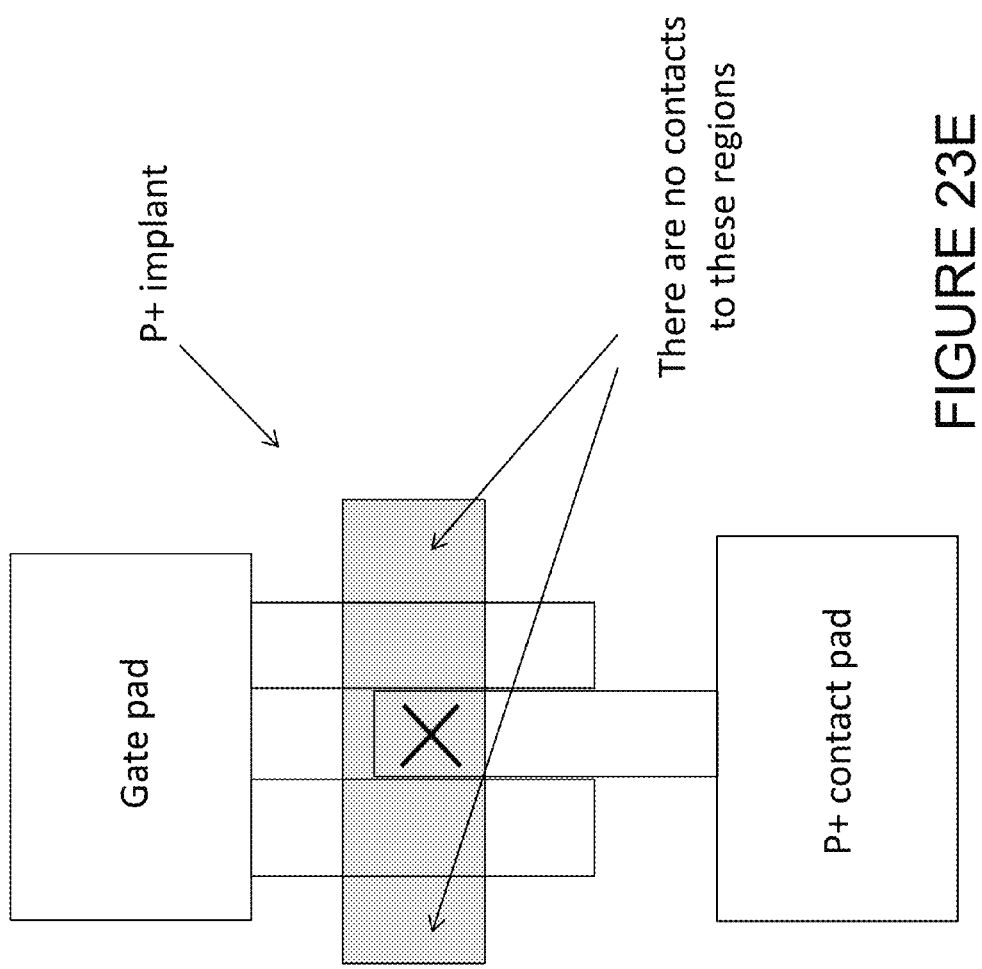
Figure 23F:

For example, the photo detectors may be fabricated via a CMOS process. (See, for example, FIGS. 23A-23F). For example, where the photo detector includes n+ regions and p+ region (see, for example, the illustrative embodiments of FIGS. 12A, 15A, 16A and 16B), the p+ regions, gates and contact regions may be fabricated during or in relation to the CMOS process of fabricating the PMOS and NMOS transistors. In particular, in one embodiment, after forming the gates, an n+ implant may be performed (see FIG. 23B), and thereafter a contact to a portion of the n+ region may be formed (see FIG. 23C). The p+ regions may be formed in a similar manner (see FIGS. 23D and 23E). FIG. 23F illustrates a cross-section of the resulting or "final" structure. Notably, where the photo detector does not include n+ regions as in several of the exemplary embodiments set forth herein, the n+ processing in connection with the photo detector may be omitted.

The n+ and p+ implantations of the photo detector may be performed during formation of the CMOS transistors. Alternatively, the n+ and p+ implantations of the photo detector may be performed before or after formation of the CMOS transistors. Moreover, the light absorbing regions and contact regions of the photo detectors of FIGS. 12A, 15A, 16A, 16B, 17A and 22A may be fabricated after such CMOS process without impact to the CMOS circuitry.

In another aspect, the photo detectors may be configured and/or disposed as an array according to any of the embodiments described and/or illustrated herein. The array may include, in addition to the array of photo detectors, control circuitry to manage the acquisition, capture and/or sensing operations of the photo detectors of the array. (See, for example, FIG. 10). For example, the control circuitry may control or enable/disable the photo detectors in a manner so that data acquisition or sensing correlates to the data rate of the transmission. In another embodiment, the photo detector array is coupled to a plurality of fiber optic output devices wherein each fiber optic device is associated with one or more photo detectors of the array and the control circuitry may control or enable/disable the subset of photo detectors in accordance with the associated output of the fiber optic device.

The photo detector array may be formed from a plurality of discrete devices and/or from a plurality of photo detectors integrated on a die wherein the photo detector array portion includes a plurality of photo detectors to acquire, capture, convert and/or sense the incident light from one or more associated fiber optic output(s). The photo detectors may be configured and/or arranged in any array architecture as well as in conjunction with any type of integrated circuitry, whether now known or later developed; all such configurations are intended to fall within the scope of the present inventions. Further, any manufacturing technique, whether now known or later developed, may be employed to fabricate the array (which includes a plurality of photo detectors) and/or photo detector array-integrated circuit device embodiments; all such techniques are intended to fall within the scope of the present inventions.

Notably, with reference to FIGS. 3 and 11, the photo detector(s) may be coupled to a current amplifier or photo detector (and other circuitry) to measure/condition the current output by the photo detector (for example, output via the contact region and p+ doped regions in response to the detection of light/data in the exemplary embodiments illustrated in FIGS. 5A, 17A, 17B, 20A, 20B, 22A and 22B). Notably, the current photo detector may be a high-speed sense amplifier or the like. All current sensing circuitry and architectures, now known or later developed, are intended to fall within the scope of the present inventions.

Further, the gates, contact region and p+ regions in the embodiments described and/or illustrated herein may be formed by or in a semiconductor (for example, silicon doped with acceptor impurities). Alternatively, one or more (or all) of such features (gates and regions) may be comprised of or formed (whether wholly or partially) from a metal (for example, aluminum or copper) or metal compound.

Notably, the photo detector, photo detector array and/or die/device (including the photo detector and/or photo detector array) may include an anti-reflective material disposed there over or thereon. In one embodiment, an anti-reflective material is disposed over or on the light absorbing region of the photo detector or photo detectors (of the array of photo detectors). In another embodiment, an anti-reflective material may be disposed on or over the entire structure, or a significant portion thereof.

Further, as noted above, the photo detectors may be implemented in a discrete photo detector or in an integrated circuit device having a photon receiver section (which may include one or more photo detectors (including an array of photo detectors)). Moreover, the photo detectors may be implemented in the standard planar technology (as illustrated herein) or any 3D technology (for example, planar or vertical type), or pillar gate architectures). The body region of the photo detector may or may not be electrically floating in view of the insulation or non-conductive region (for example, in bulk-type material/substrate). As illustrated herein, the photo detector may be formed on an SOI substrate or bulk silicon substrate.

Figure 24A:
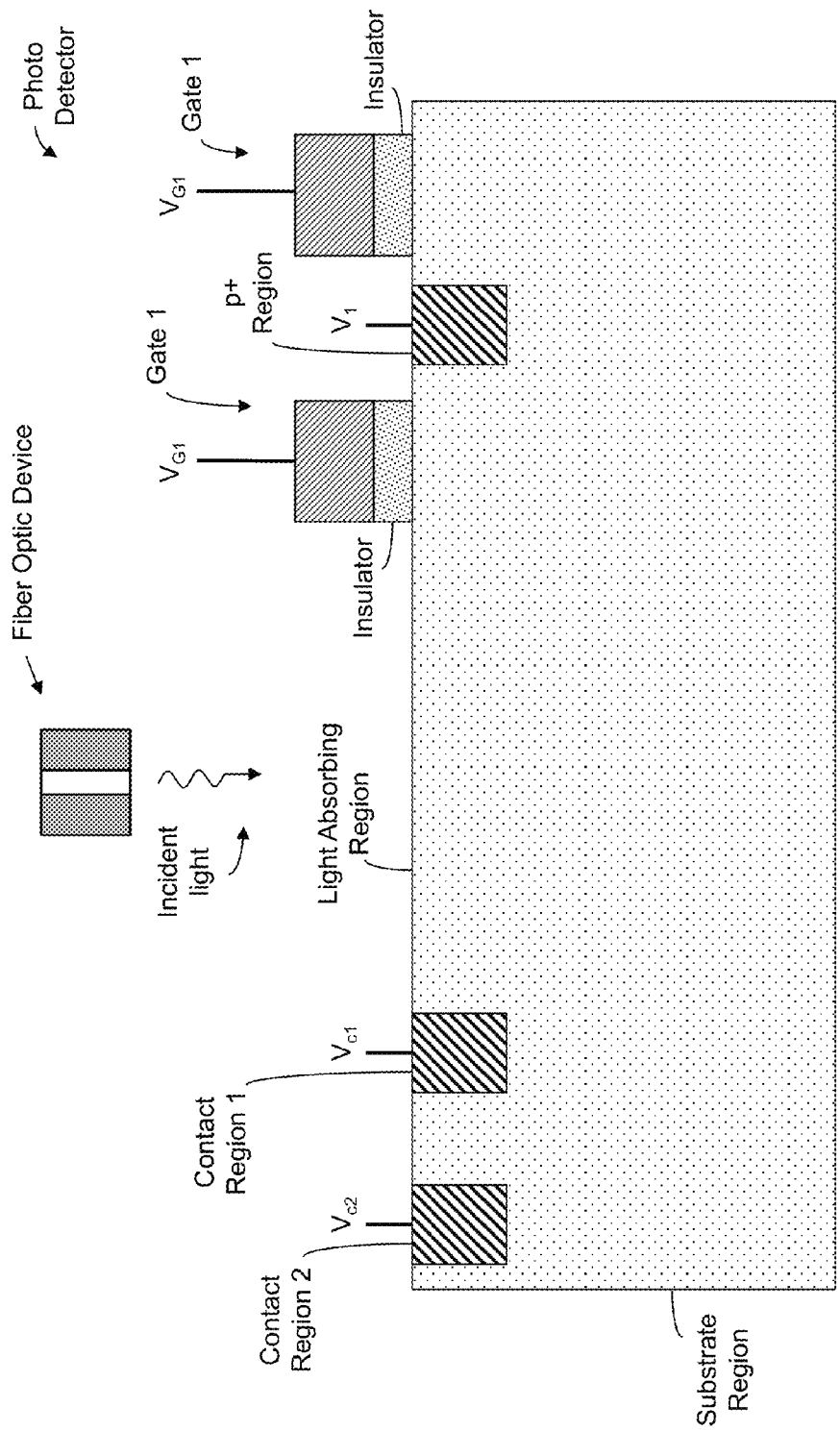
FIG. 24A is a cross-sectional view of an exemplary monolithic light sensor or photo detector that may be employed in conjunction with the present inventions wherein the sensor/detector includes a plurality of contact regions disposed on a top side (major surface) of the bulk substrate wafer/die (compare the single contact region of the embodiment of FIG. 5A).
Figure 24B:
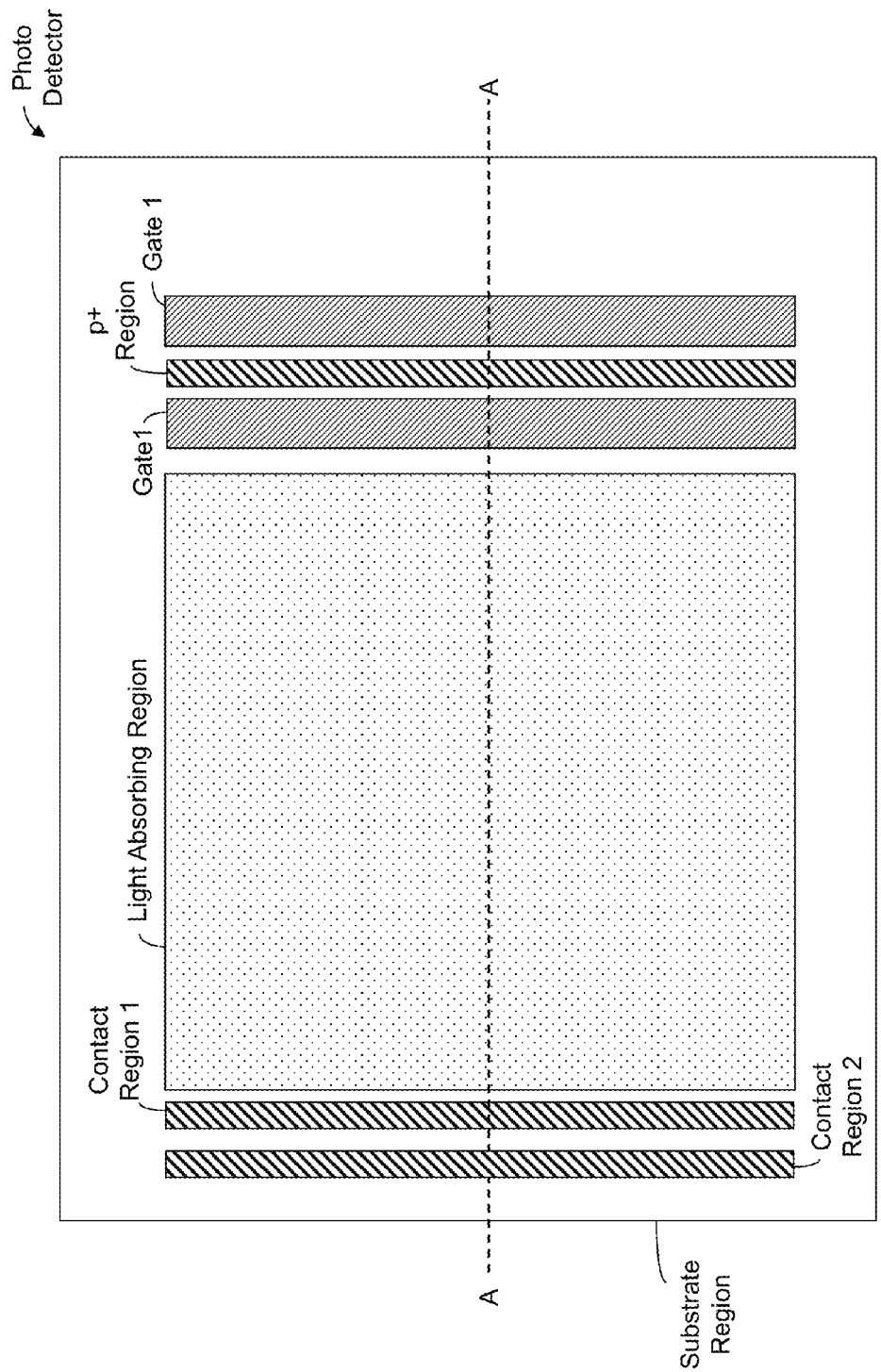
FIGS. 24B and 24C illustrate exemplary top views of the cross-sectional view of the photo detector of FIG. 24A wherein dotted lines A-A indicate the location of the cross-sectional view of FIG. 24A; although the contact region of this exemplary embodiment, like that of FIGS. 5A-5C, may employ a p+ region and/or n+ region.
Figure 24C:
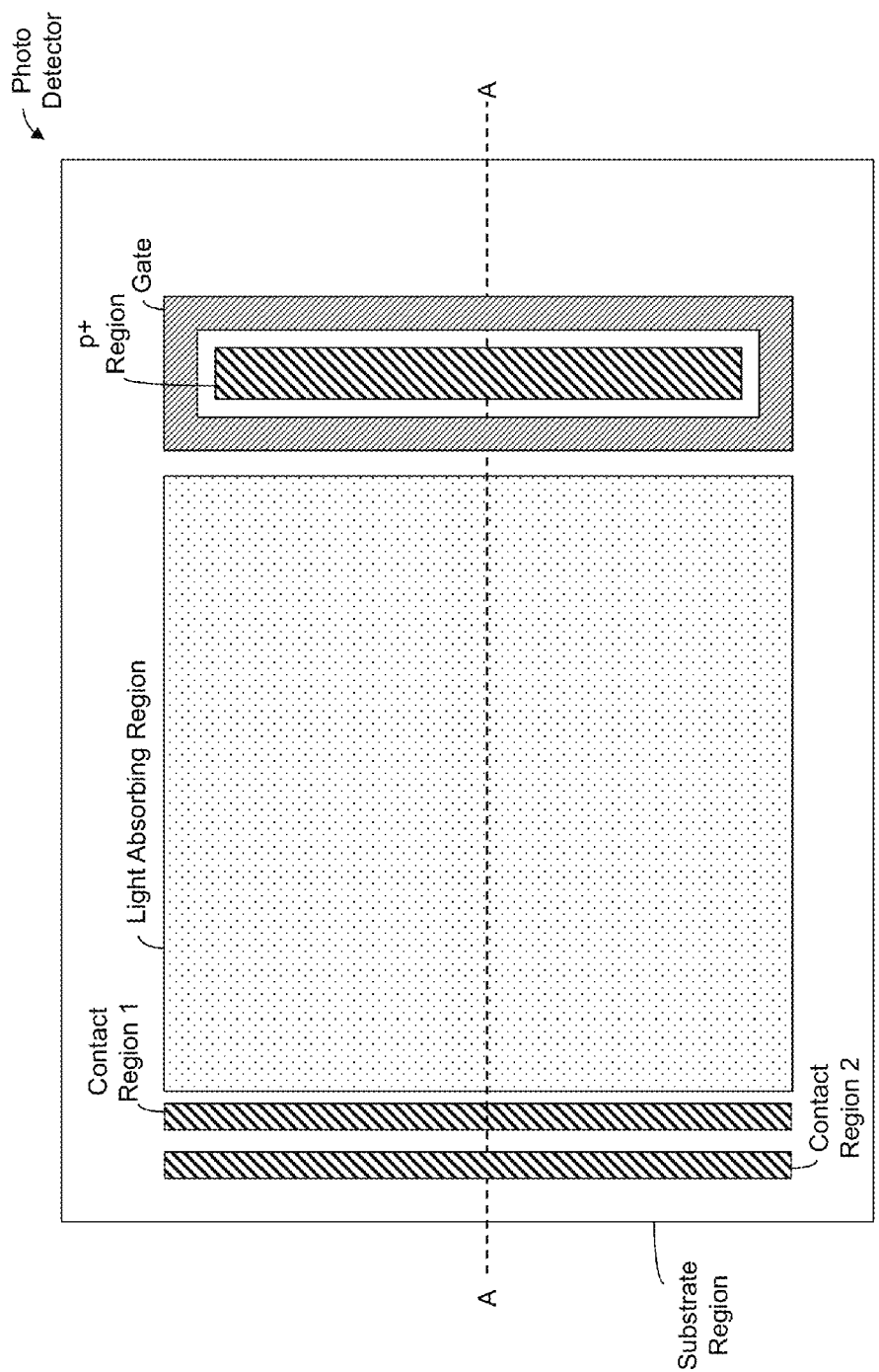

Moreover, although many of the photo detector embodiments employ a "Contact Region" (see, for example, FIGS. 5A-5C), photo detectors employed in the present inventions may include one or more additional contact regions (n+ or p+ type contact regions). For example, with reference to FIGS. 24A-24C, the exemplary photo detector includes an additional contact region (contact region 2) to improve the performance of the detector. In operation, a DC voltage may be applied to contact region 2 (for example, Vc2=0v, ground) in order to provide additional control of the potential barriers within the detector during operation or during the inactive period. Indeed, such other photo detector embodiments described and illustrated herein may include more one or more additional contact regions (n+ or p+ type contact regions). For the sake of brevity, such discussions will not be repeated, in detail, in relation with the other exemplary embodiments described and illustrated herein.

As noted above, the illustrated/exemplary voltage levels to implement or enable sensing by the photo detector are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages.

It should be noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" may mean, among other things, a current or voltage signal(s) whether in an analog or a digital form, which may be a single bit (or the like) or multiple bits (or the like).

Notably, reference herein to "one embodiment" or "an embodiment" herein means that a particular feature, structure, or characteristic described in connection with the embodiment can be included in one some or all of the embodiments of the present inventions. The usages or appearances of the phrase "in one embodiment" or "in another embodiment" in the specification are not referring to the same embodiment, nor are separate or alternative embodiments necessarily mutually exclusive of one or more other embodiments. The same applies to the term "implementation."

Further, an embodiment or implementation described herein as exemplary is not to be construed as preferred or advantageous, for example, over other embodiments or implementations; rather, it is intended reflect or indicate the embodiment or embodiments as an example embodiment(s).

The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The present inventions are also directed to such representation of the circuitry described herein, and/or techniques implemented thereby, and, as such, are intended to fall within the scope of the present inventions.

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations and simulation instruction-based expressions using computer aided design, simulation and/or testing tools. The simulation of the circuitry of the present inventions, including the photo detector and/or techniques implemented thereby, may be implemented by a computer system wherein characteristics and operations of such circuitry, and techniques implemented thereby, are simulated, imitated, replicated, analyzed and/or predicted via a computer system. The present inventions are also directed to such simulations and testing of the inventive device and/or circuitry, and/or techniques implemented thereby, and, as such, are intended to fall within the scope of the present inventions. The computer-readable media and data corresponding to such simulations and/or testing tools are also intended to fall within the scope of the present inventions.

Notably, if applicable, in the claims, the contact region of the photo detector may be disposed and/or formed in the substrate (see, for example, one of the p+ or n+ regions illustrated in the embodiment of FIGS. 12A, 15A, 16A and 16B) or disposed and/or formed on the substrate (see, for example, the p+ contact region of the embodiments of FIGS. 17A-17E or the n+ contact region of the embodiments of FIGS. 22A-22D).

In the claims, the term "determine" and "calculate" and other forms thereof (i.e., determining, determined and the like or calculating, calculated and the like) means, among other things, calculate, assesses, determine and/or estimate and other forms thereof.

In addition, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "data" may mean, among other things, a current or voltage signal(s) whether in analog or a digital form (which may be a single bit (or the like) or multiple bits (or the like)).

As used in the claims, the terms "comprises," "comprising," "includes," "including," "have," and "having" or any other variation thereof, are intended to cover a non-exclusive inclusion, such that a process, method, article, or apparatus that comprises a list of elements does not include only those elements but may include other elements not expressly listed or inherent to such process, method, article, or apparatus.

Further, the statement that one or more circuits, circuitry, nodes and/or components are "coupled" means that the circuits, circuitry, nodes and/or components are joined and/or operate (for example, physically or electrically) together either directly or indirectly, i.e., through one or more intermediate circuits, circuitry, nodes and/or components, so long as a link occurs; "directly coupled" means that two elements are directly joined, in contact and/or operate with each other.

The invention claimed is:

1. A proximity sensor system comprising:
a photo detector comprising a first doped region, a gate, a second doped region and a light absorbing region, wherein the light absorbing region includes at least one material in which, in response to light incident thereon, carrier pairs of opposite charge are generated, wherein the first doped region attracts a first carrier of the carrier pairs having a first charge, wherein the second doped region attracts a second carrier of the carrier pairs having a second opposite charge, and wherein the photo detector generates an output signal indicative of the presence of an object in a vicinity of the proximity sensor system;
control circuitry for generating a plurality of control signals to be applied to the photo detector, wherein the plurality of control signals comprises a first control signal applied to the first doped region of the photo detector, a second control signal applied to the gate of the photo detector, and a third control signal applied to the second doped region of the photo detector; wherein the applied control signals control an operating state of the photo detector; and
a signal detector to detect the output signal from the photo detector.

2. The proximity sensor system of claim 1, wherein the first doped region of the photo detector is formed of a p-type semiconductor and the second doped region is formed of an n-type semiconductor.

3. The proximity sensor system of claim 1, wherein the control circuitry places the photo detector in a non-detecting state by generating a first set of relative voltage amplitudes for the first, second, and third control signals so that the photo detector is in a reverse bias mode with substantially no current flow in the photo detector.

4. The proximity sensor system of claim 3, wherein the first voltage amplitude applied to the first doped region is less than the third voltage amplitude applied to the second doped region.

5. The proximity sensor system of claim 1, wherein the control circuitry places the photo detector in a detecting state by generating a second set of relative voltage amplitudes for the first, second, and third control signals so that the photo detector is in a forward bias mode with substantially no current flow in the photo detector in the absence of incident light on the photo detector.

6. The proximity sensor system of claim 5, wherein the first voltage amplitude applied to the first doped region differs from the third voltage amplitude applied to the second doped region by approximately 1 volt.

7. The proximity sensor system of claim 1, wherein the control circuitry places the photo detector in a detecting state by generating a second set of relative voltage amplitudes of the first, second, and third control signals so that the photo detector is in a forward bias mode with current flow in the photo detector in the presence of incident light on the photo detector.

8. The proximity sensor system of claim 7, wherein increasing an electric field between the first and second doped regions reduces a time for the current flow in the photo detector in response to the incident light.

9. The proximity sensor system of claim 7, wherein decreasing an electric field between the first and second doped regions increases a time for the current flow in the photo detector in response to the incident light.

10. The proximity sensor system of claim 1, wherein the control circuitry applies the control signals to alternate the photo detector between a non-detecting state and a detecting state.

11. The proximity sensor system of claim 10, wherein the control circuitry places the photo detector in the non-detecting state by generating a first set of relative voltage amplitudes of the first, second, and third control signals so that the photo detector is in a reverse bias mode with substantially no current flow.

12. The proximity sensor system of claim 11, wherein the control circuitry places the photo detector in the detecting state by generating a second set of relative voltage amplitudes of the first, second, and third control signals so that the photo detector is in a forward biased mode with substantially no current flow in absence of incident light and with current flow in presence of incident light.

13. The proximity sensor system of claim 1, further including a pulsing light source.

14. The proximity sensor system of claim 13, where in the pulsing of the light source is synchronized with the photo detector and emits light when the photo detector is in a detecting state.

15. A method of detecting a presence of a target using the proximity sensor system according to claim 14, wherein a time between the emission from the light source and the detection of current flow in the photo detector, due to incident reflected light from the target, is used to detect the presence of the target.

16. A method of detecting a distance of a target using the proximity sensor system according to claim 14, wherein a time between the emission from the light source and the detection of current flow in the photo detector, due to incident reflected light from the target, is used to ascertain the distance of the target.

* * * * *